(12) United States Patent
Yang et al.

(10) Patent No.: US 12,211,918 B2
(45) Date of Patent: Jan. 28, 2025

(54) NANOSTRUCTURED CHANNEL REGIONS FOR SEMICONDUCTOR DEVICES

(71) Applicant: Taiwan Semiconductor Manufacturing Co., Ltd., Hsinchu (TW)

(72) Inventors: Chansyun David Yang, Shinchu (TW); Keh-Jeng Chang, Shinchu (TW); Chan-Lon Yang, Taipei (TW); Perng-Fei Yuh, Walnut Creek, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/231,486

(22) Filed: Aug. 8, 2023

(65) Prior Publication Data

US 2023/0395685 A1    Dec. 7, 2023

Related U.S. Application Data

(62) Division of application No. 17/334,541, filed on May 28, 2021, now Pat. No. 11,869,954.

(51) Int. Cl.
| | |
|---|---|
| *H01L 29/00* | (2006.01) |
| *H01L 29/06* | (2006.01) |
| *H01L 29/10* | (2006.01) |
| *H01L 29/40* | (2006.01) |
| *H01L 29/423* | (2006.01) |
| *H01L 29/66* | (2006.01) |
| *H01L 29/786* | (2006.01) |

(52) U.S. Cl.
CPC .... *H01L 29/42392* (2013.01); *H01L 29/0665* (2013.01); *H01L 29/0673* (2013.01); *H01L 29/1037* (2013.01); *H01L 29/401* (2013.01); *H01L 29/6653* (2013.01); *H01L 29/66545* (2013.01); *H01L 29/78696* (2013.01)

(58) Field of Classification Search
CPC ............ H01L 29/0669; H01L 29/0673; H01L 29/0676; H01L 29/42392; H01L 29/78696
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |

(Continued)

*Primary Examiner* — Reema Patel
(74) *Attorney, Agent, or Firm* — Sterne, Kessler, Goldstein & Fox P.L.L.C.

(57) ABSTRACT

A semiconductor device with different configurations of nanostructured channel regions and a method of fabricating the semiconductor device are disclosed. The semiconductor device includes a fin structure disposed on a substrate, a stack of nanostructured horizontal channel (NHC) regions disposed on the fin structure, a nanostructured vertical channel (NVC) region disposed within the stack of NHC regions, a source/drain (S/D) region disposed on the fin structure, and a gate structure disposed on the NHC regions and on portions of the NVC region that are not covered by the NHC regions and the fin structure.

20 Claims, 68 Drawing Sheets

(56) References Cited

U.S. PATENT DOCUMENTS

| | | |
|---|---|---|
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2019/0035888 A1* | 1/2019 | Wu .................... H01L 29/1033 |
| 2019/0355723 A1 | 11/2019 | Miao et al. |
| 2020/0044087 A1* | 2/2020 | Guha ................ H01L 29/66439 |
| 2022/0384599 A1 | 12/2022 | Yang et al. |

* cited by examiner

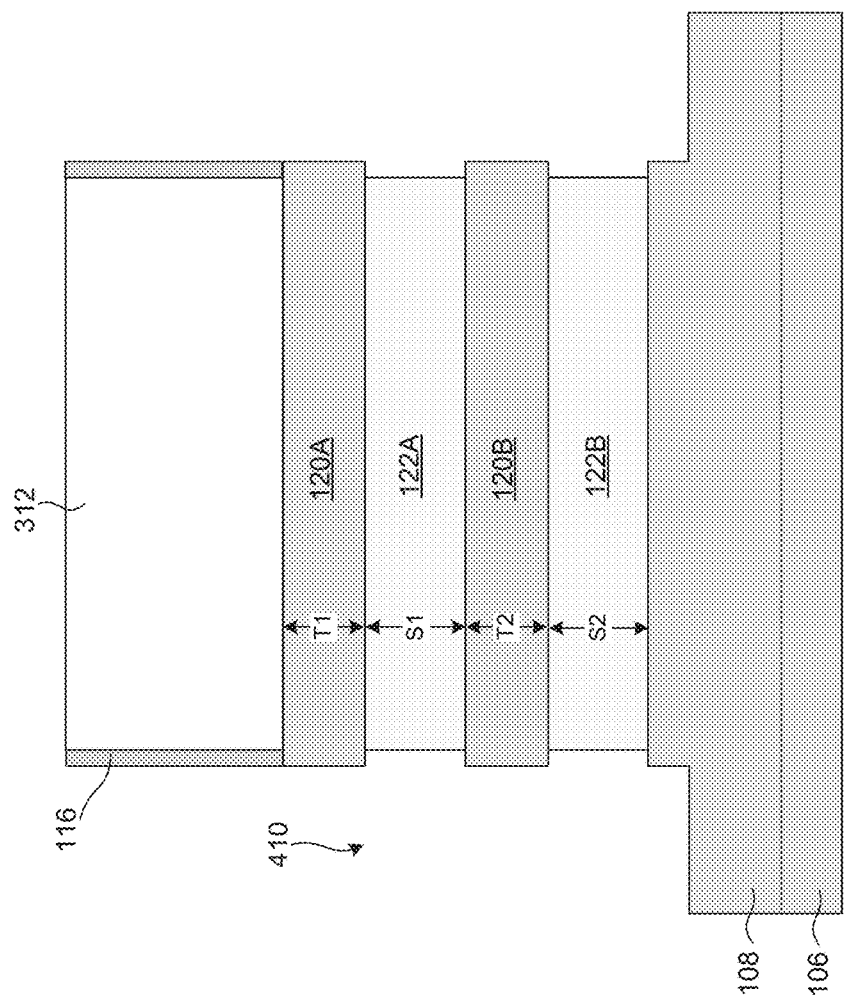

NANOSTRUCTURED CHANNEL REGIONS FOR SEMICONDUCTOR DEVICES

CROSS-REFERENCE TO RELATED APPLICATION

This application is a divisional of U.S. patent application Ser. No. 17/334,541, titled "Nanostructured Channel Regions for Semiconductor Devices," filed May 28, 2021, which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
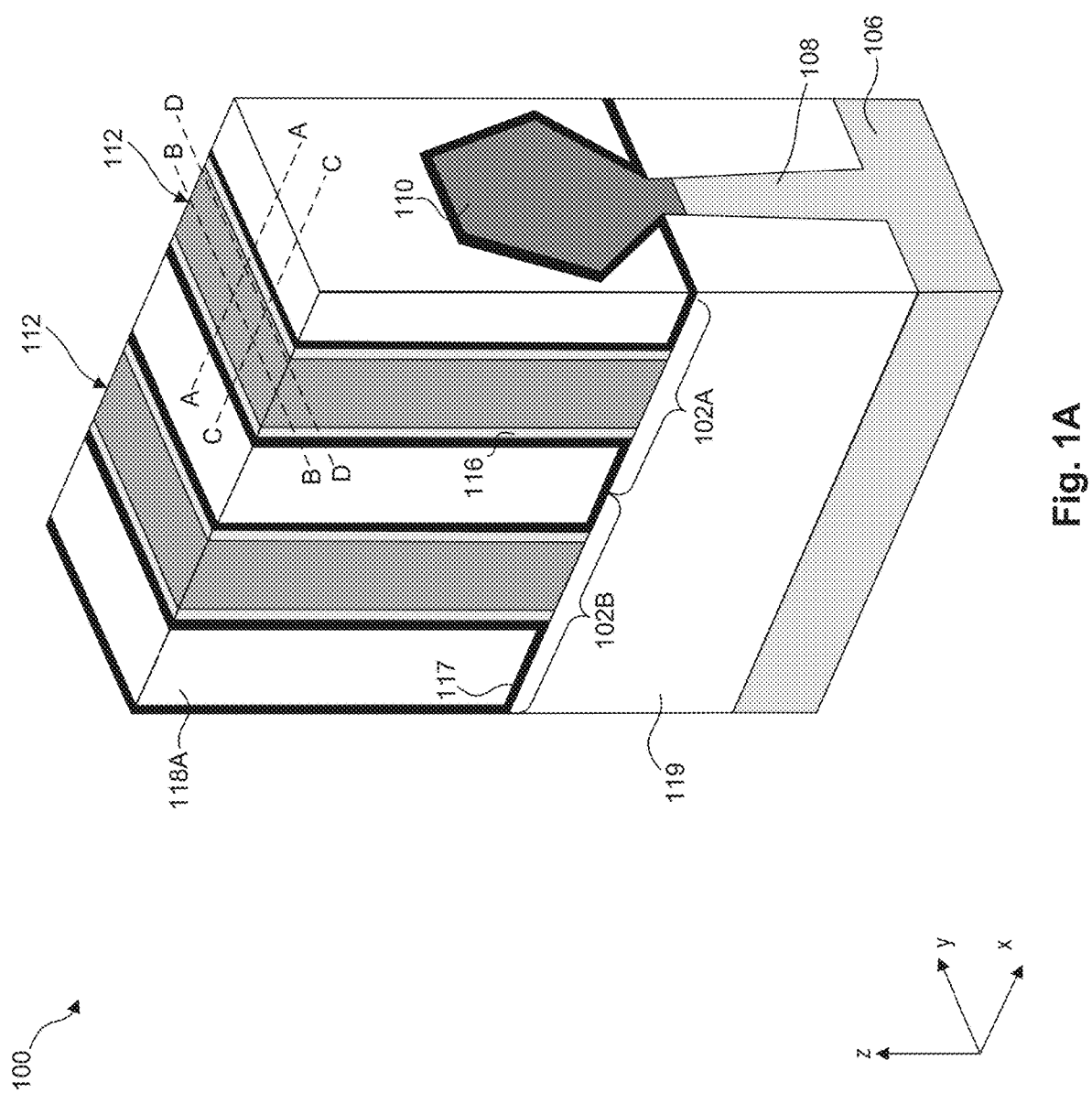
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides an example semiconductor device with FETs (e.g., gate-all-around (GAA) FETs)

including nanostructured horizontal and vertical channel regions and example methods of forming the same. In some embodiments, a GAA FET can include a nanostructured vertical channel (NVC) region disposed within a stack of nanostructured horizontal channel (NHC) regions, which is disposed on a fin structure. The GAA FET can further include a GAA structure surrounding the NHC regions about a first axis and the NVC region about a second axis that is different from the first axis. The NVC region provides electrical connection between the NHC regions. As a result, electrical potential induced in the NHC regions by gate portions of the GAA structure surrounding the NHC regions can be substantially equally distributed between the NHC regions to form substantially equipotential NHC regions. Forming equipotential NHC regions can mitigate differences between channel parameters of NHC regions, such as channel current and drain induced barrier lowering (DIBL) parameters, and consequently increase current density of the GAA FET.

Without the NVC region, there may be variations between the electrical potential induced in the NHC regions due to variations in the dimensions of the NHC regions with respect to each other and/or in the dimensions of the gate portions of GAA structure with respect to each other. The dimension variations can be a result of processing conditions used during the fabrication of the GAA FET. The dimension variations can also exist between the NHC regions and GAA structures of different GAA FETs of the semiconductor device, which can lead to variations between FET parameters, such as threshold voltage, DIBL parameters, sub-threshold swing (SS), and on current ($I_{ON}$). Such inter-FET variations can also be mitigated with the use of NVC regions in the different FETs of the semiconductor device. Thus, the NVC regions mitigates the effect of dimension variations on device parameters, and consequently reduces intra-device parameter variability and inter-device parameter variability in the semiconductor device.

A semiconductor device 100 with FETs 102A-102B is described with reference to FIGS. 1A-1L, according to various embodiments. Though two FETs are discussed with reference to FIGS. 1A-1L, semiconductor device 100 can have any number of FETs. FETs 102A-102B can be n-type, p-type, or a combination thereof. FIG. 1A illustrates an isometric view of semiconductor device 100, according to some embodiments. Semiconductor device 100 can have different cross-sectional views along lines A-A, B-B, C-C, and D-D of FIG. 1A, according to various embodiments.

Figure 1B:
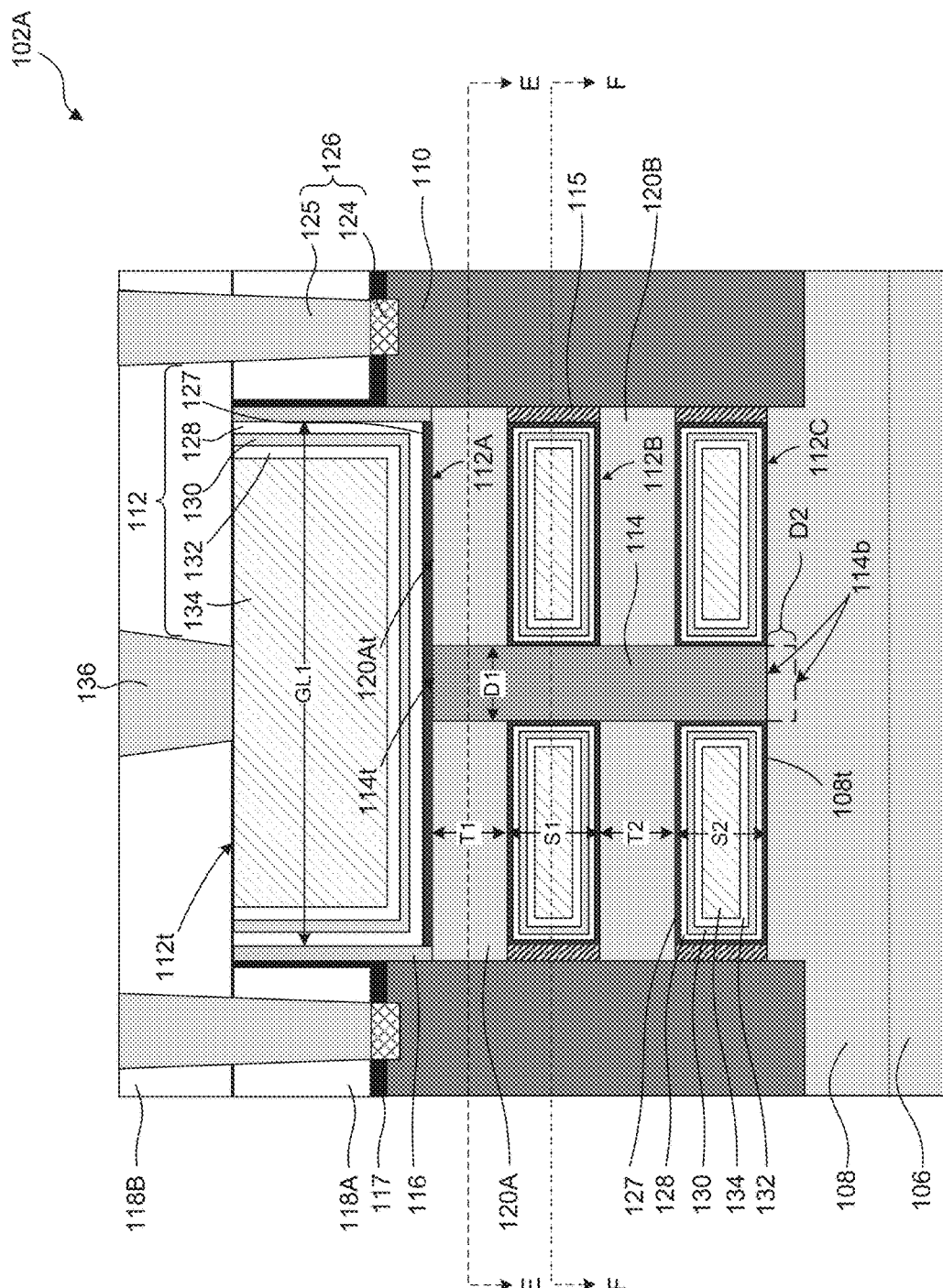
FIGS. 1B-1C illustrate cross-sectional views of a semiconductor device with nanostructured vertical and horizontal channel regions, in accordance with some embodiments.
Figure 1C:
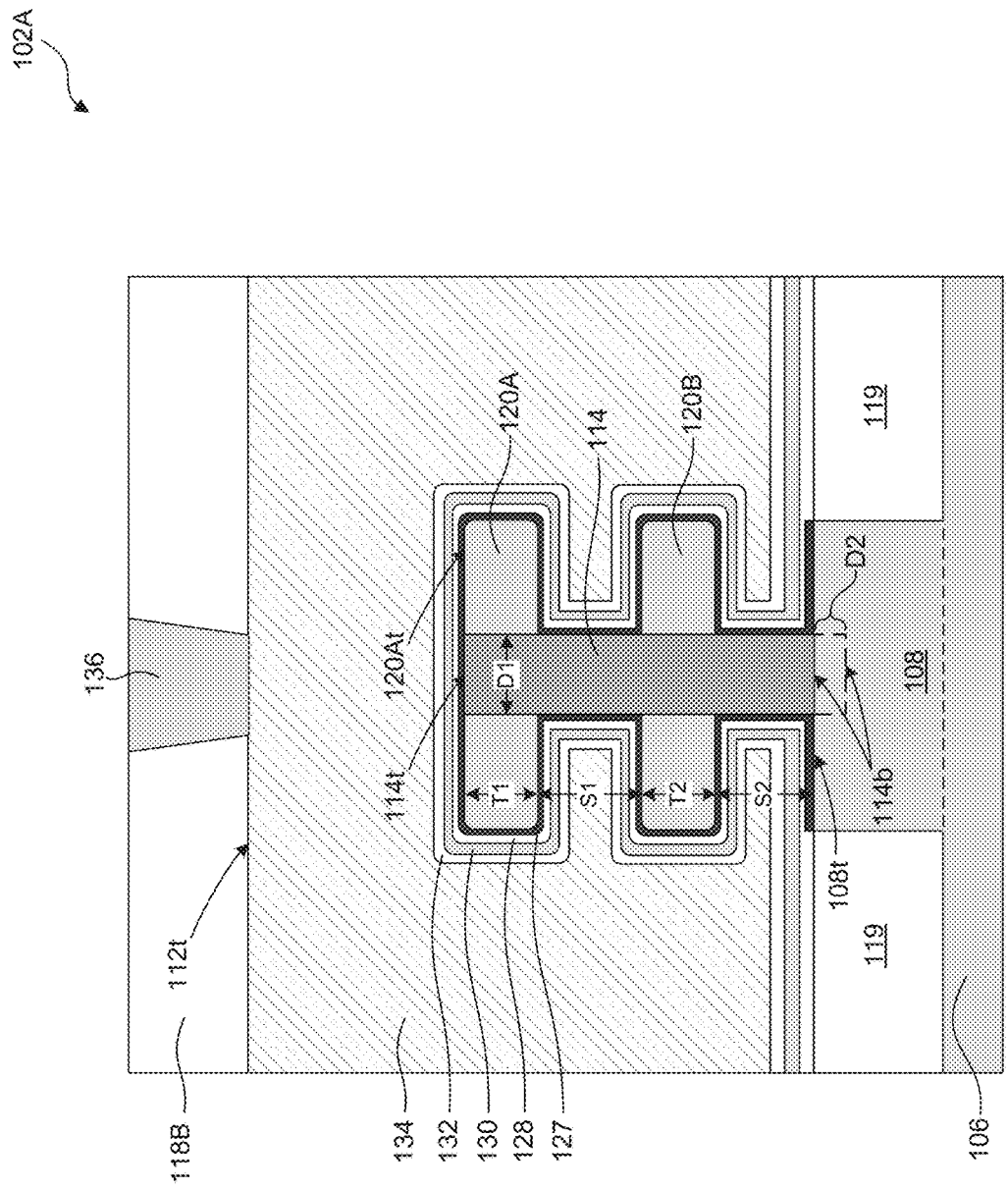
Figure 1D:
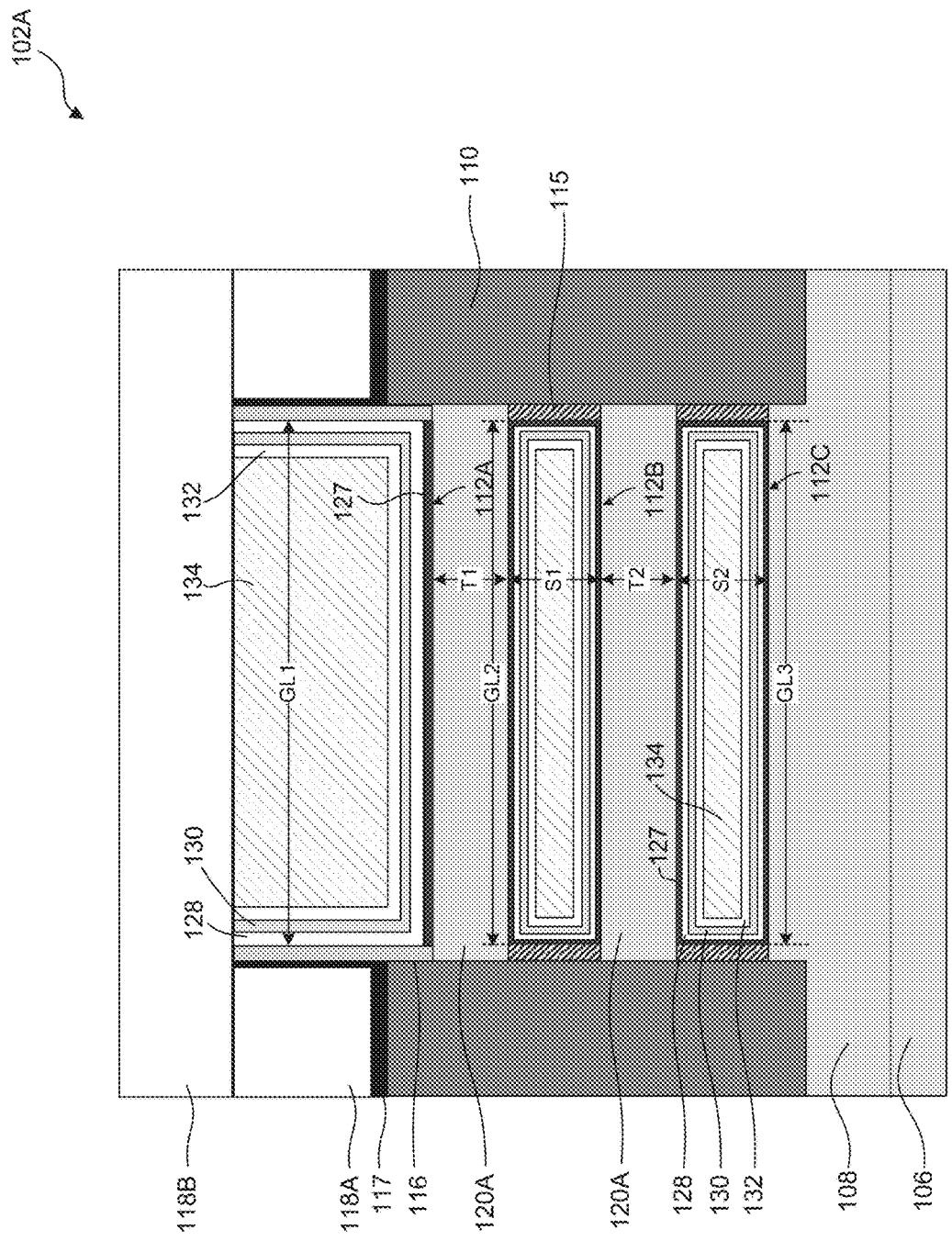
FIG. 1D illustrates an isometric view of nanostructured vertical and horizontal channel regions of a semiconductor device, in accordance with some embodiments
Figure 1E:
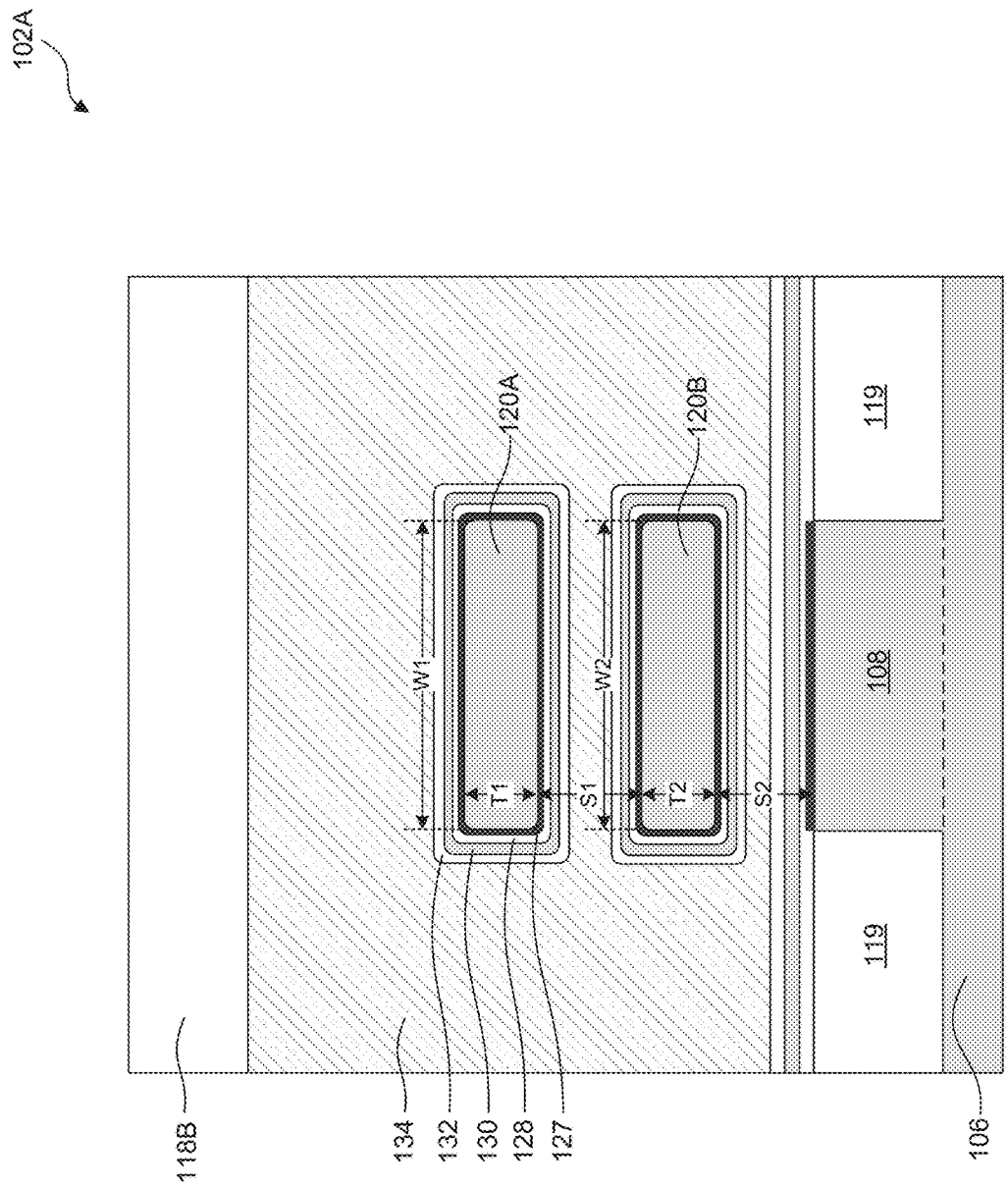
FIGS. 1E-1L illustrate cross-sectional views of a semiconductor device with nanostructured vertical and horizontal channel regions, in accordance with some embodiments.
Figure 1F:
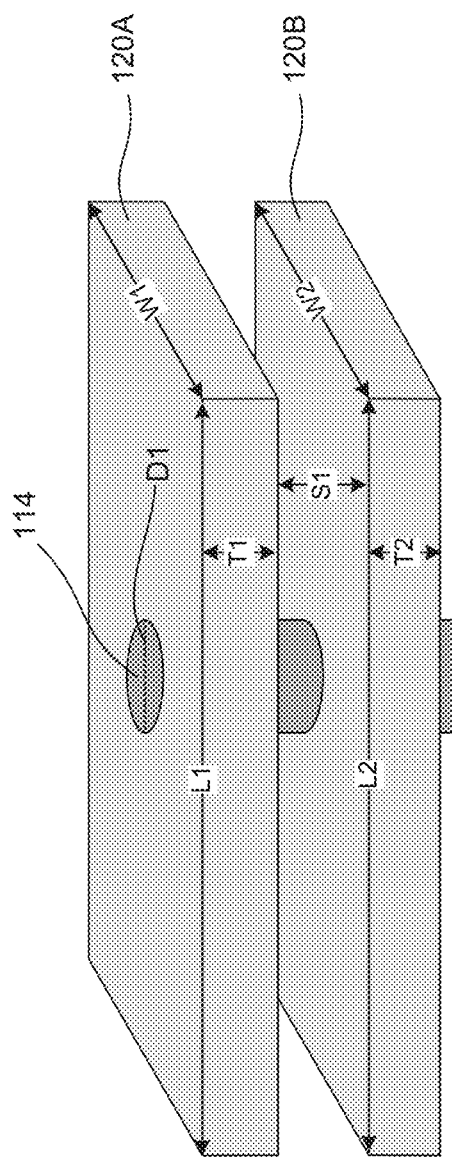
Figure 1G:
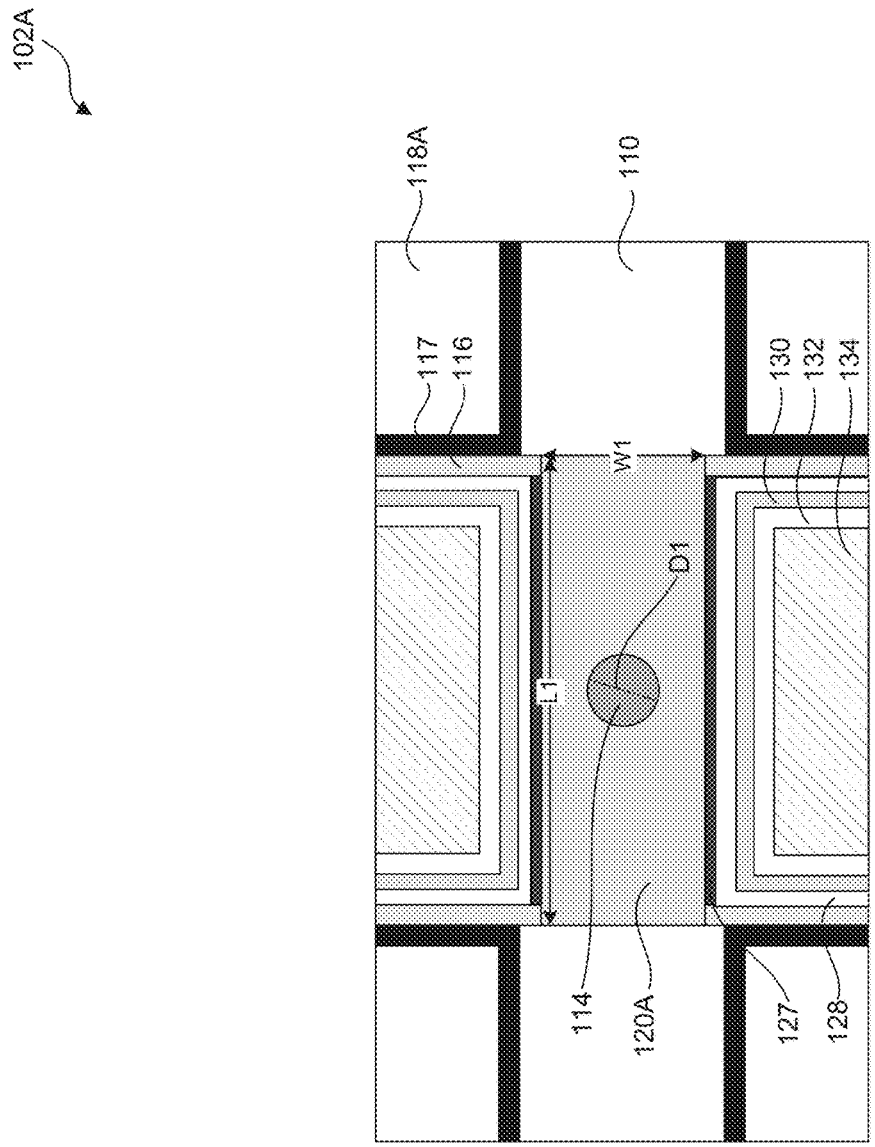
Figure 1H:
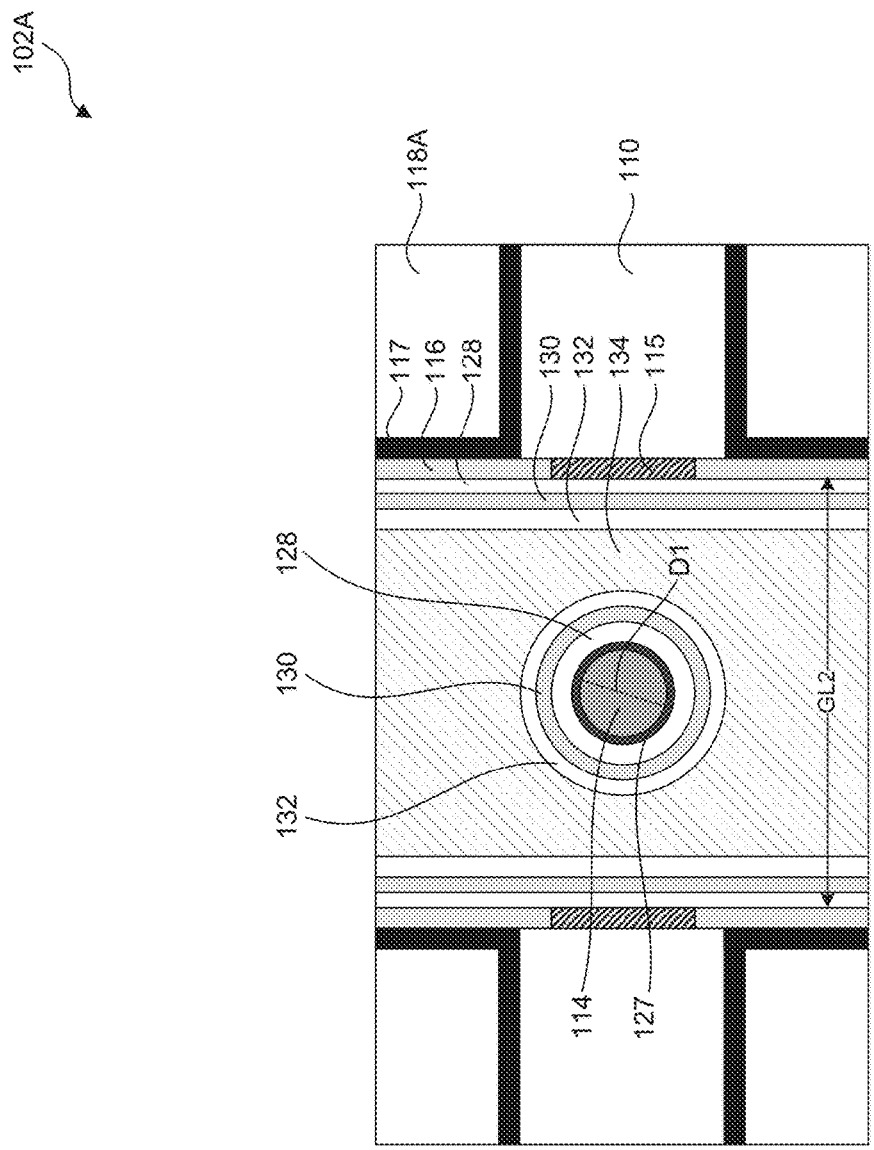
Figure 1I:
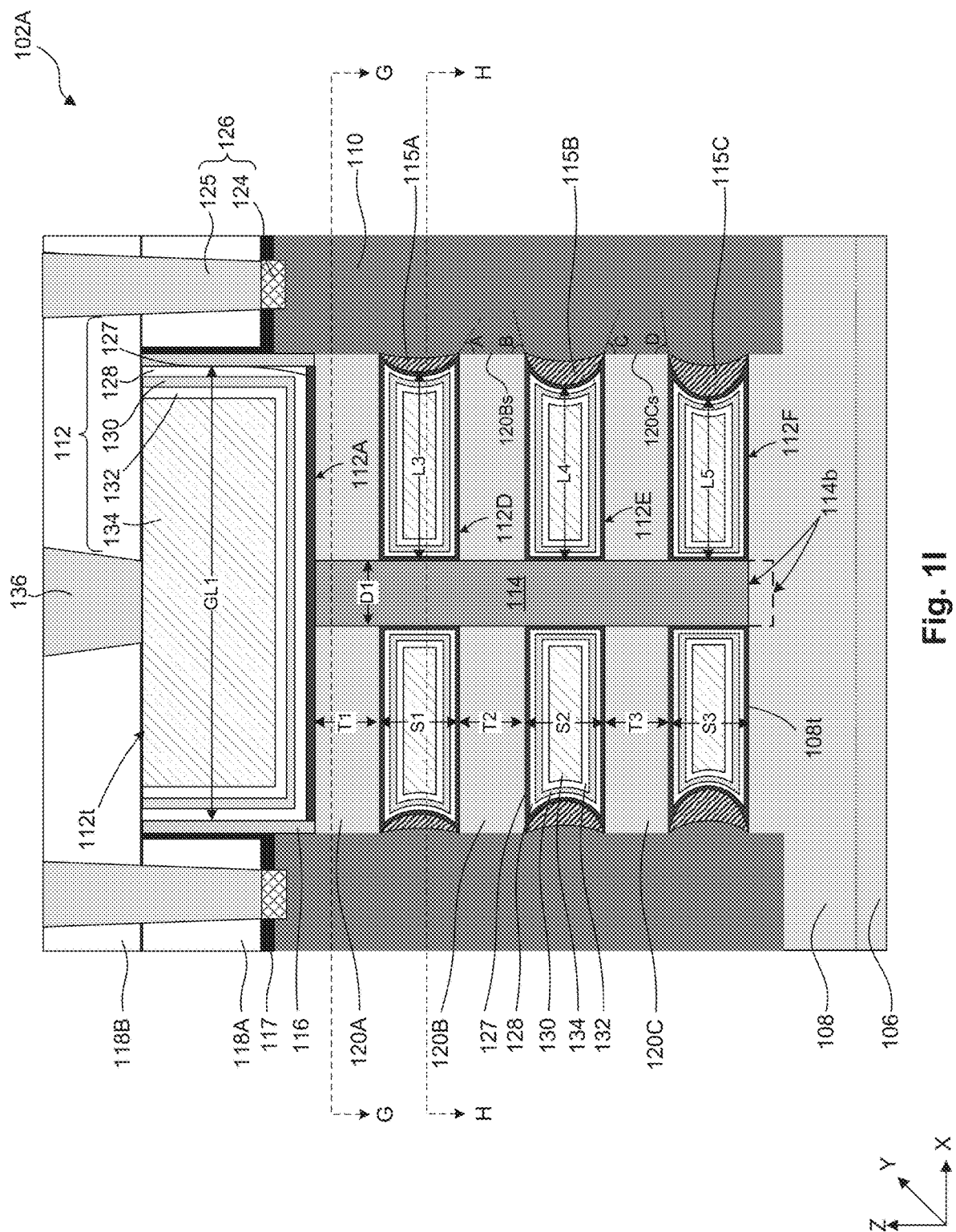
Figure 1J:
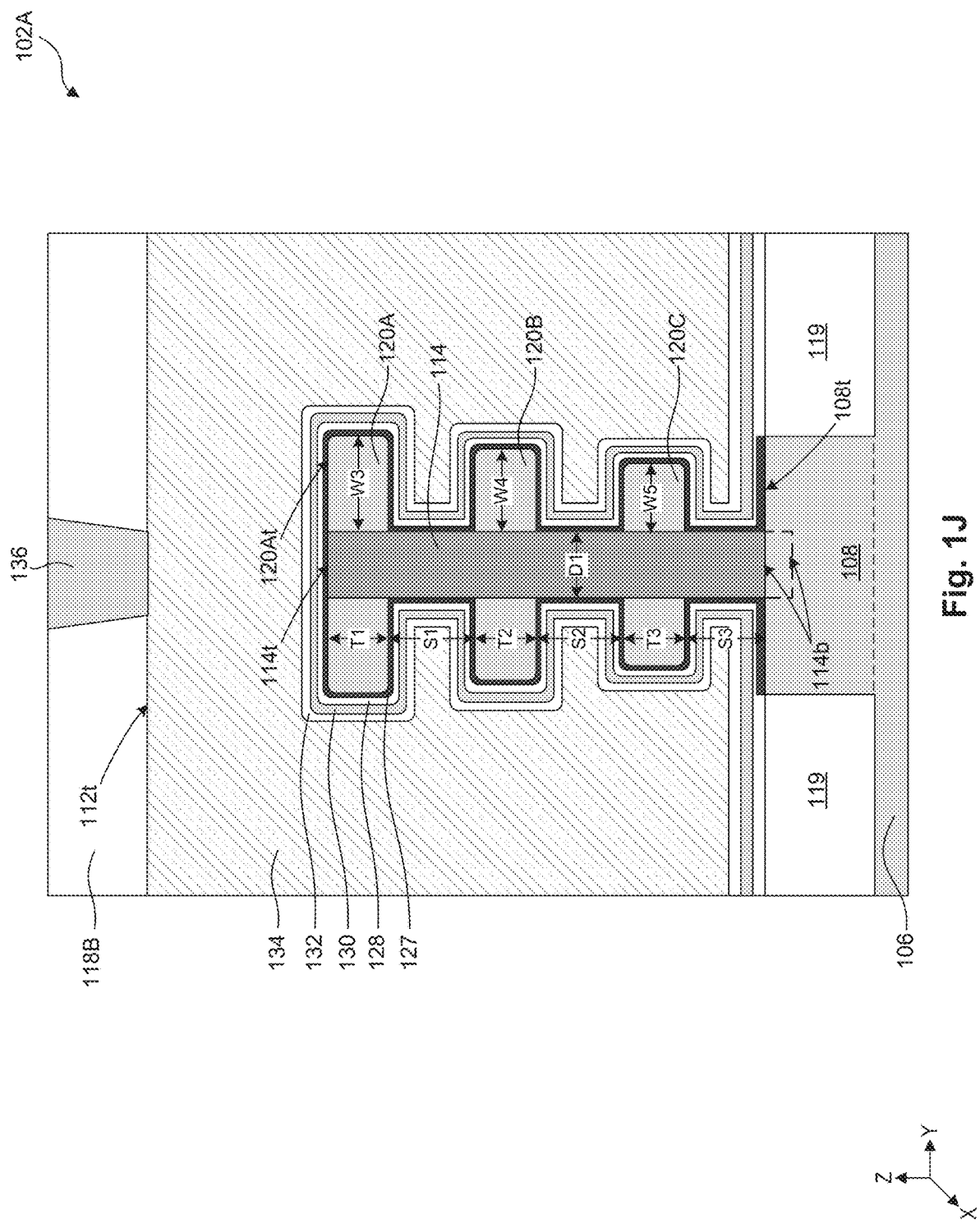
Figure 1K:
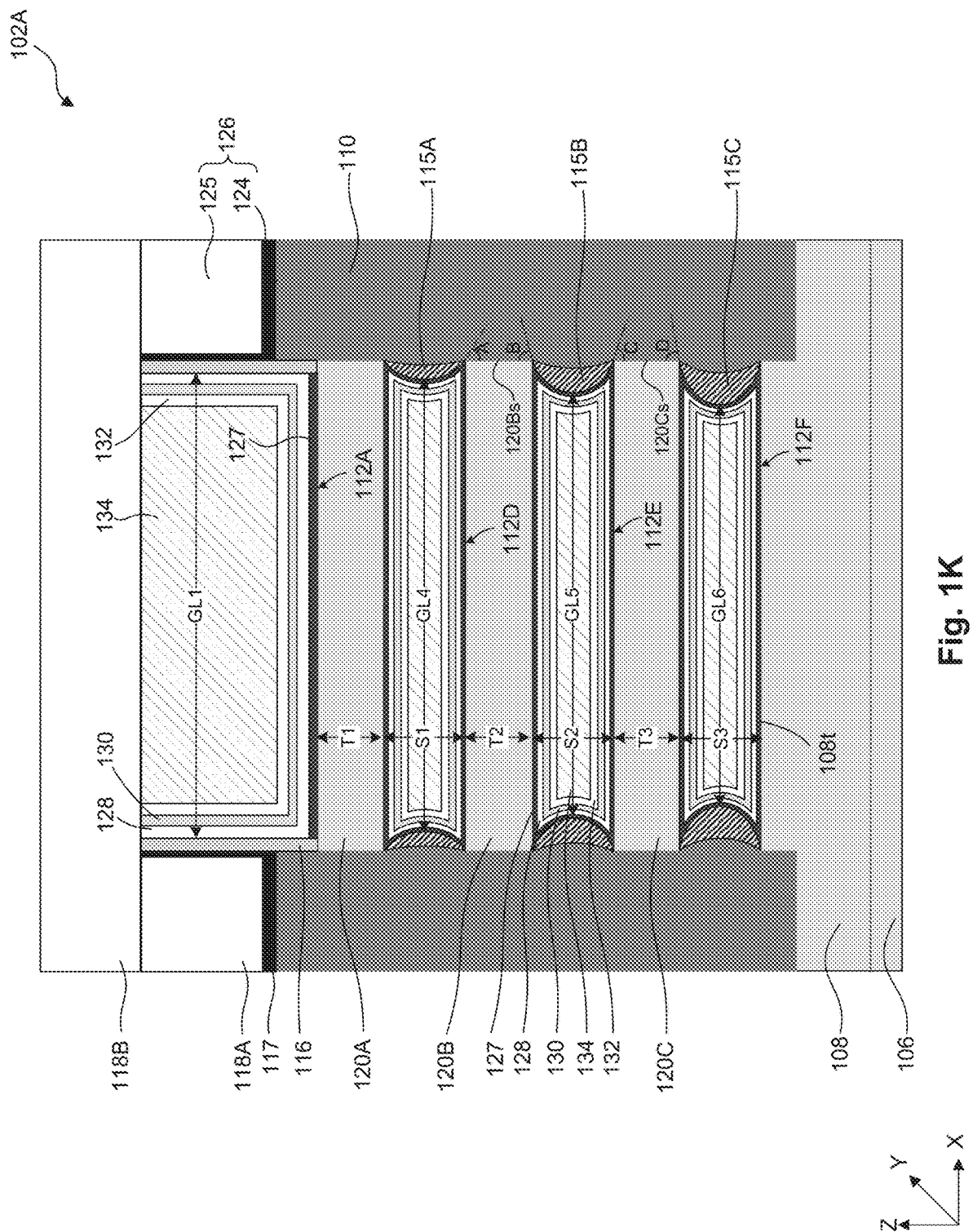
Figure 1L:
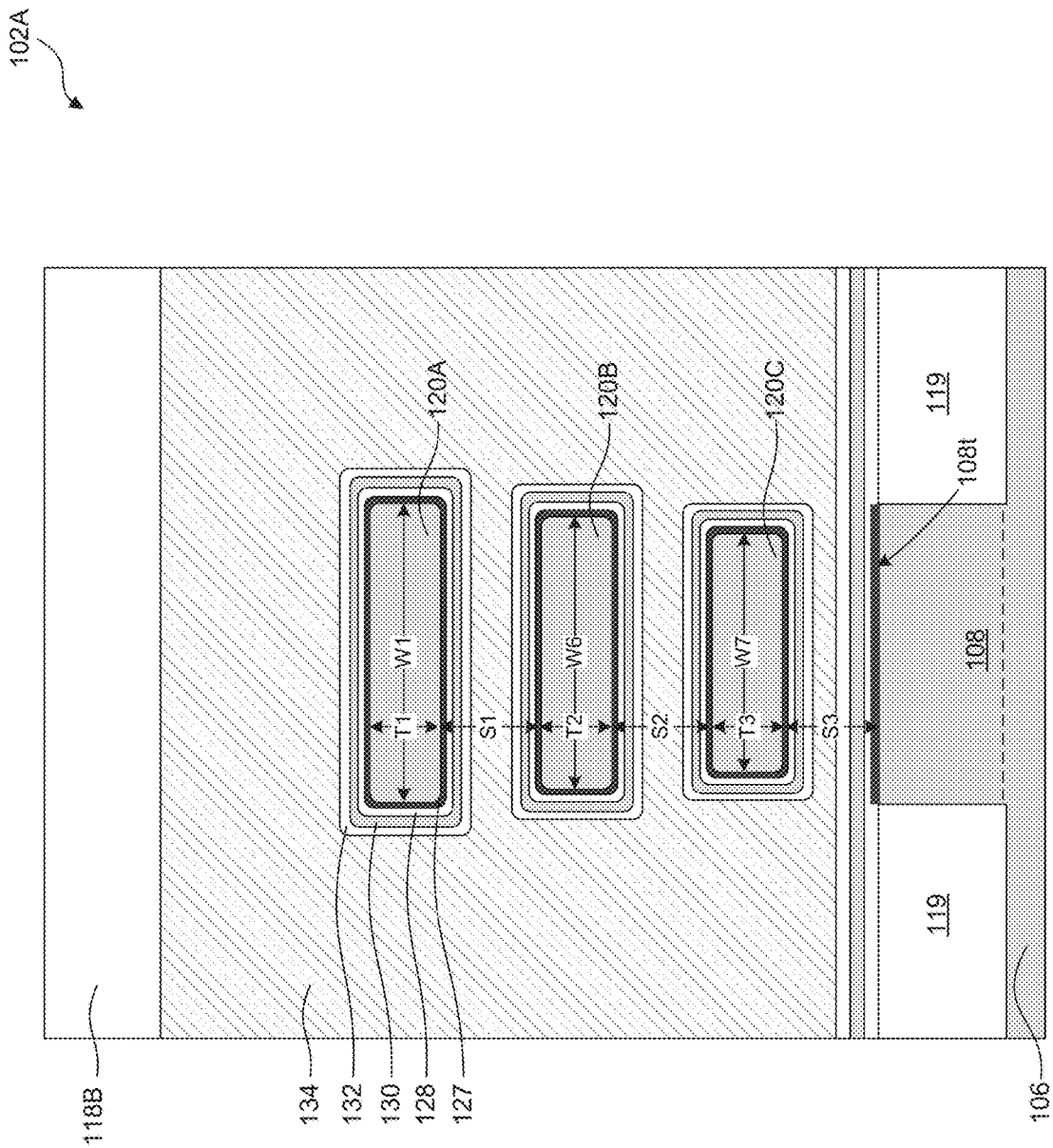

According to various embodiments, (i) FIGS. 1B and 1I illustrate different cross-sectional views of FET 102A along line A-A of FIG. 1A, (ii) FIGS. 1C and 1J illustrate different cross-sectional views of FET 102A along line B-B of FIG. 1A, (iii) FIGS. 1D and 1K illustrate different cross-sectional views of FET 102A along line C-C of FIG. 1A, and (iv) FIGS. 1E and 1L illustrate different cross-sectional views of FET 102A along line D-D of FIG. 1A. FIGS. 1B-1E and 1I-1L illustrate cross-sectional views of FET 102A with additional elements that are not shown in FIG. 1A for simplicity.

FIG. 1F illustrates an isometric view of nanostructured channel regions of FET 102A, according to some embodiments. Other elements of FET 102A are not shown in FIG. 1D for simplicity. FIG. 1E illustrates a cross-sectional view along line E-E and an X-Y-plane of FIG. 1B and FIG. 1F illustrates a cross-sectional view along line F-F and an X-Y-plane of FIG. 1B, according to some embodiments. The discussion of FET 102A applies to FET 102B, unless mentioned otherwise. The discussion of elements in FIGS. 1A-1L with the same annotations applies to each other, unless mentioned otherwise.

Semiconductor device 100 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic).

Semiconductor device 100 can further include etch stop layer (ESL) 117, interlayer dielectric (ILD) layers 118A-118B, and shallow trench isolation (STI) regions 119. ESL 117 can be configured to protect gate structures 112 and/or epitaxial source/drain (S/D) regions 110. In some embodiments, ESL 116 can include an insulating material, such as silicon oxide ($SiO_2$), silicon nitride (SiN), silicon carbon nitride (SiCN), silicon oxycarbon nitride (SiOCN), silicon germanium oxide, and any other suitable insulating material. ILD layers 118A-118B can be disposed on ESL 116 and can include a dielectric material.

Referring to FIGS. 1A-1H, in some embodiments, FET 102A can include (i) a fin structure 108, (ii) a stack of nanostructured horizontal channel (NHC) regions 120A-120B (also referred to as "nanostructured layers 120A-120B") disposed on fin structure 108, (iii) epitaxial S/D regions 110 disposed on portions of fin structure 108 that are adjacent to NHC regions 120A-120B, (iv) S/D contact structures 126 disposed on epitaxial S/D regions 110, (v) a gate-all-around (GAA) structure 112 disposed on and wrapped around NHC regions 120A-120B, (vii) a GAA contact structure 136 disposed on GAA structure 112, and (viii) a nanostructured vertical channel (NVC) region 114 disposed on a portion of fin structure 108 underlying NHC regions 120A-120B. The term "nanostructured" defines a structure, layer, and/or region as having a horizontal dimension (e.g., along an X- and/or Y-axis) and/or a vertical dimension (e.g., along a Z-axis) less than, for example, 100 nm.

Fin structure 108 can be formed from substrate 106 and can extend along an X-axis. NHC regions 120A-120B surrounds NVC region 114, as shown in FIGS. 1B-1C and 1F-1G, and can include semiconductor materials similar to or different from substrate 106. In some embodiments, NHC regions 120A-120B can include Si, silicon arsenic (SiAs), silicon phosphide (SiP), silicon carbide (SiC), silicon carbon phosphide (SiCP), silicon germanium (SiGe), silicon germanium boron (SiGeB), germanium boron (GeB), silicon germanium stannum boron (SiGeSnB), a III-V semiconductor compound, or other suitable semiconductor materials. Though rectangular cross-sections of NHC regions 120A-120B are shown, NHC regions 120A-120B can have cross-sections of other geometric shapes (e.g., circular, elliptical, triangular, or polygonal).

NHC regions 120A-120B can be spaced apart from each other by a distance S1 and NHC region 120B can be spaced apart from fin structure 108 by a distance S2. In some embodiments, distances S1-S2 along a Z-axis can range from about 1 nm to about 8 nm or other suitable dimensions and can be equal to or different from each other. In some embodiments, NHC regions 120A-120B can have thicknesses T1-T2 or a diameters T1-T2 along a Z-axis ranging from about 1 nm to about 8 nm or other suitable dimensions and thicknesses T1-T2 can be equal to or different from each other. In some embodiments, NHC regions 120A-120B can have lengths L1-L2 along an X-axis ranging from about 20 nm to about 80 nm or other suitable dimensions and lengths L1-L2 can be equal to or different from each other. In some embodiments, NHC regions 120A-120B can have widths W1-W2 along a Y-axis ranging from about 20 nm to about 100 nm or other suitable dimensions and widths W1-W2 can be equal to or different from each other. In some embodiments, a ratio of L1:W1 can range from about 1:1 to about 2:1.

Epitaxial S/D regions 110 can be grown on fin structure 108 and can include epitaxially-grown semiconductor materials. In some embodiments, the epitaxially-grown semiconductor material can include the same material or a different material from the material of substrate 106. Epitaxial S/D regions 110 can be n- or p-type. The term "p-type" defines a structure, layer, and/or region as being doped with p-type dopants, such as boron. The term "n-type" defines a structure, layer, and/or region as being doped with n-type dopants, such as phosphorus. In some embodiments, S/D regions 110 can include SiAs, SiC, SiCP, SiGe, SiGeB, GeB, SiGeSnB, a III-V semiconductor compound, any other suitable semiconductor material, or a combination thereof.

In some embodiments, each of S/D contact structures 126 on epitaxial S/D regions 110 can include (i) a silicide layer 124 and (ii) a contact plug 125 disposed on silicide layer 124. In some embodiments, silicide layer 124 can include nickel silicide (NiSi), tungsten silicide (WSi$_2$), titanium silicide (TiSi$_2$), cobalt silicide (CoSi$_2$), or other suitable metal silicides. In some embodiments, contact plug 125 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), any other suitable conductive material, and a combination thereof.

GAA structure 112 can be a multi-layered structure and can surround NHC regions 120A-120B, as shown in FIGS. 1B-1E. GAA structure 112 also surrounds NVC region 114, as shown in FIGS. 1B-1C and 1H. GAA structure 112 can be referred to as "horizontal gate-all-around (HGAA) structure" and FET 102A can be referred to as "GAA FET 102A." Gate portions 120B-120C of GAA structure 112 can be electrically isolated from adjacent S/D regions 110 by inner spacers 115. Gate portion 120A disposed on the stack of NHC regions 120A-120B can be electrically isolated from adjacent S/D regions 110 by gate spacers 116. Inner spacers 115 and gate spacers 116 can include an insulating material, such as SiO$_2$, SiN, SiCN, SiOCN, and any other suitable insulating material.

GAA structure 112 can include (i) an interfacial oxide (IO) layer 127, (ii) a high-k (HK) gate dielectric layer 128, (iii) a negative capacitance (NC) gate dielectric layer 130, (iv) a work function metal (WFM) layer 132, and (v) a gate metal fill layer 134. Though FIGS. 1B-1E show that all the layers of GAA structure 112 are wrapped around NHC regions 120A-120B, NHC regions 120A-120B can be wrapped around by at least IO layer 127 and HK dielectric layer 128 to fill the spaces between adjacent NHC regions 120A-120B. Accordingly, NHC regions 120A-120B can be electrically isolated from each other to prevent shorting between GAA structure 112 and S/D regions 110 during operation of FET 102A. In some embodiments, gate portion 120A can have a gate length GL1 ranging from about 20 nm to about 80 nm, or other suitable dimensions. In some embodiments, gate portions 120B-120C can have gate lengths GL2-GL3 (shown in FIG. 1D), which can be different from equal to or different from each other or GL1. The difference between GL1-GL3 can be a result of processing conditions used during the fabrication of inner gate spacers 115 and/or GAA structure 112, as described in further details below.

IO layers 127 can be disposed on NHC regions 120A-120B and NVC region 114. In some embodiments, IO layers 127 can include SiO$_2$, silicon germanium oxide (SiGeO$_x$), germanium oxide (GeO$_x$), or other suitable oxide materials. HK gate dielectric layers 128 can be disposed on IO layers 127 and can include (i) a high-k dielectric material, such as hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), and zirconium silicate (ZrSiO$_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) other suitable high-k dielectric materials, or (iv) a combination thereof. The term "high-k" refers to a high dielectric constant. In the field of semiconductor device structures and manufacturing processes, high-k refers to a dielectric constant that is greater than the dielectric constant of SiO$_2$ (e.g., greater than 3.9).

NC gate dielectric layer 130 can include dielectric materials that exhibit negative capacitance property. Negative capacitance can be defined as a decrease in voltage across a capacitor with an increase in charge on the capacitor. In some embodiments, NC gate dielectric layer 130 can include (i) a dielectric material with ferroelectric properties, such as hafnium oxide (HfO$_2$), hafnium aluminum oxide (HfAlO), hafnium silicate (HfSiO), and hafnium zirconium oxide (HfZrO), (ii) a dielectric material in orthorhombic phase (e.g., hafnium oxide (HfO$_2$) in orthorhombic phase), (iii) a dielectric material (e.g., HfO$_2$) doped with one or more metals, such as aluminum (Al), calcium (Ca), cerium (Ce), dysprosium (Dy), erbium (Er), gadolinium (Gd), germanium (Ge), lanthanum (La), scandium (Sc), silicon (Si), strontium (Sr), stannum (Sn), yttrium (Y), and zirconium (Zr), or (iv) a combination thereof. Other suitable NC dielectric materials for NC gate dielectric layer 130 are within the scope of the present disclosure. In some embodiments, NC gate dielectric layer 130 can have a thickness ranging from about 2 nm to about 3 nm or other suitable dimensions. Though some dielectric materials of NC gate dielectric layer 130 includes similar atomic elements as dielectric materials of HK gate dielectric layer 128, NC gate dielectric layer 130 can have different properties than HK gate dielectric layer 128. For example, the NC dielectric material of NC gate dielectric layer 130 can have a resistivity lower than the dielectric material HK gate dielectric layer 128. In some embodiments, HK gate dielectric layer 128 can be absent from GAA structure 112.

WFM layer 132 can be n- or p-type for n or p-type FET 102A, respectively. In some embodiments, n-type WFM layer 130 can include a metallic material with a work function value closer to a conduction band energy than a valence band energy of a material of nanostructured channel regions 120. For example, n-type WFM layer 130 can include an Al-based or Al-doped metallic material with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based nanostructured channel regions 120. In some embodiments, n-type WFM layer 130 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof.

In some embodiments, p-type WFM layer 130 can include a metallic material with a work function value closer to a valence band-edge energy than a conduction band-edge energy of a material of nanostructured channel regions 120. For example, p-type WFM layer 130 can include a substantially Al-free (e.g., with no Al) metallic material with a work function value equal to or greater than 4.5 eV (e.g., about 4.5 eV to about 5.5 eV), which can be closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based nanostructured channel regions 120. In some embodiments, p-type WFM layer 130 can include substantially Al-free (e.g., with no Al): (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, and titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, and Ta—Ni alloy; (iv) metal nitrides, such as molybdenum nitride (MoN) and tungsten nitride (WN); (iii) other suitable Al-free metallic materials; (iv) and combinations thereof.

In some embodiments, WFM layer 130 can include a thickness ranging from about 1 nm to about 4 nm. The thickness within this range can allow WFM layer 130 to be wrapped around NHC regions 120A-120B and NVC region 114 without being constrained by distances S1-S2.

In some embodiments, gate metal fill layer 134 can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), any other suitable conductive material, and a combination thereof. In some embodiments, gate metal fill layer 134 can include a substantially fluorine-free metal layer (e.g., fluorine-free W). The substantially fluorine-free metal layer can include an amount of fluorine contaminants less than about 5 atomic percent in the form of ions, atoms, and/or molecules. In some embodiments, GAA contact structures 136 on GAA structure 112 can include conductive materials similar to contact plugs 125.

Referring to FIGS. 1B-1C and 1F-1H, NVC region 114 can extend along a Z-axis through NHC regions 120A-120B and GAA structure 112 and can be disposed on the portion of fin structure 108 underlying NHC regions 120A-120B. Portions of NVC region 114 can be alternatively surrounded by and in physical contact with NHC regions 120A-120B and GAA structure 112 about a Z-axis, as shown in FIGS. 1B-1C and 1G-1H. Such arrangement of NVC region 114 with NHC regions 120A-120B provides electrical connection between NHC regions 120A-120B. As a result, electrical potential induced in NHC regions 120A-120B by gate portions 112A-112C can be substantially equally distributed between NHC regions 120A-120B to form substantially equipotential NHC regions 120A-120B. Forming equipotential NHC regions 120A-120B can mitigate differences between channel parameters of NHC regions 120A-120B, such as channel current and drain induced barrier lowering (DIBL) parameters, and consequently increase current density of FET 102A.

Without NVC region 114, there may be variations between the electrical potential induced in NHC regions 120A-120B due to variations in the dimensions of NHC regions 120A-120B with respect to each other and/or in the dimensions of gate portions 112A-112C with respect to each other. The dimension variations can be a result of processing conditions used during the fabrication of NHC regions 120A-120B, inner gate spacers 115, and/or GAA structure 112, as described in further details below. The dimension variations can also exist between NHC regions 120A-120B and GAA structures 112 of different FETs (e.g., FETs 102A-102B) of semiconductor device 100, which can lead to variations between FET parameters, such as threshold voltage, DIBL, subthreshold swing (SS), and on current ($I_{ON}$). Such inter-FET variations can also be mitigated with NVC regions 114 in the different FETs of semiconductor device 100. Thus, NVC region 114 mitigates the effect of dimension variations on device parameters, and consequently reduces intra-device parameter variability and inter-device parameter variability in semiconductor device 100.

Referring to FIG. 1H, HK gate dielectric layer 128, NC gate dielectric layer 130, WFM layer 132, and gate metal fill layer 134 can be arranged concentrically around NVC region 114. NC gate dielectric layer 130 can prevent or reduce parasitic capacitance between portions of NVC region 114 and NHC regions 120A-120B. In some embodiments, top surface 114t of NVC region 114 can be substantially coplanar with top surface 120At of NHC region 120A and base 114b of NVC region 114 can be in physical contact with top surface 108t of fin structure 108, as shown in FIGS. 1B-1C. In some embodiments, NVC region 114 can extend into fin structure 108 and base 114b can be a distance D2 below top surface 108t, as shown in FIGS. 1B-1C with dashed lines. The extended portion of NVC region 114 in fin structure 108 can increase current density in NHC region 120B and consequently improve device performance of FET 102A.

NVC region 114 can include semiconductor materials similar to or different from substrate 106 and/or fin structure 108. In some embodiments, NVC region 114 can include Si, SiAs, SiP, SiC, SiCP, SiGe, SiGeB, GeB, SiGeSnB, a III-V semiconductor compound, or other suitable semiconductor materials. In some embodiments, NVC region 114 can be undoped or can be doped with p-type dopants (e.g., boron, indium, aluminum, or gallium) or n-type dopants (e.g., phosphorus or arsenic).

NVC region 114 can have a circular cross-section along an X-Y plane, as shown in FIGS. 1F-1H. In some embodiments, NVC region 114 can have a cross-section of other geometric shapes (e.g., rectangular, elliptical, or polygonal; not shown) along an X-Y plane. In some embodiments, NVC region 114 can have a diameter D1 (or a width along an X-axis and/or Y-axis) ranging from about 8 nm to about 12 nm. In some embodiments, a ratio between diameter D1 and length L1 of NHC region 120A (i.e., D1:L1) and between diameter D1 and width W1 of NHC region 120A (i.e., D1:W1) can range from about 1:2 to about 1:10. In some embodiments, a ratio between diameter D1 and gate length GL1 (i.e., D1:GL1) can range from about 1:2 to about 1:10. These dimensions and/or relative dimensions of NVC region 114 can adequately distribute electrical potential in NHC regions 120A-120B to form substantially equipotential NHC regions 120A-120B. Below these dimensions and/or relative dimensions of NVC region 114, NVC region 114 may not adequately distribute electrical potential in NHC regions 120A-120B, and consequently degrade the device performance. Above these dimensions and/or relative dimensions of NVC region 114, the cost and complexity of manufacturing FET 102A with NVC region 114 is increased.

In some embodiments, instead of NHC regions 120A-102B, gate portions 112A-112C, and inner spacer 115, FET 102A can include a stack of NHC regions 120A-120C and inner spacers 115A-115C and GAA structure 112 can include gate portions 112A and 112D-112F, as shown in FIGS. 1I-1L. The discussion of elements in FIGS. 1A-1L with the same annotations applies to each other, unless mentioned otherwise. The discussion of (i) NHC regions 120A-120B applies to NHC region 120C, (ii) inner spacer 115 applies to inner spacers 115A-115C, and (iii) gate portions 112B-112C applies to gate portions 112D-112F, unless mentioned otherwise. The cross-sectional view along line G-G and an X-Y-plane of FIG. 1I can be similar to FIG. 1G and the cross-sectional view along line H-H and an X-Y-plane of FIG. 1I can be similar to FIG. 1H.

As shown in FIGS. 1I-1L, NHC regions 120A-120C can have dimensions different from each other and gate portions 112D-112F can have dimensions different from each other as a result of processing conditions. Distances S1-S3 between NHC regions 120A-120C and thicknesses T1-T3 of NHC regions 120A-120C along a Z-axis can range from about 1 nm to about 8 nm or other suitable dimensions and can be different from each other. Widths W1 and W6-W7 of NHC regions 120A-120C along a Y-axis can range from about 20 nm to about 100 nm or other suitable dimensions. W1 can be greater than W6, which can be greater than W7. As a result, portions of NHC regions 120A-120C on either side of NVC region 114 can have different widths W3-W5 (shown in FIG. 1J). W3 can be greater than W4, which can be greater than W5.

Gate lengths GL4-GL6 of gate portions 112D-112F can range from about 20 nm to about 80 nm, or other suitable dimensions. GL4 can be greater than GL5, which can be greater than GL6. As a result, regions of gate portions 112D-112F on either side of NVC region 114 can have different lengths L3-L5 (shown in FIG. 1I). L3 can be greater than L4, which can be greater than L5. The variations in gate lengths GL4-GL6 can be due to different dimensions of inner spacers 115A-115C, as shown in FIGS. 1I and 1K. The thickness of inner spacer 115A along an X-axis can be greater than the thickness of inner spacer 115B along an X-axis, which can be greater than the thickness of inner spacer 115C along an X-axis. The radius of curvature of the interface between inner spacer 115A and gate portion 112D can be greater than the radius of curvature of the interface between inner spacer 115B and gate portion 112E, which can be greater than the radius of curvature of the interface between inner spacer 115C and gate portion 112F. The tangents at edge points of inner spacers 115A-115B can form respective angles A-B with sidewall 120Bs of NHC region 120B. The tangents at edge points of inner spacers 115B-115C can form respective angles C-D with sidewall 120Cs of NHC region 120C. In some embodiments, angle A is smaller than angles B-D and angles B-C are smaller than angle D.

The effect of dimension variations in NHC regions 120A-120C and gate portions 112D-112F on device parameters can be mitigated with NVC region 114, as discussed above. NVC region 114 can extend along a Z-axis through NHC regions 120A-120C and electrically connect NHC regions 120A-120C to each other. Portions of NVC region 114 can be alternatively surrounded by and in physical contact with NHC regions 120A-120C and GAA structure 112 about a Z-axis, as shown in FIGS. 1I-1J.

Figure 2:
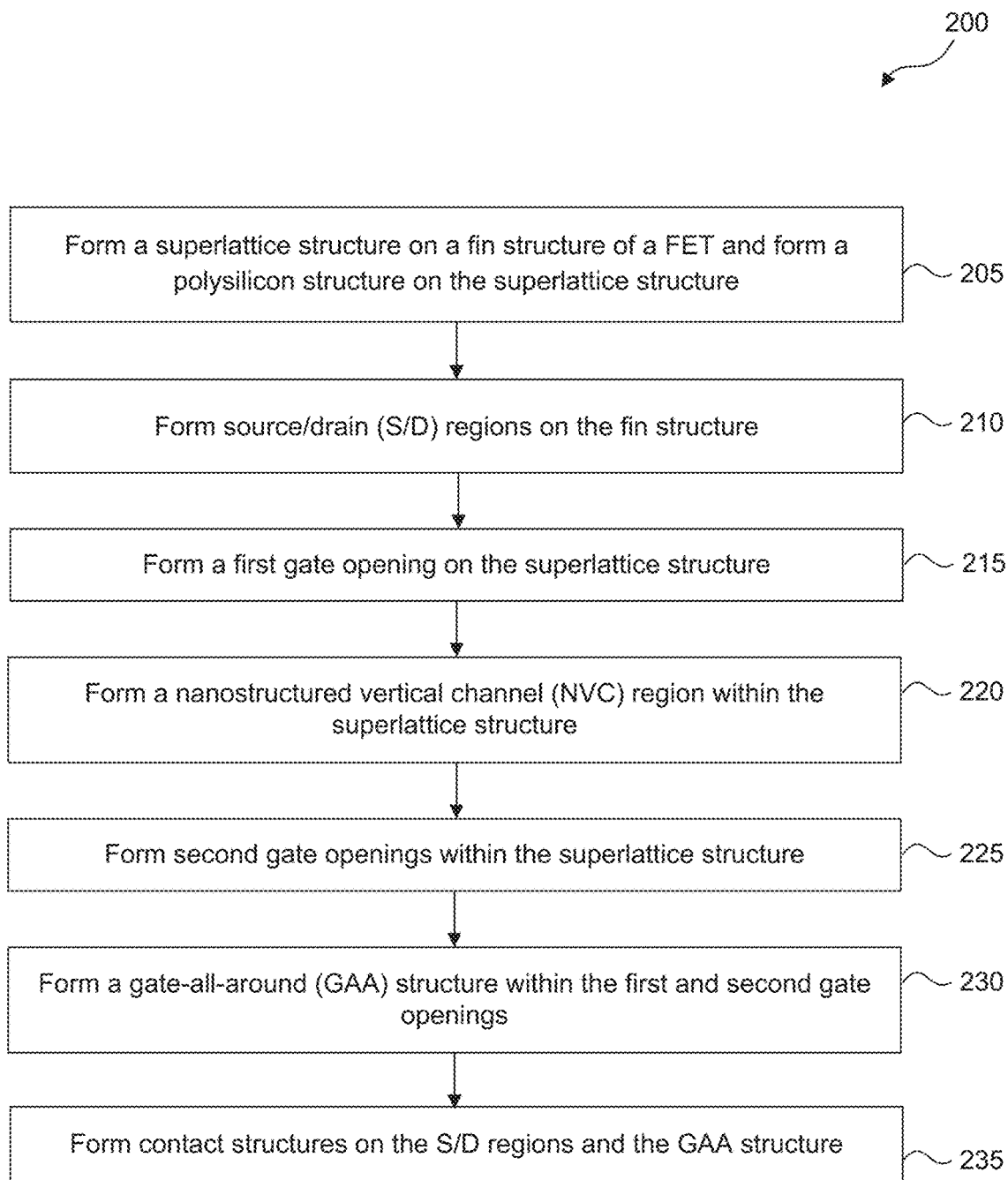
FIG. 2 is a flow diagram of a method for fabricating a semiconductor device with nanostructured vertical and horizontal channel regions, in accordance with some embodiments.

FIG. 2 is a flow diagram of an example method 200 for fabricating FET 102A of semiconductor device 100, according to some embodiments. For illustrative purposes, the operations illustrated in FIG. 2 will be described with reference to the example fabrication process for fabricating FET 102A as illustrated in FIGS. 3A-19B. FIGS. 3A-19B are cross-sectional views of FET 102A along lines A-A and B-B of semiconductor device 100 at various stages of fabrication, according to some embodiments. Operations can be performed in a different order or not performed depending on specific applications. It should be noted that method 200 may not produce a complete FET 102A. Accordingly, it is understood that additional processes can be provided before, during, and after method 200, and that some other processes may only be briefly described herein. Elements in FIGS. 3A-19B with the same annotations as elements in FIGS. 1A-1L are described above.

Figure 3A:
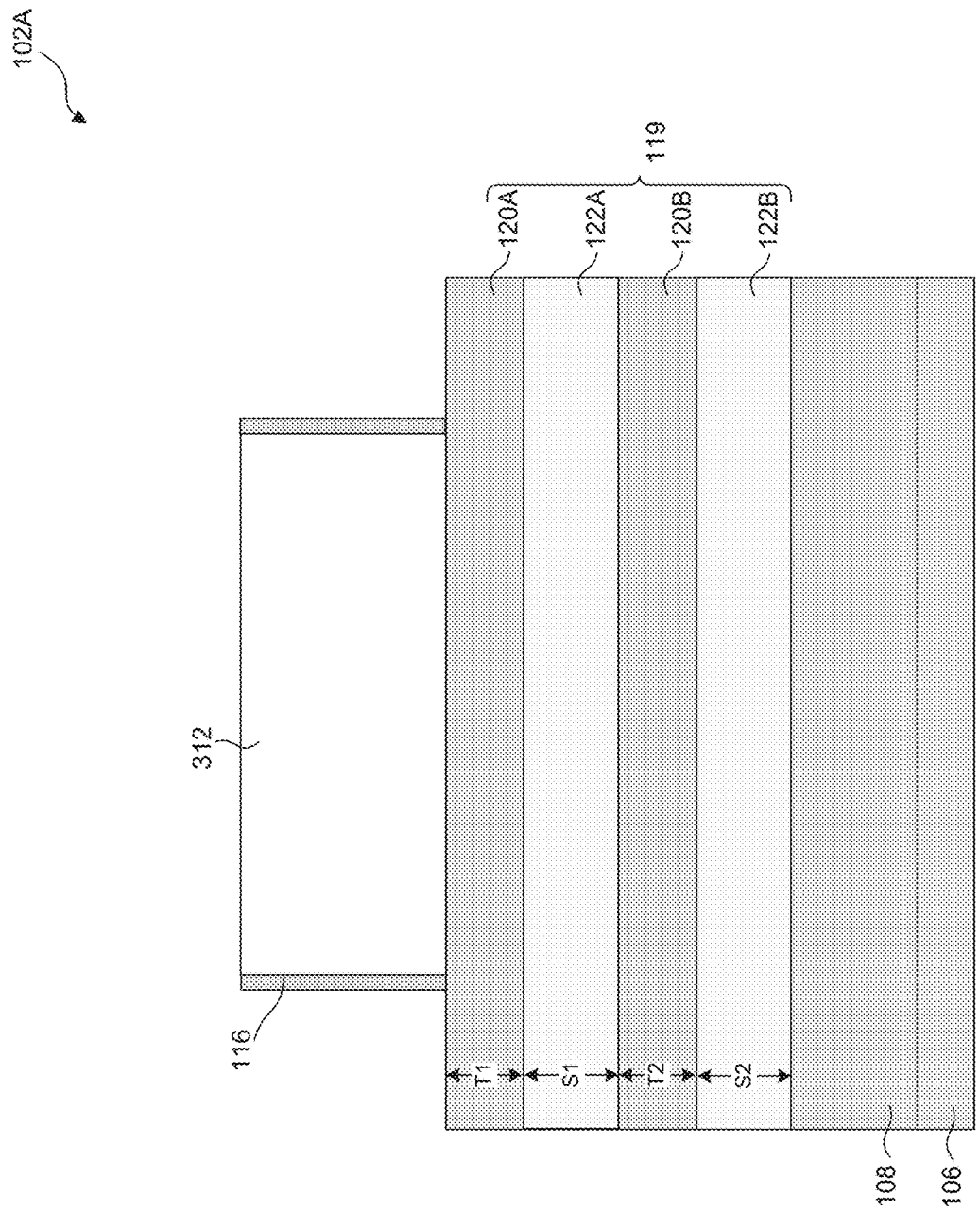
FIGS. 3A-19B illustrate cross-sectional views of a semiconductor device with nanostructured vertical and horizontal channel regions at various stages of its fabrication process, in accordance with some embodiments.
Figure 3B:
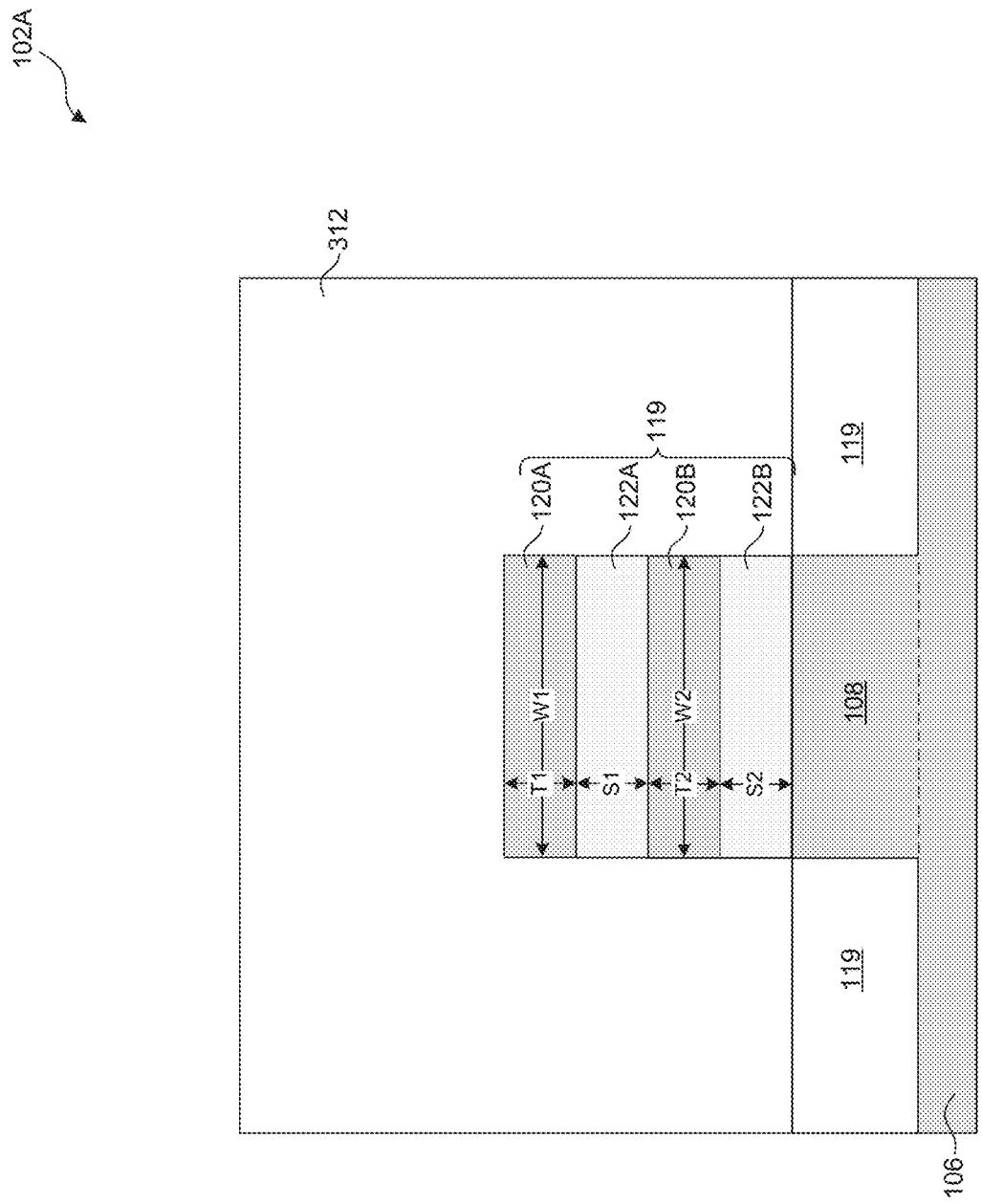
Figure 4B:
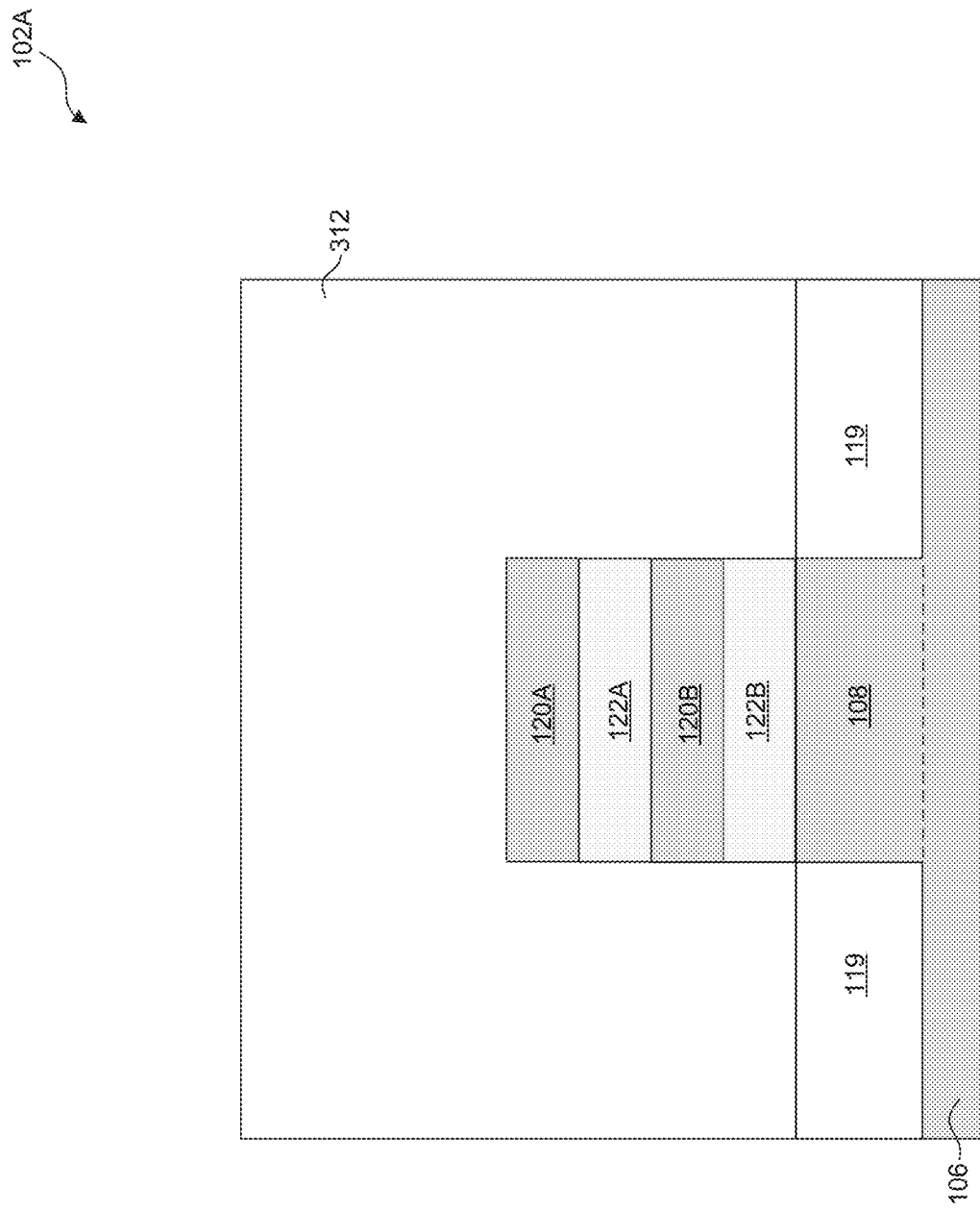

In operation 205, a superlattice structure is formed on a fin structure of a FET, and a polysilicon structure is formed on the superlattice structure. For example, as shown in FIGS. 3A-3B, a polysilicon structure 312 is formed on a superlattice structure 119, which is epitaxially formed on fin structure 108. Superlattice structure 119 can include nanostructured layers 120A-120B and 122A-122B arranged in an alternating configuration. In some embodiments, nanostructured layers 120A-120B can include Si without any substantial amount of Ge (e.g., with no Ge) and nanostructured layers 122A-122B can include SiGe. During subsequent processing, polysilicon structure 312 and nanostructured layers 122A-122B can be replaced in a gate replacement process to form GAA structure 112.

Referring to FIG. 2, in operation 210, S/D regions are formed on the fin structure. For example, as described with reference to FIGS. 4A-7B, S/D regions 110 are formed on fin structure 108. The formation of S/D regions 110 can include sequential operations of (i) forming S/D openings 410, through superlattice structure 119, on portions of fin structure 108 that are not underlying polysilicon structure 312, as shown in FIG. 4A, and (ii) epitaxially growing n-type or p-type semiconductor materials within S/D openings 410, as shown in FIG. 7A. After the formation of S/D regions 110, ESL 117 and ILD layer 118A can be formed on S/D regions 110 to form the structure of FIG. 7A.

Figure 6A:
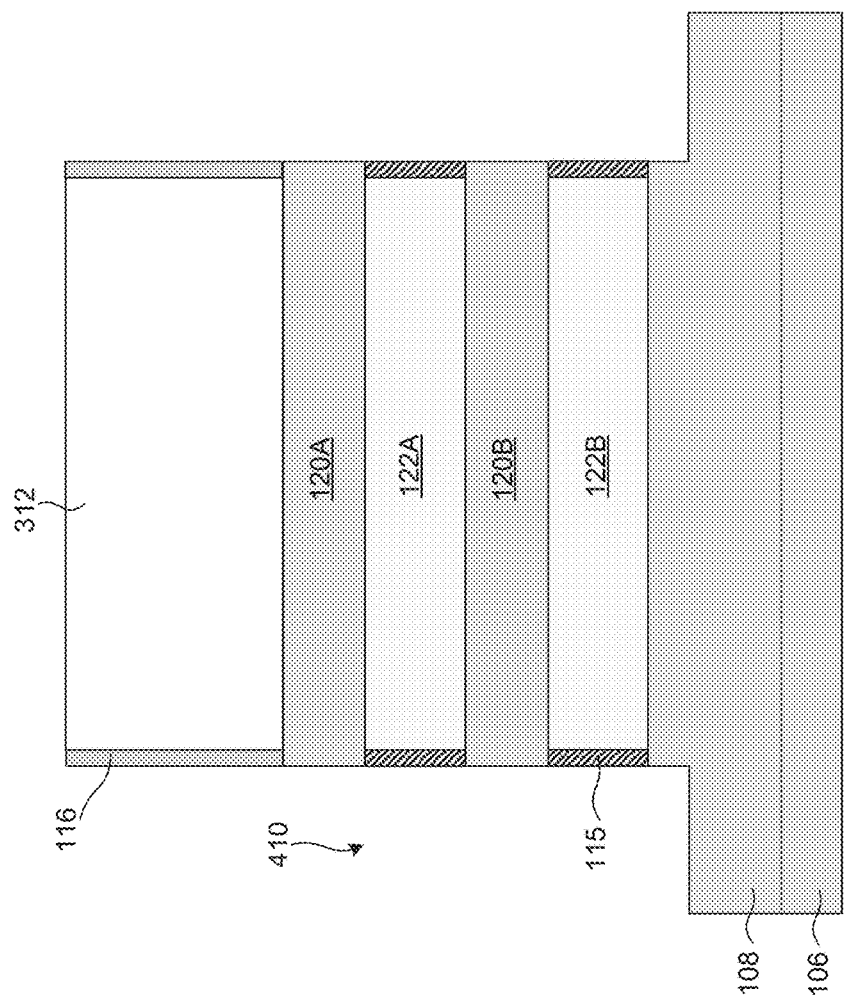
Figure 6B:
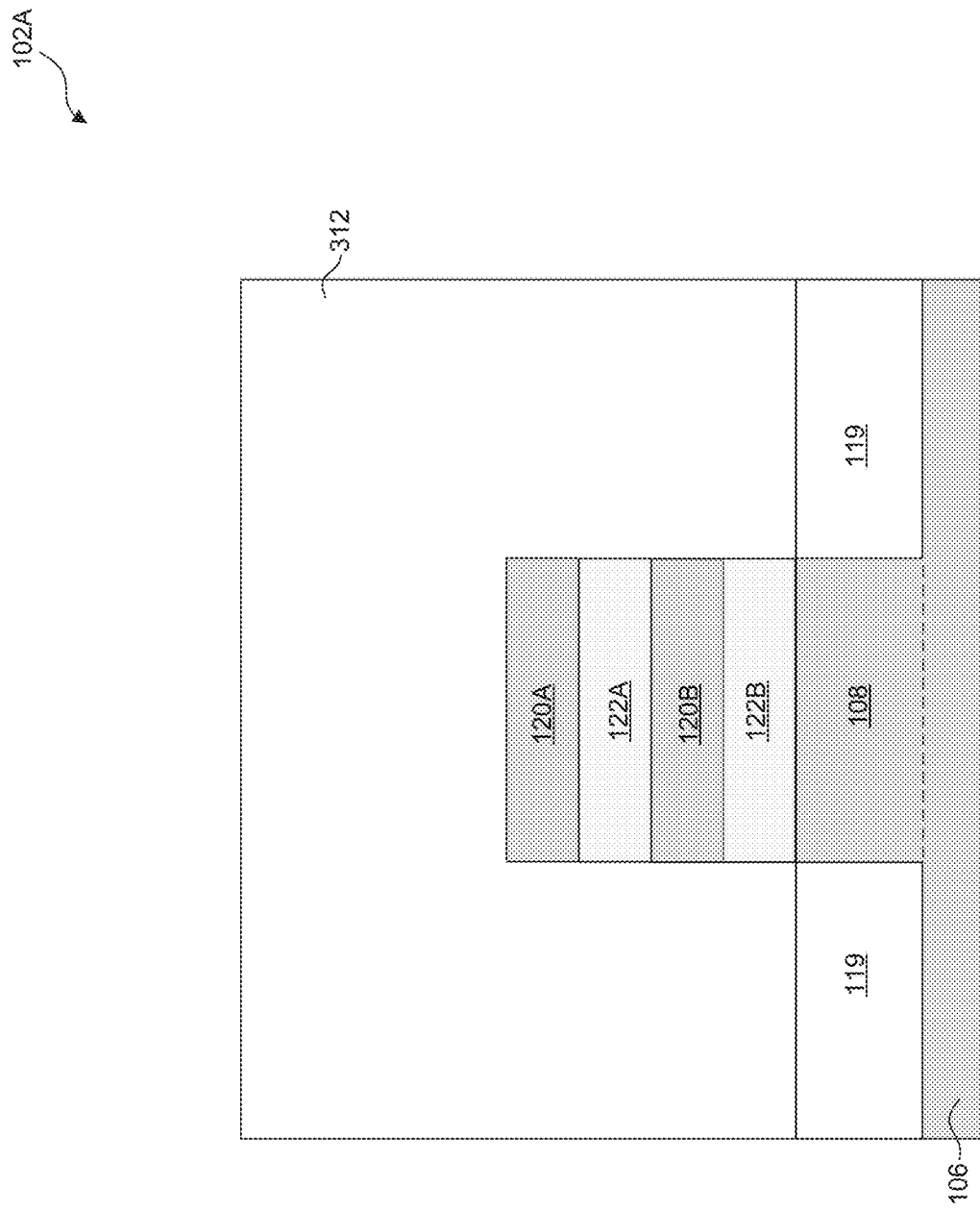
Figure 7A:
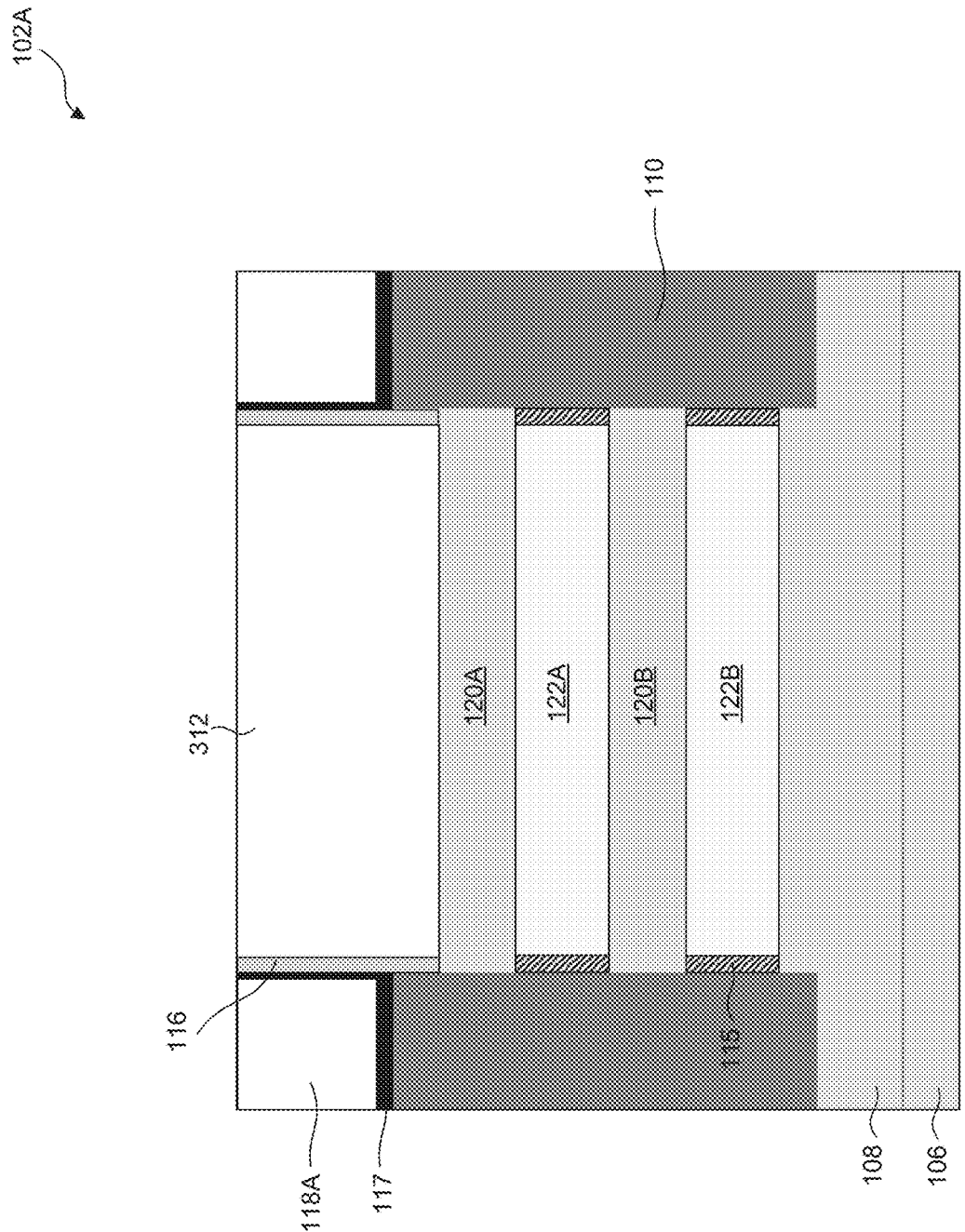
Figure 7B:
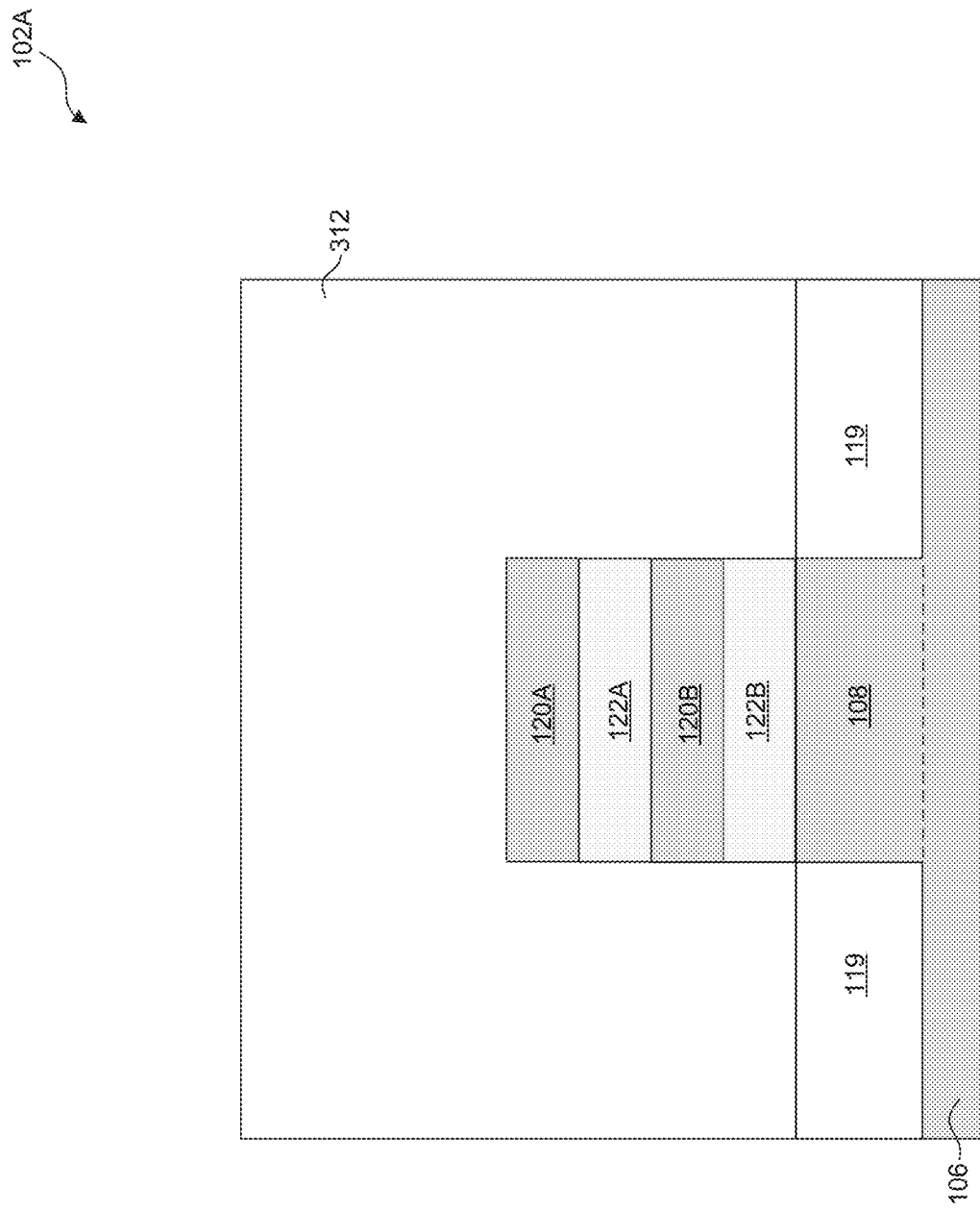

In some embodiments, inner spacers 115 can be formed between operations (i) and (ii) of the formation process of epitaxial S/D regions 110, as shown in FIG. 6A. The formation of inner spacers 115 can include sequential operations of (i) etching nanostructured layers 122A-122B along an X-axis to form the structure of FIG. 4A, (ii) depositing an insulating material on the structures of FIGS. 4A-4B, and (iii), etching the deposited insulating material to form inners spacers 115, as shown in FIG. 6A.

Figure 5A:
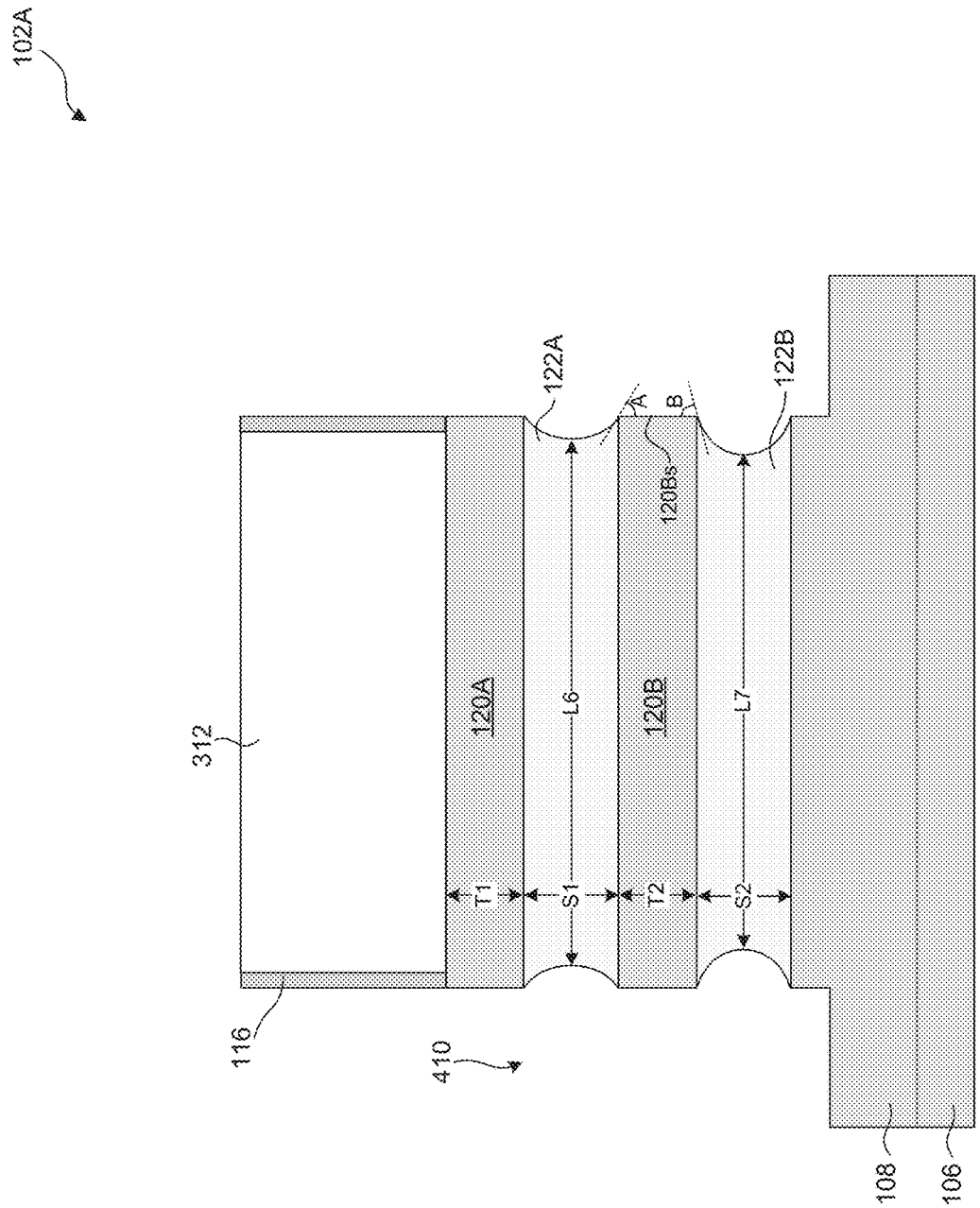
Figure 5B:
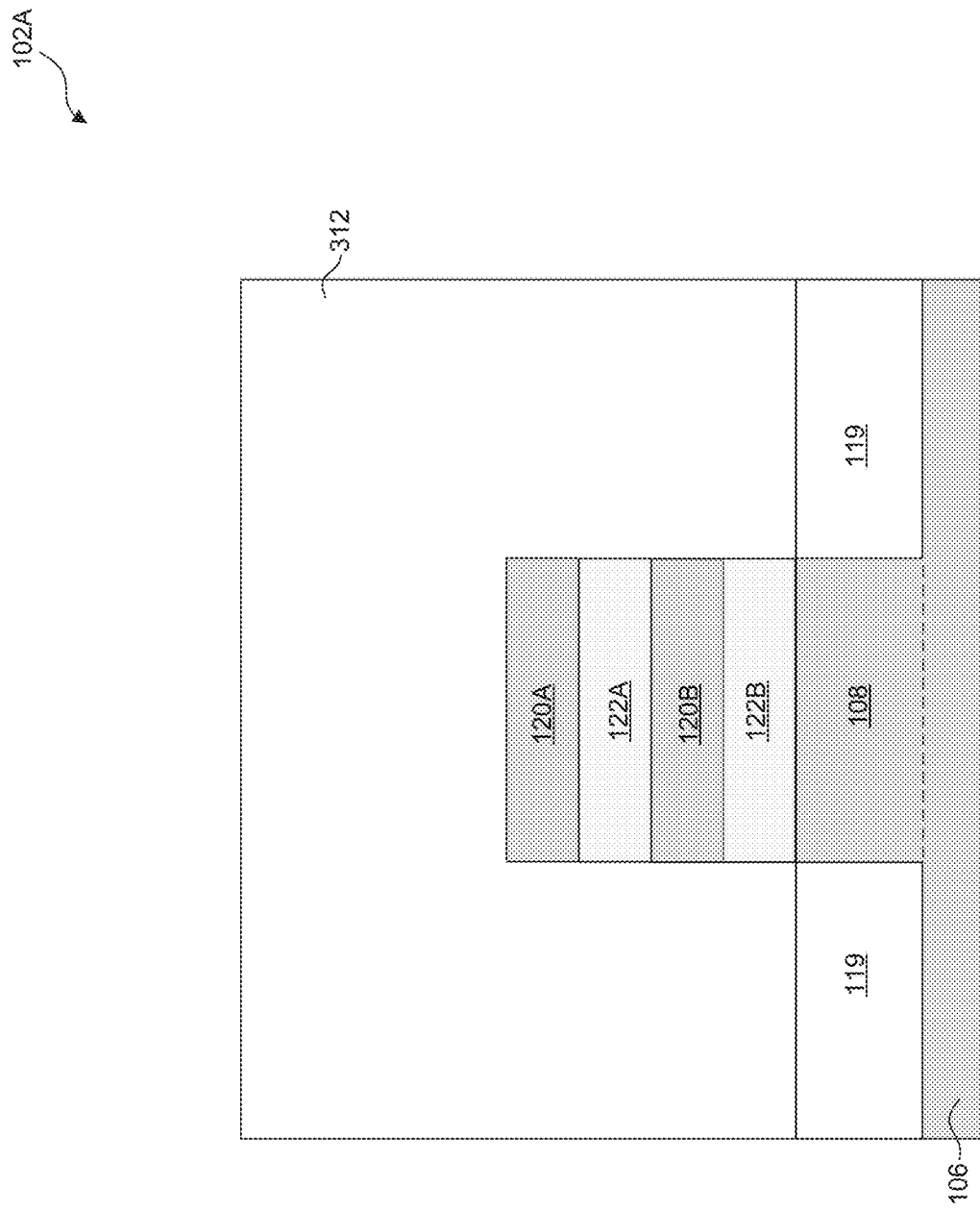

In some embodiments, the etching of nanostructured layers 122A-122B can form the structure of FIG. 5A with the curved sidewall profiles, instead of the linear sidewall profiles of nanostructured layers 122A-122B in FIG. 4A. The radius of curvature of the sidewall profile of nanostructured layer 122A can be greater than the radius of curvature of the sidewall profile of nanostructured layer 122B. The tangents at edge points of the sidewalls of nanostructured layers 122A-122B can form respective angles A-B with sidewall 120Bs of nanostructured layer 120B. In some embodiments, angle A is smaller than angle B. Depositing and etching the insulating material on the structures of FIGS. 5A-5B can form inner spacers 115A-115B, as described with reference to FIGS. 1I and 1K.

The volume of the portions etched from nanostructured layers 122A-122B can be different from each other, resulting in nanostructured layers 122A-122B with respective lengths L6-L7 that are different from each other. In some embodiments, length L6 can be greater than length L7, as shown in FIG. 5A. Due to the different lengths L6-L7, gate portions 112D-112E with different gate GL4-GL5 (described above with reference to FIGS. 1I and 1K) can be formed in a subsequent gate replacement process by replacing nanostructured layers 122A-122B of FIGS. 5A-5B.

Figure 8A:
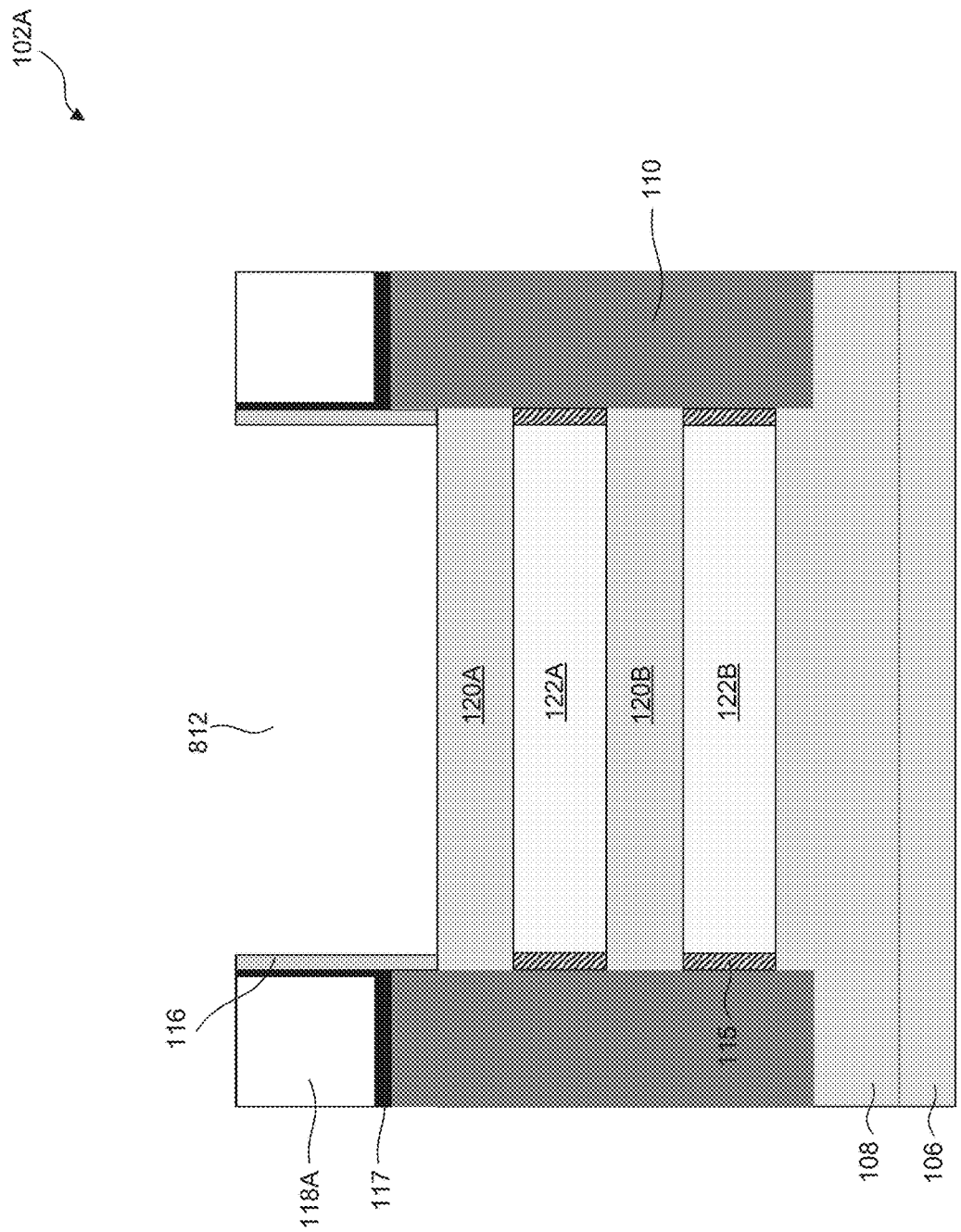
Figure 8B:
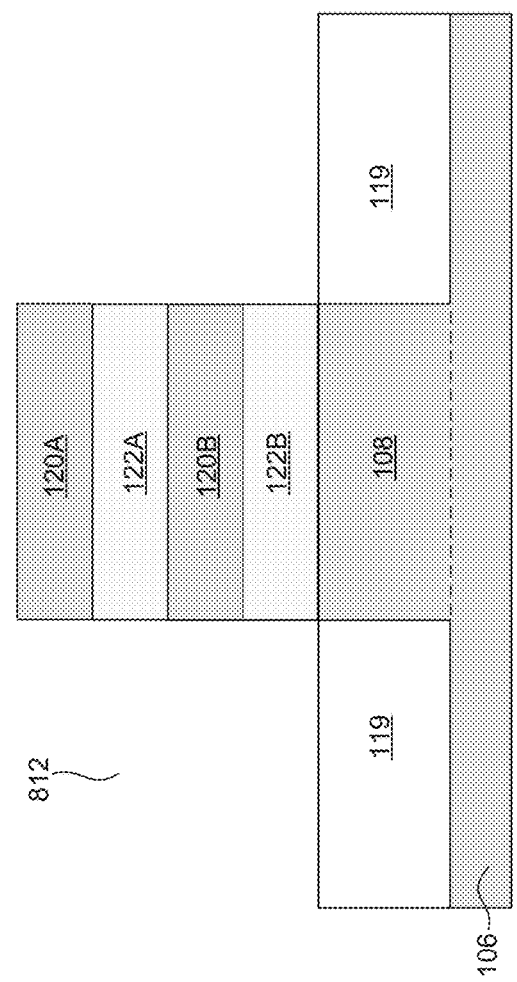

Referring to FIG. 2, in operation 215, a first gate opening is formed on the superlattice structure. For example, as shown in FIGS. 8A-8B, a first gate opening 812 is formed on superlattice structure 119. The formation of first gate opening 812 can include etching polysilicon structure 312 from the structures of FIGS. 7A-7B to form the structures of FIGS. 8A-8B.

Figure 9A:
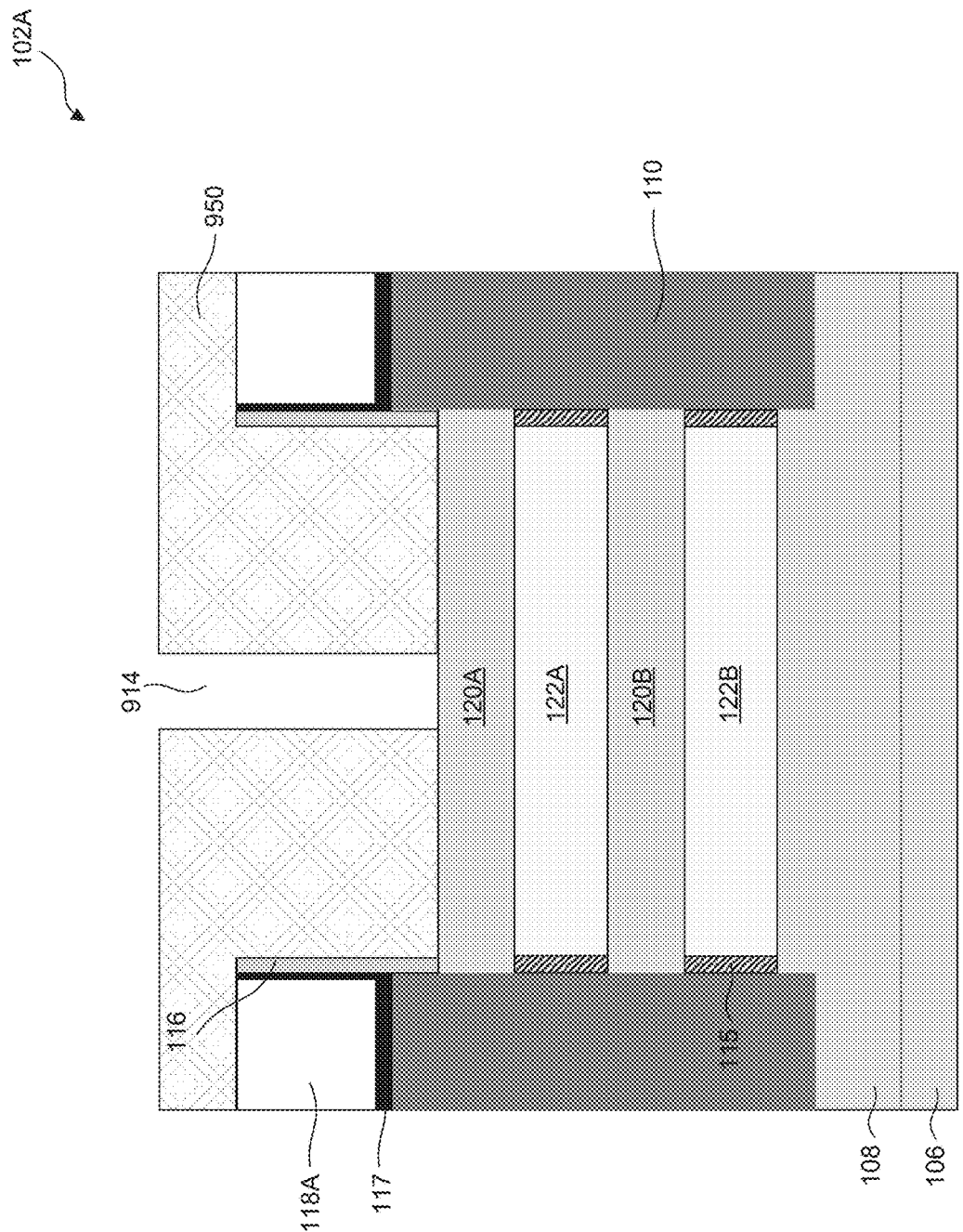
Figure 9B:
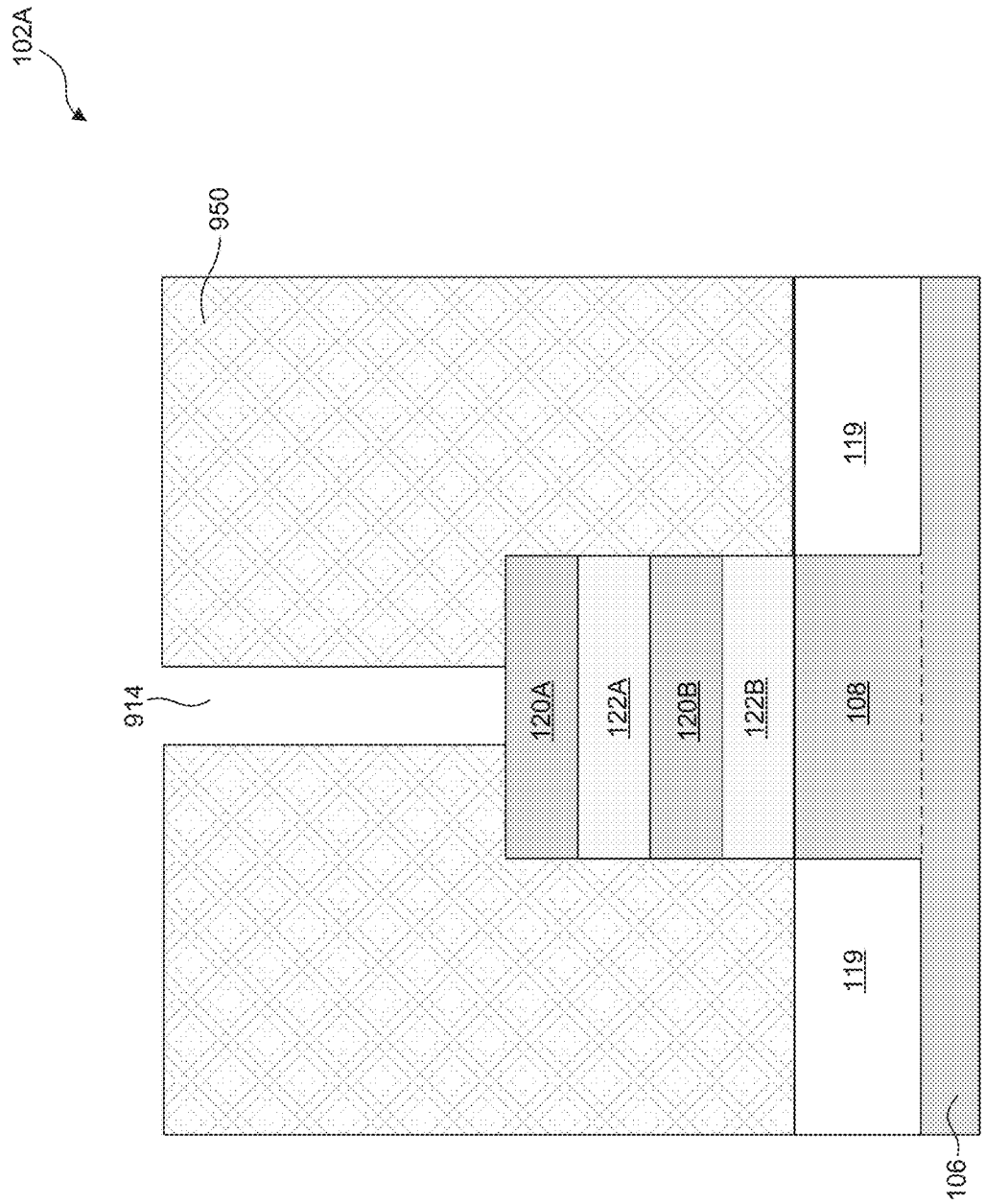
Figure 10A:
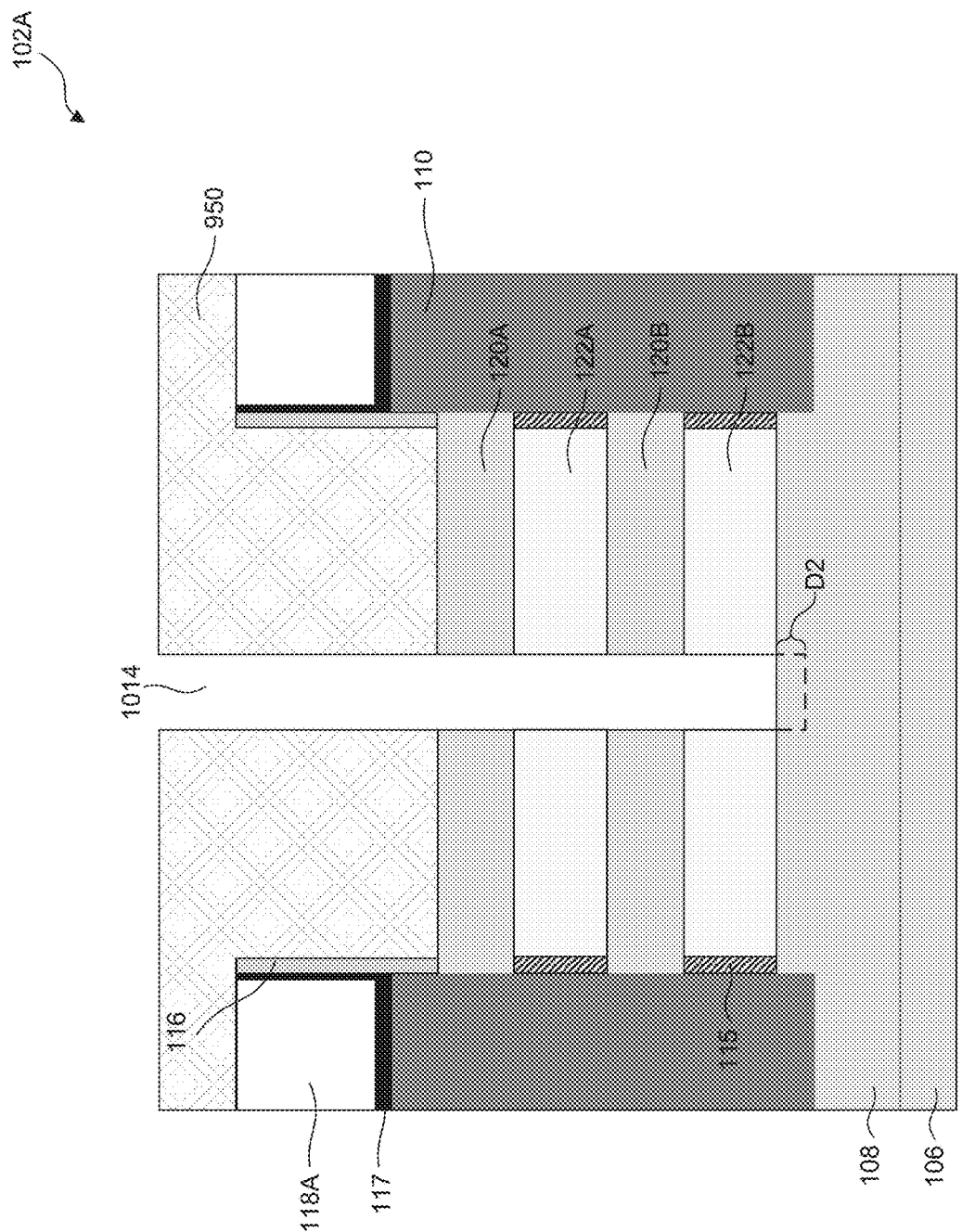
Figure 10B:
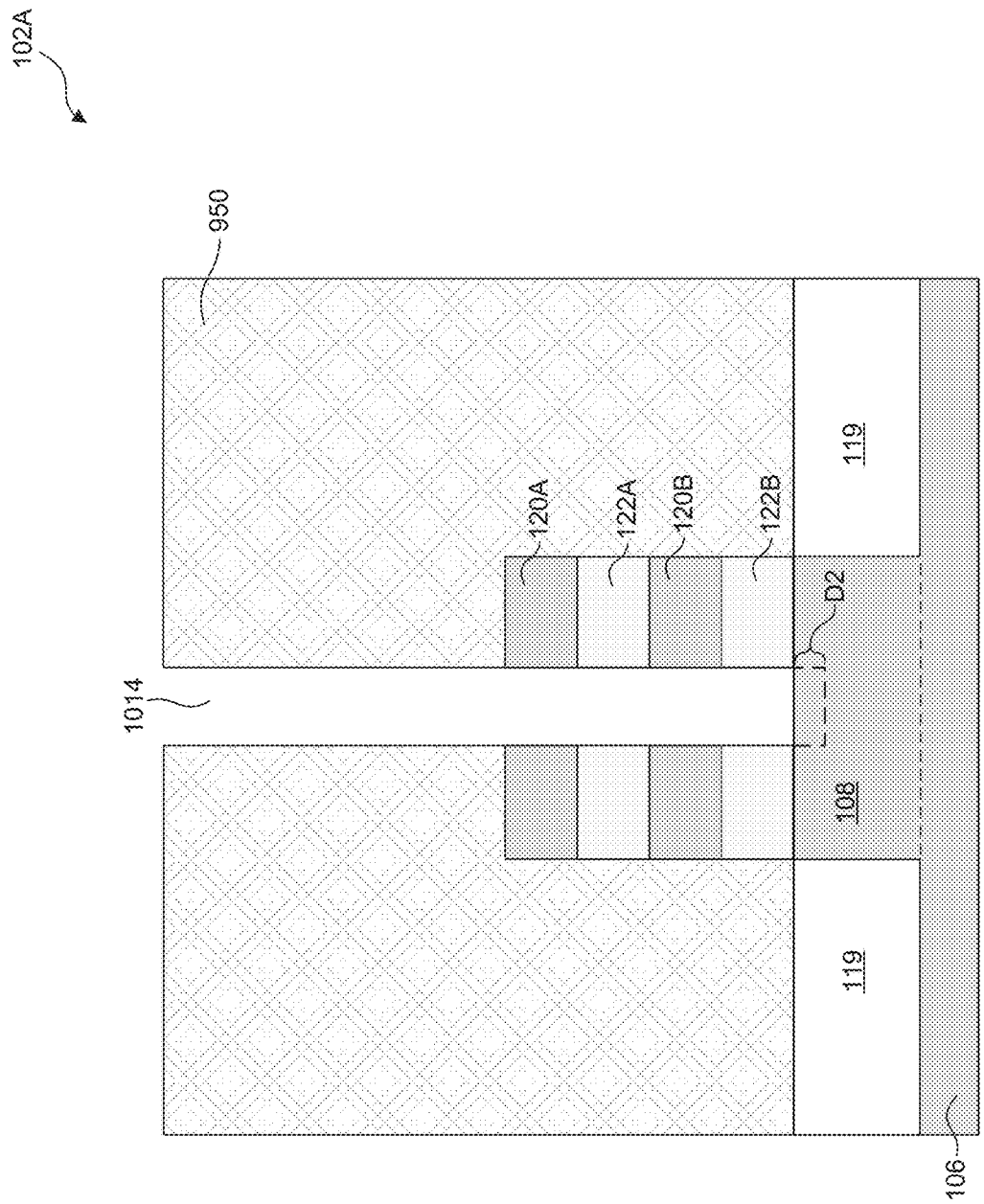
Figure 11A:
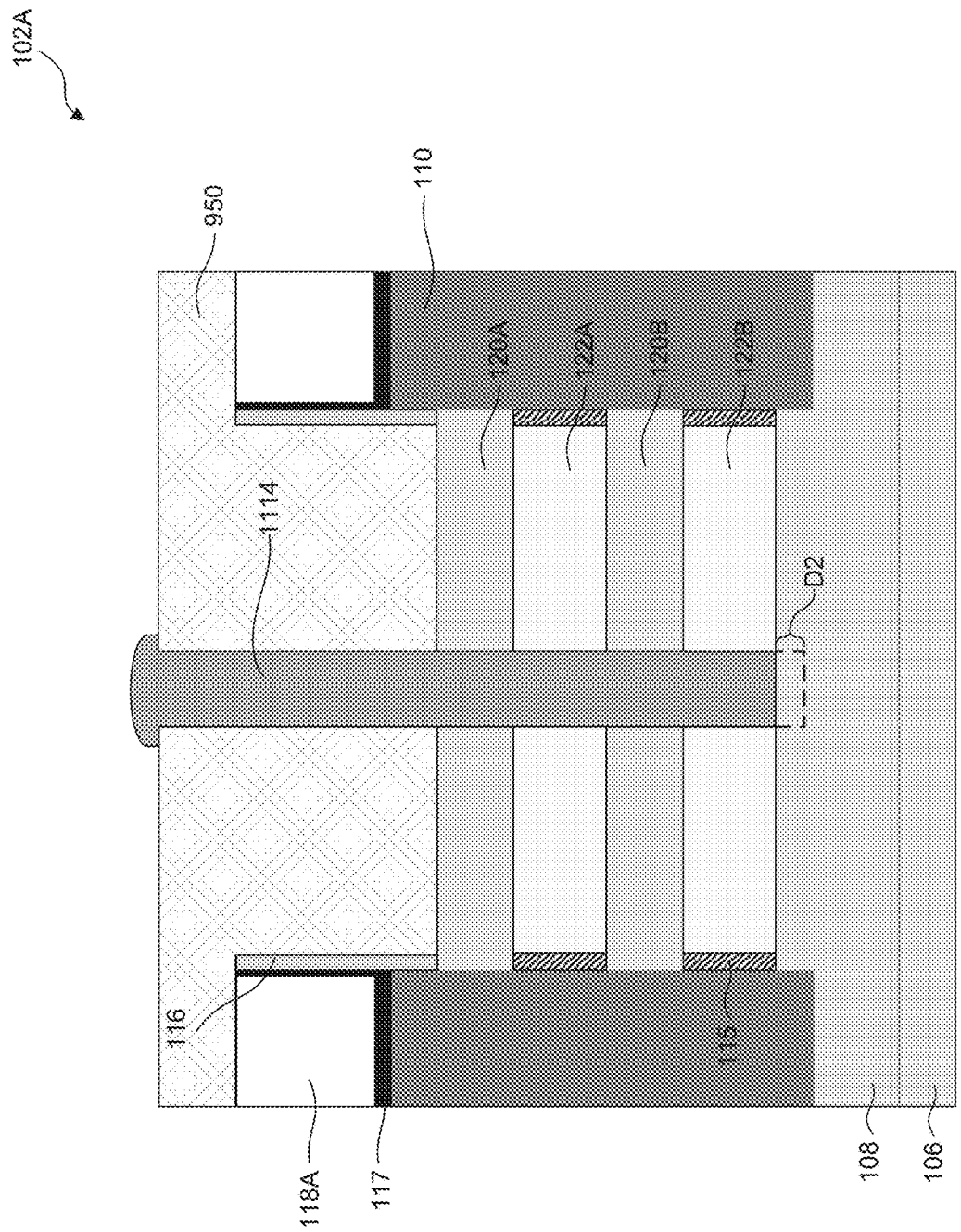
Figure 11B:
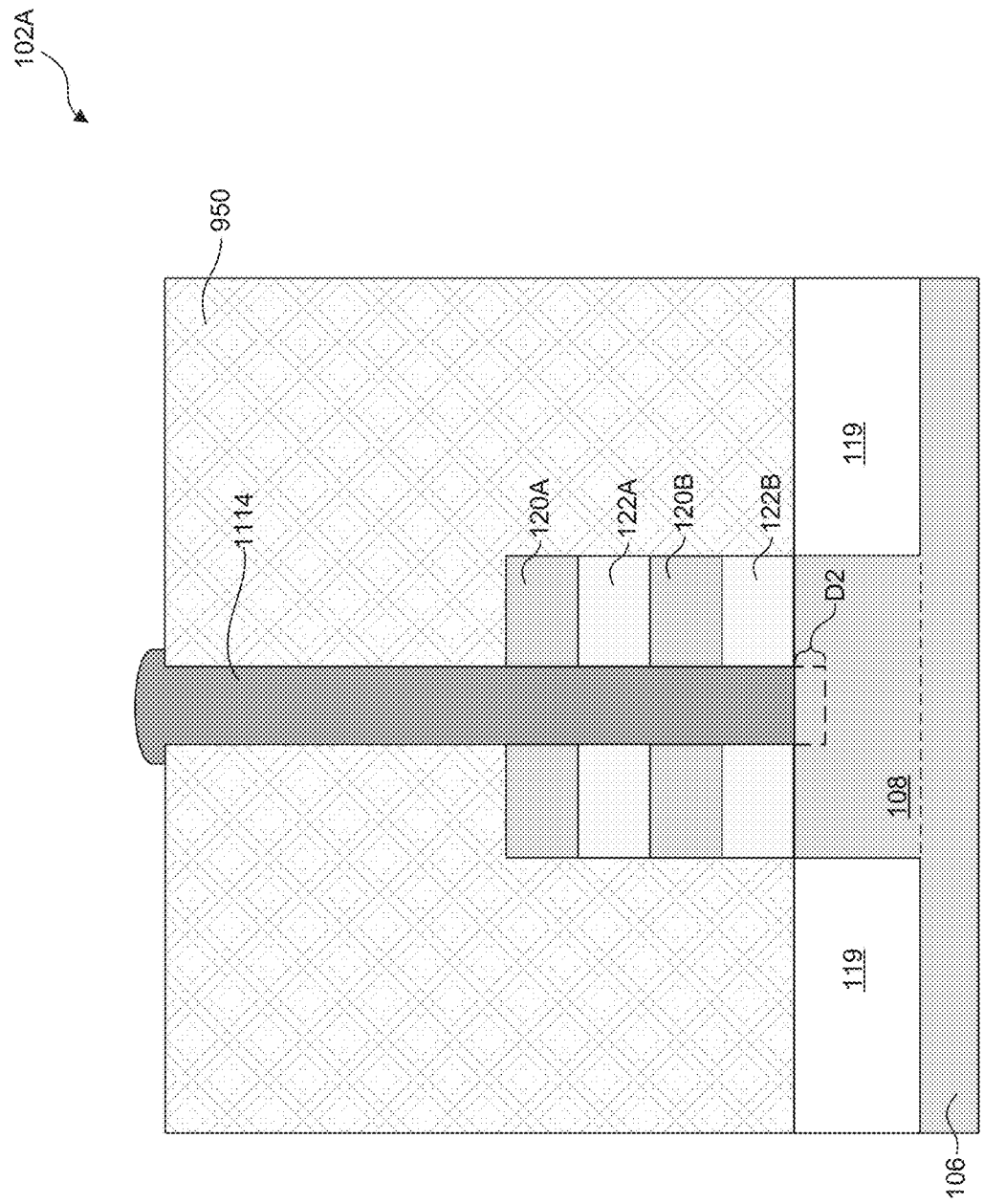
Figure 12A:
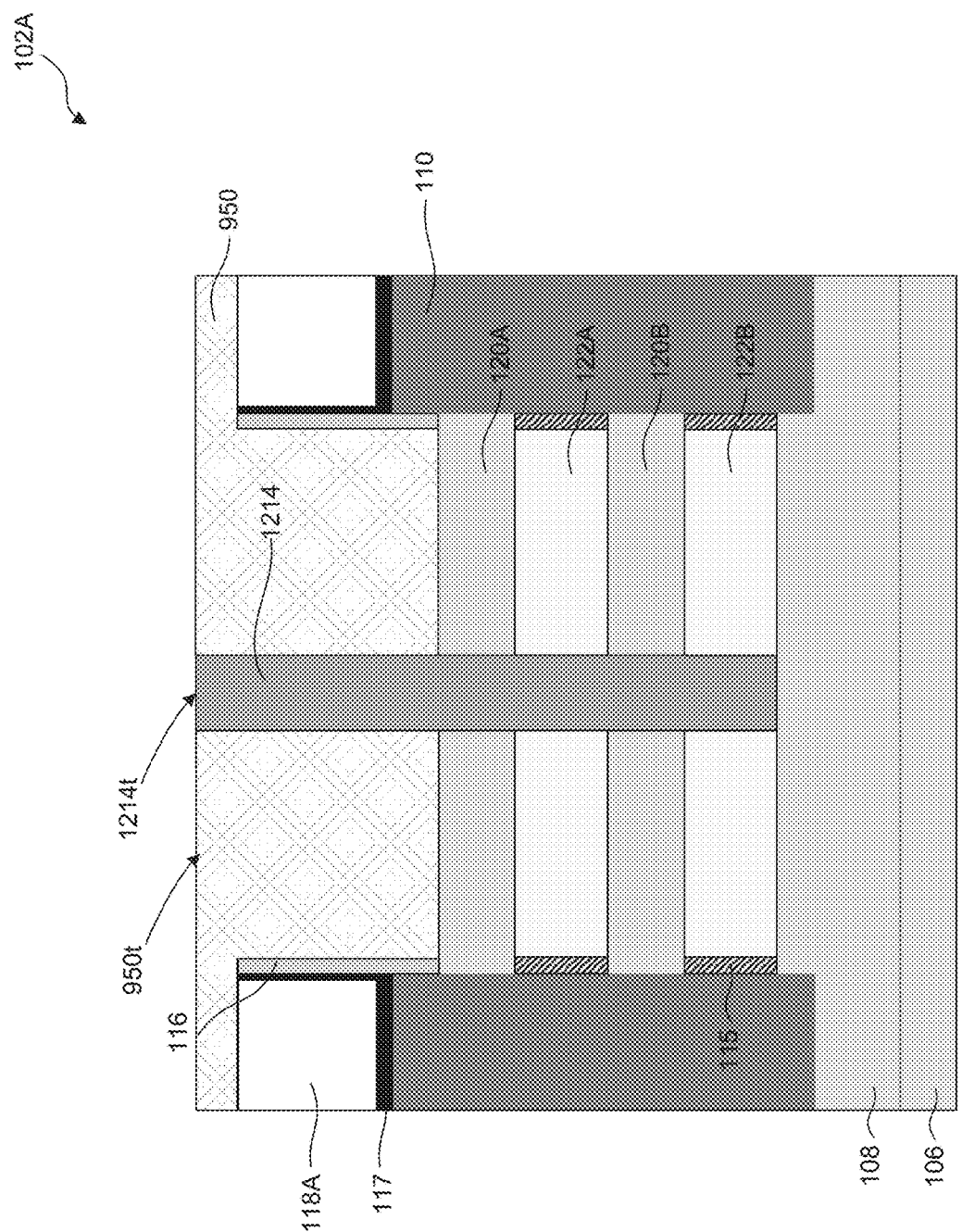
Figure 12B:
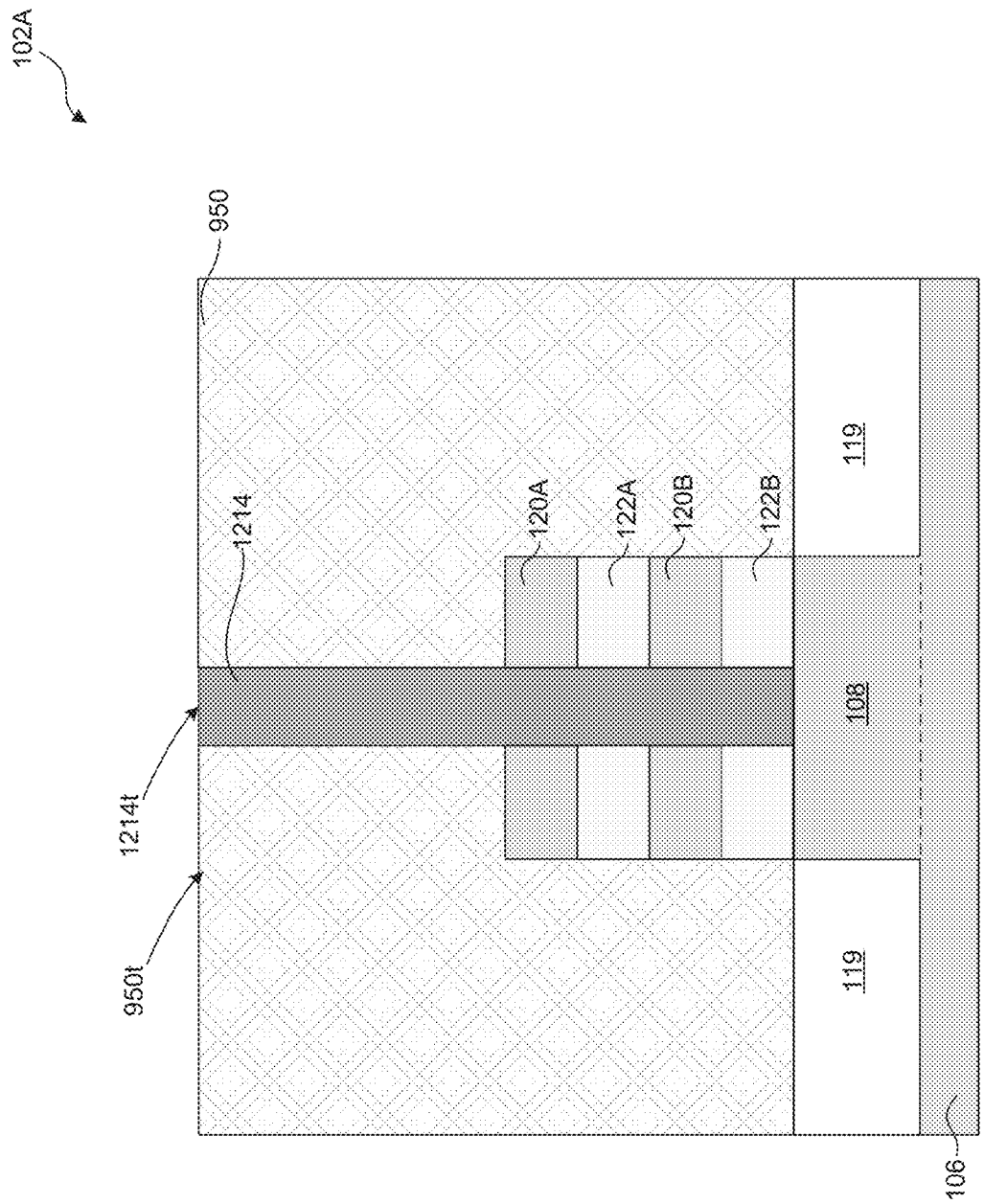

Referring to FIG. 2, in operation 220, a nanostructured vertical channel (NVC) region is formed with the superlattice structure. For example, as described with reference to FIGS. 9A-13B, NVC region 114 is formed within superlattice structure 119. The formation of NVC region 114 within superlattice structure 119 can include sequential operations of (i) forming a patterned masking layer 950 (e.g., a photoresist layer or a nitride layer) with an openings 914 on the structures of FIGS. 8A-8B, as shown in FIGS. 9A-9B, (ii) etching nanostructured layers 120A-120B and 122A-122B through opening 914 to form an opening 1014 through superlattice structure 119 and on fin structure 108, as shown in FIGS. 10A-10B, (iii) depositing or epitaxially growing a nanostructured layer 1114 within opening 814, as shown in FIGS. 11A-11B, (iv) performing a chemical mechanical polishing (CMP) process on the structures of FIGS. 11A-11B to form a polished nanostructured layer 1214, as shown in FIGS. 12A-12B, (v) etching polished nanostructured layer 1214 to form the structures of FIGS. 13A-13B, and (vi) removing patterned masking layer 950 from the structures of FIGS. 13A-13B to form the structures of FIGS. 14A-14B.

The etching of nanostructured layers 120A-120B and 122A-122B can include alternatively etching with a first etching process to remove portions of nanostructured layers 120A-120B through opening 914 and a second etching process to remove portions of nanostructured layers 122A-122B through opening 914. The first etching process can have a higher etch selectivity towards Si than SiGe and can include a wet etching process with a mixture of ammonia hydroxide ($NH_4OH$) and hydrochloric acid HCl. The second etching process can have a higher etch selectivity towards SiGe than Si and can include a wet etching process with a mixture of sulfuric acid ($H_2SO_4$) and hydrogen peroxide ($H_2O_2$) and/or a mixture of $NH_4OH$, $H_2O_2$, and deionized (DI) water. In some embodiments, a portion of fin structure 108 can be etched after the etching of nanostructured layers 120A-120B and 122A-122B to extend opening 1014 into fin structure 108 by a distance D2, as shown in FIGS. 10A-10B.

Figure 13A:
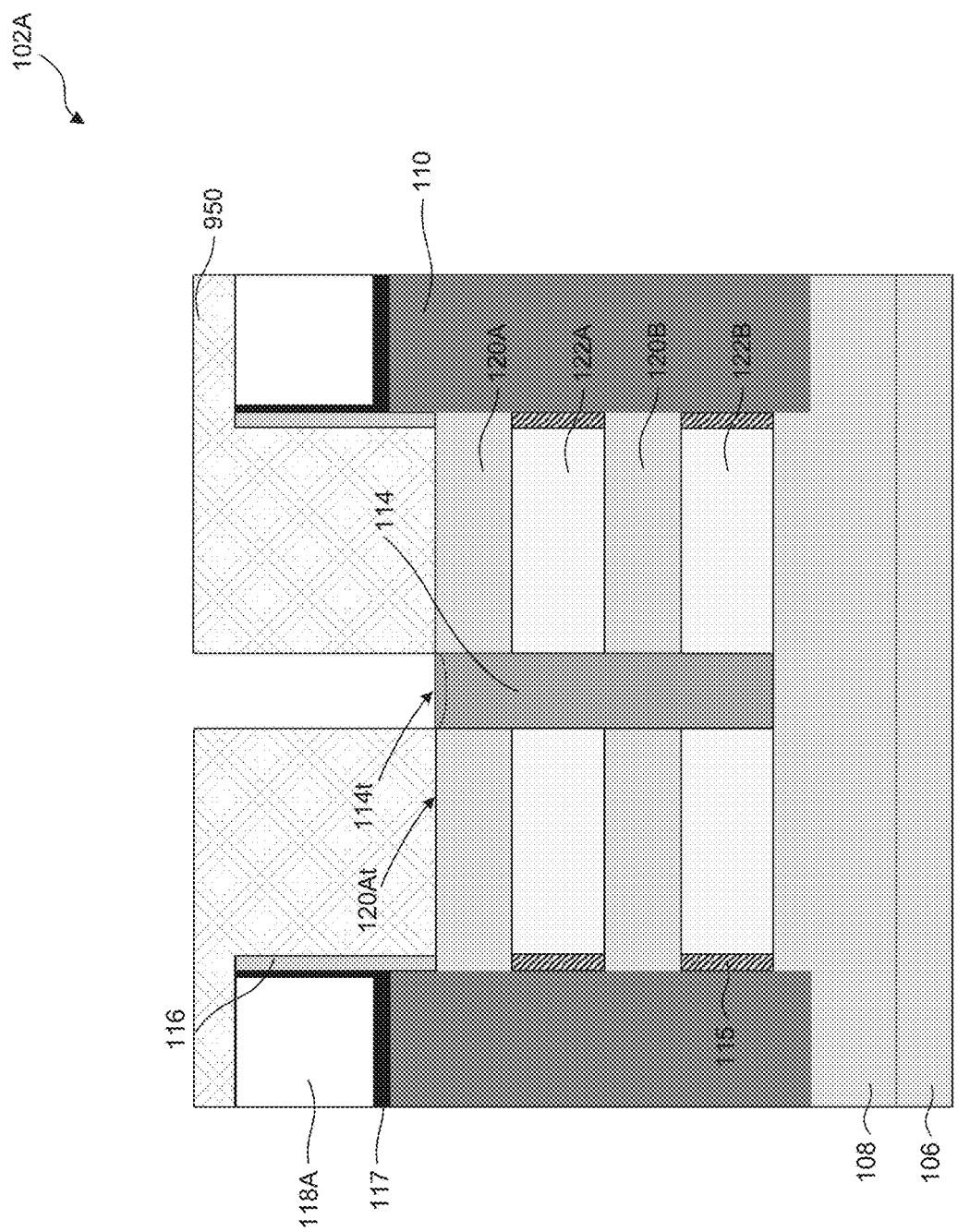
Figure 13B:
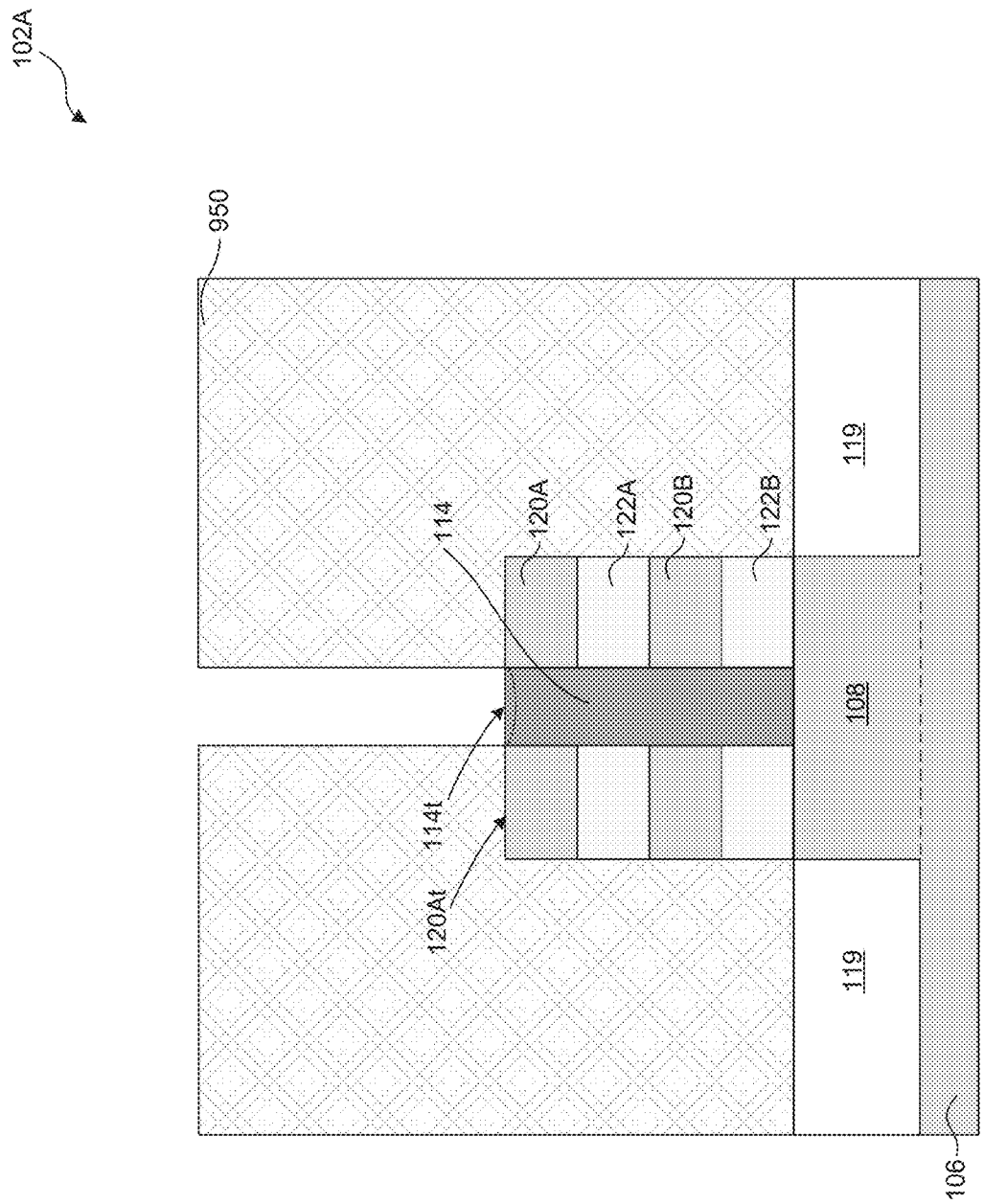
Figure 14A:
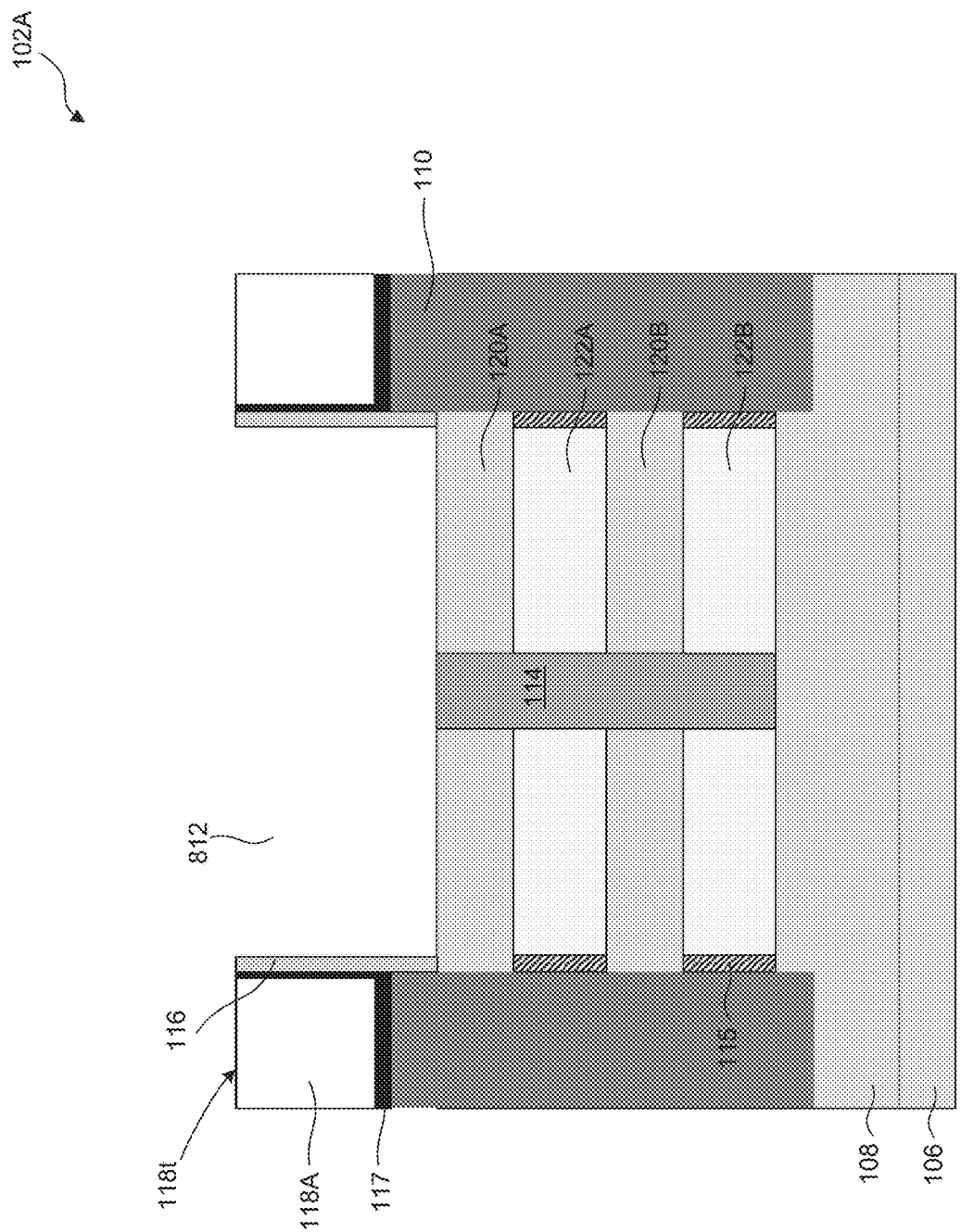
Figure 14B:
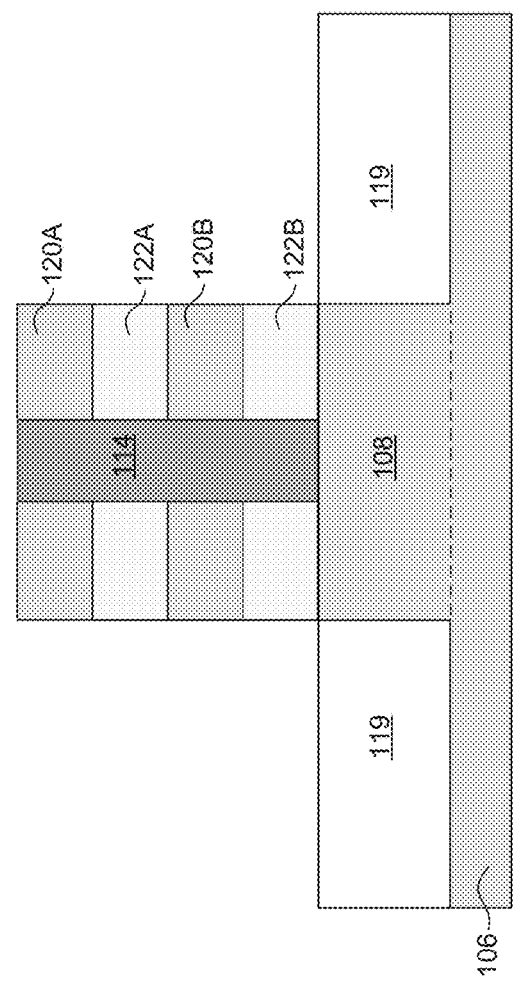

The deposition or epitaxial growth of nanostructured layer 1114 can include depositing or epitaxially growing a layer of Si, SiAs, SiP, SiC, SiCP, SiGe, SiGeB, GeB, SiGeSnB, a III-V semiconductor compound, or other suitable semiconductor materials. In some embodiments, a doping process (not shown) with n- or p-type dopants can be performed on the structures of FIGS. 11A-11B to dope nanostructured layer 1114. The CMP process can substantially coplanarize a top surface 1214t of polished nanostructured layer 1214 with a top surface 950t of masking layer, as shown in FIGS. 12A-12B. The etching of polished nanostructured layer 1214 can substantially coplanarize top surface 114t of NVC region 114 with top surface 120At of nanostructured layer 120A, as shown in FIGS. 13A-13B. In some embodiments, top surface 114t of NVC region 114 can be non-coplanar with top surface 120At and can have a curved profile, as shown with dotted lines in FIGS. 13A-13B.

Figure 15A:
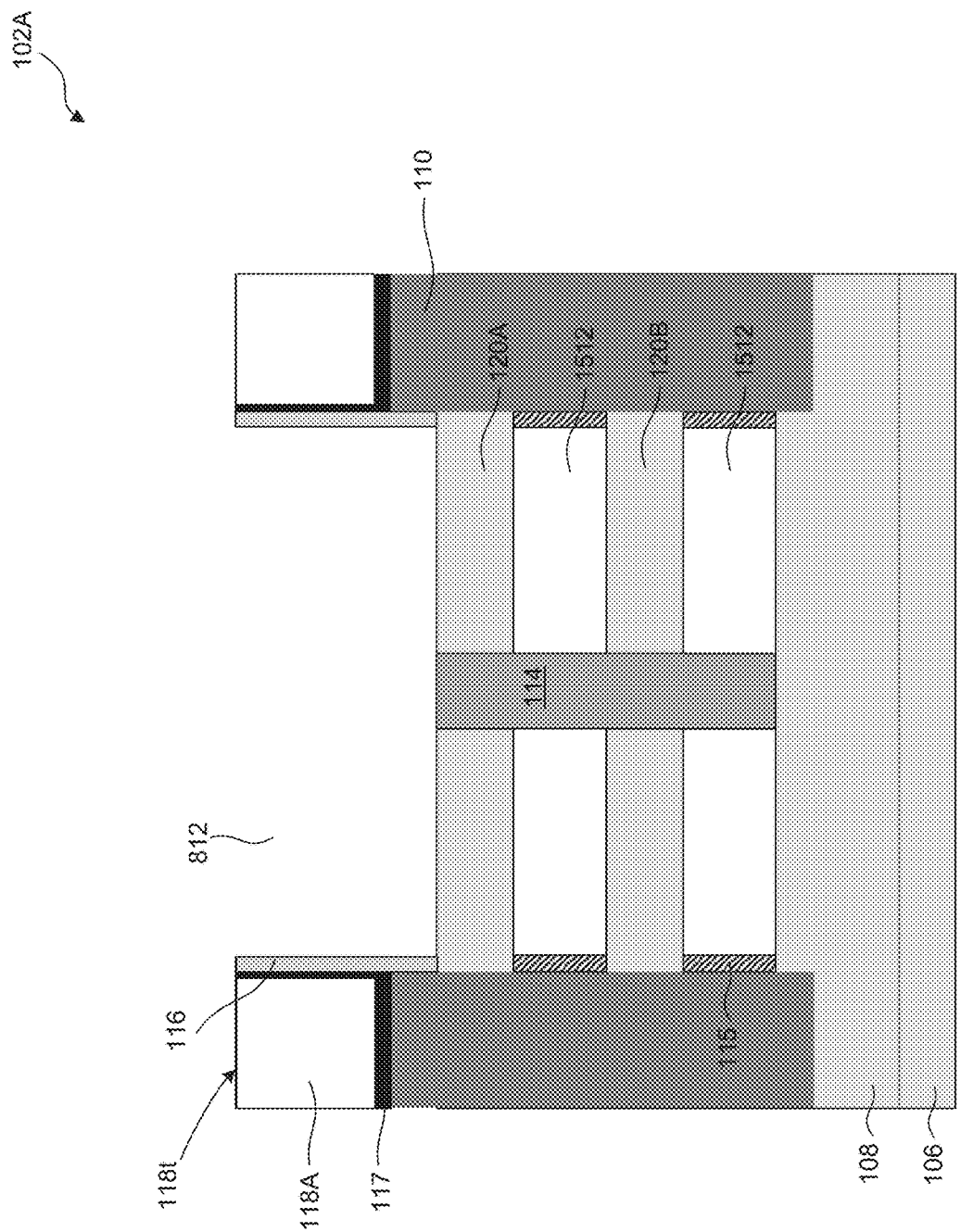
Figure 15B:
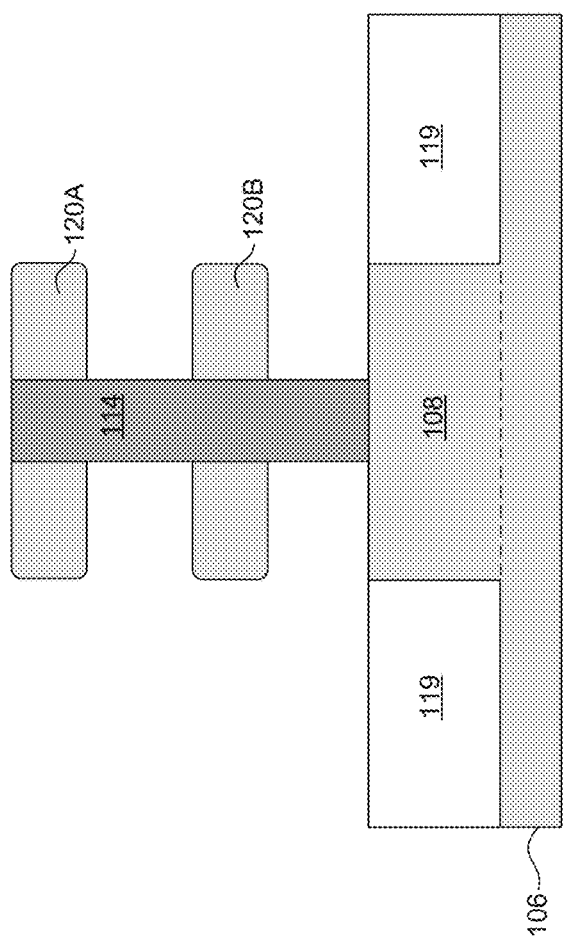

Referring to FIG. 2, in operation 225, second gate openings are formed within the superlattice structure. For example, as shown in FIGS. 15A-15B, second gate openings 1512 are formed within superlattice structure 119. The formation of second gate openings 1512 can include etching nanostructured layers 122A-122B from the structures of FIGS. 14A-14B to form the structures of FIGS. 15A-15B. The etching of nanostructured layers 122A-122B can include a wet etching process with a mixture of $H_2SO_4$ and hydrogen peroxide $H_2O_2$ and/or a mixture of $NH_4OH$, $H_2O_2$, and DI water. In some embodiments, nanostructured layers 120A-120B can be etched during the etching of nanostructured layers 122A-122B and form nanostructured layers 120A-120B with different widths W1 and W6, as described with reference to FIGS. 1J and 1L.

Figure 16A:
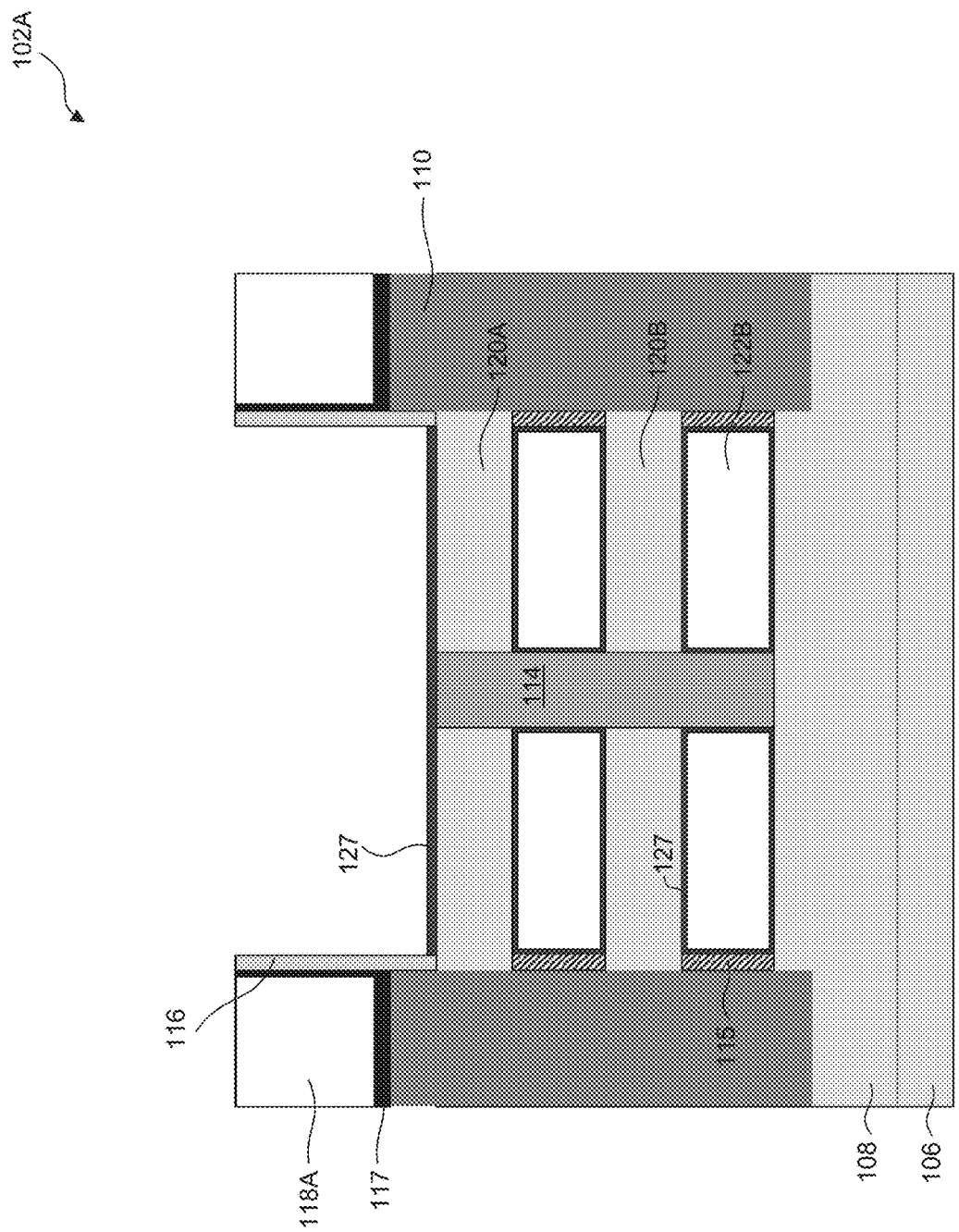
Figure 16B:
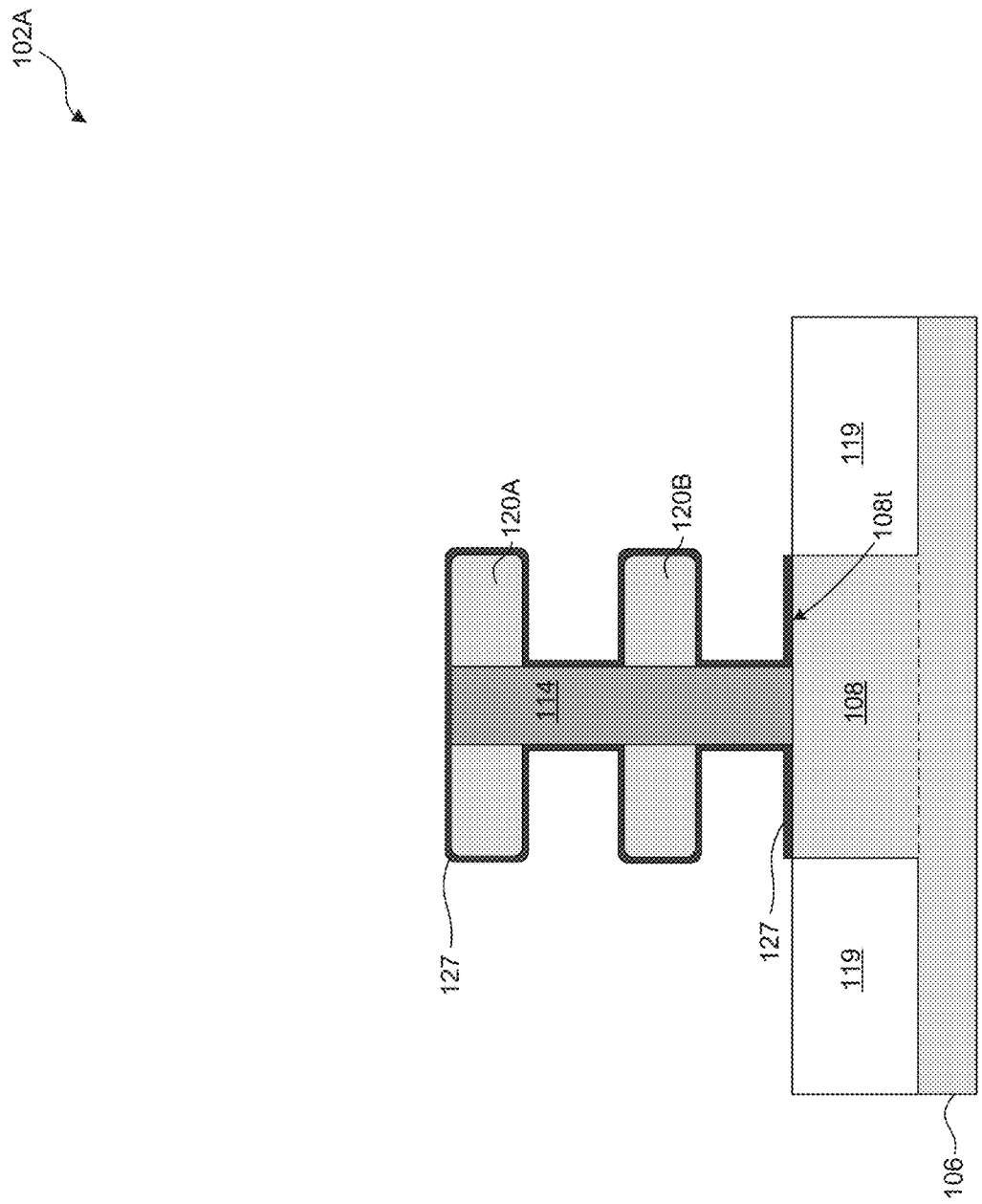
Figure 17A:
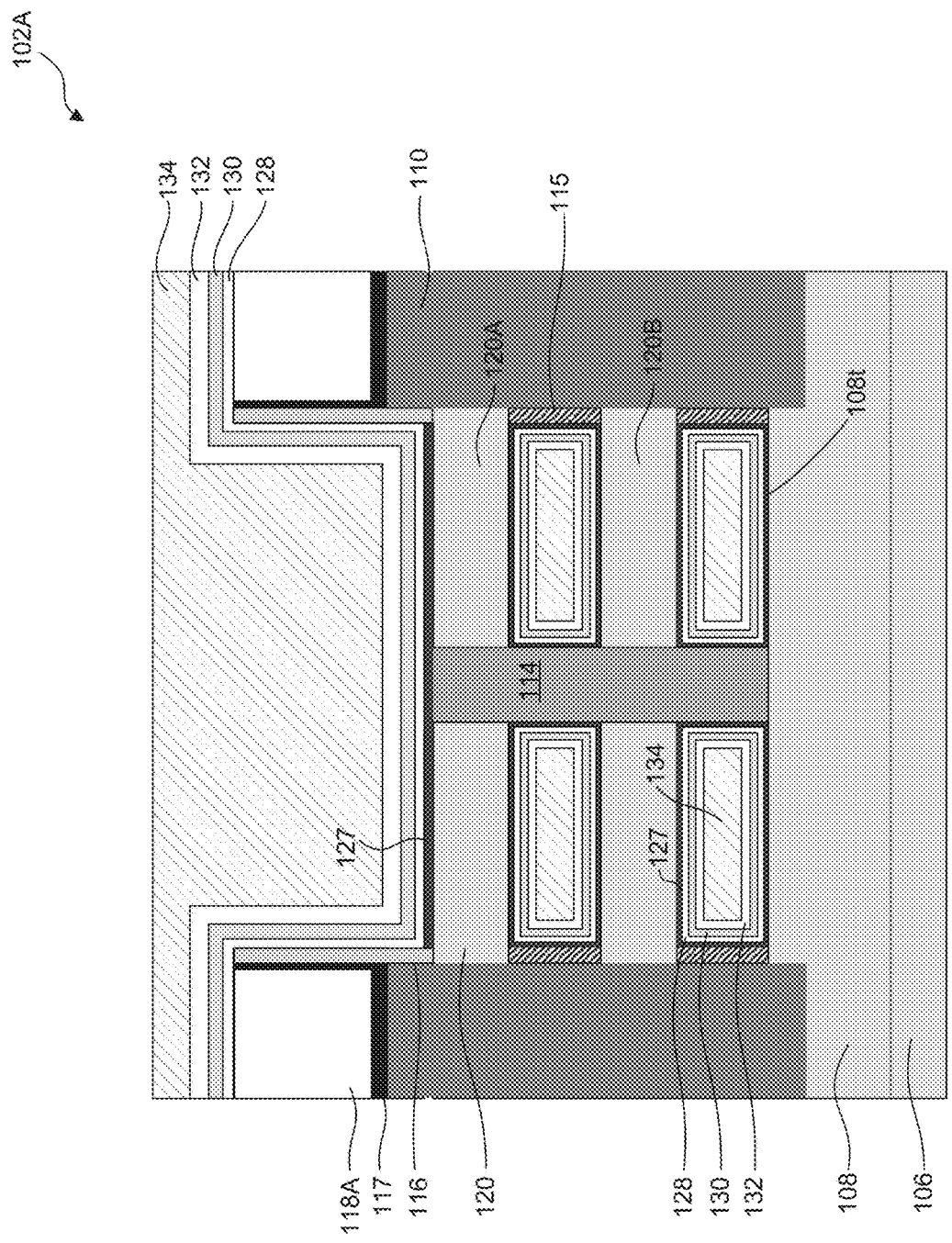
Figure 17B:
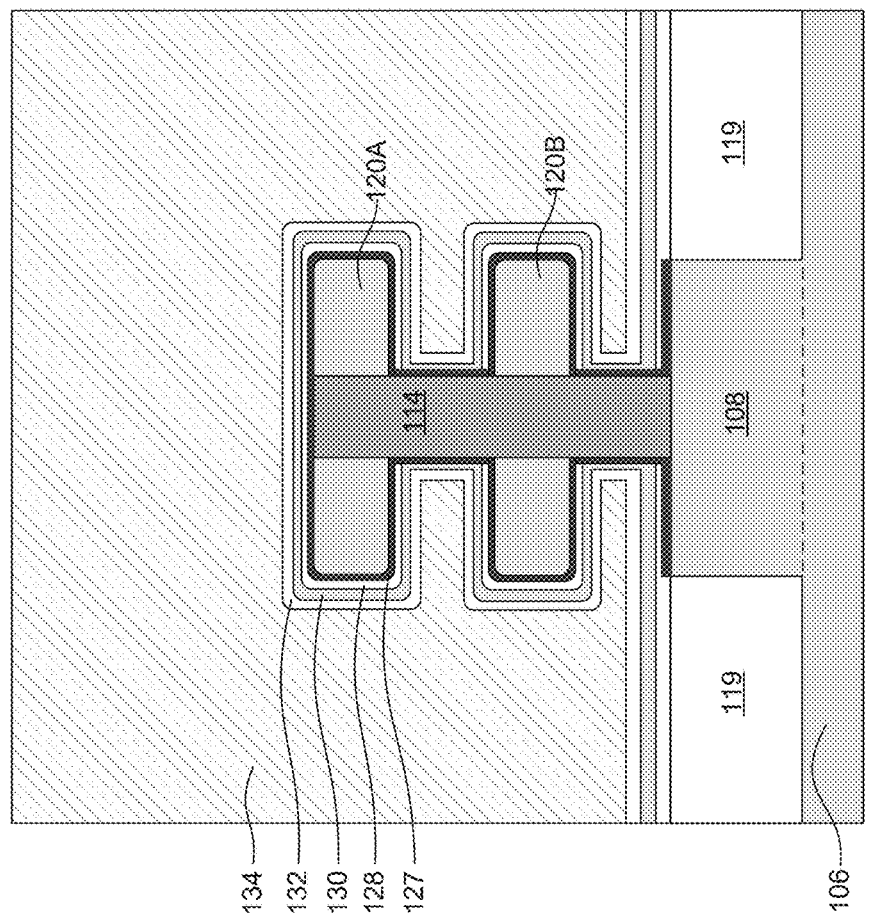

Referring to FIG. 2, in operation 230, a GAA structure is formed within the first and second gate openings. For example, as described with reference to FIGS. 16A-18B, GAA structure 112 is formed within first and second gate openings 812 and 1512. The formation of GAA structure 112 can include sequential operations of (i) forming IO layer 127 on the exposed regions of nanostructured layers 120A-120B, NVC region 114, and fin structure 108, as shown in FIGS. 16A-16B, (ii) depositing HK gate dielectric layer 128 on the structures of FIGS. 16A-16B, as shown in FIGS. 17A-17B, (iv) depositing NC gate dielectric layer 130 on HK gate dielectric layer 128, as shown in FIGS. 17A-17B, (v) depositing WFM layer 132 on NC gate dielectric layer 130, as shown in FIGS. 17A-17B, (vi) depositing gate metal fill layer 134 on WFM layer 132 to fill gate openings 812 and 1512, as shown in FIGS. 17A-17B, and (v) performing a CMP process on the structures of FIGS. 17A-17B to form the structures of FIGS. 18A-18B.

In some embodiments, IO layer 127 can be formed by exposing the structures of FIGS. 15A-15B to an oxidizing ambient. The oxidizing ambient can include a combination of ozone (O3), a mixture of ammonia hydroxide, hydrogen peroxide, and water, and/or a mixture of hydrochloric acid, hydrogen peroxide, and water. The deposition of HK gate dielectric layer 128 can include depositing an HK dielectric material with a thickness of about 1 nm to about 2 nm in an atomic layer deposition (ALD) process using hafnium chloride ($HfCl_4$) as a precursor at a temperature of about 250° C. to about 350° C. The deposition of NC gate dielectric layer 130 can include depositing an NC dielectric material with a thickness of about 1.5 nm to about 2.5 nm in an ALD process with a temperature ranging from about 180° C. to about 325° C. In some embodiments, NC gate dielectric layer 130 is about 1.5 times to about 2.5 times thicker than HK gate dielectric layer 128.

In some embodiments, the deposition of n-type WFM layer 132 can include depositing about 1 nm to about 3 nm thick Al-based metallic layer with an ALD or a chemical vapor deposition (CVD) process using a mixture of titanium tetrachloride ($TiCl_4$) and titanium ethylene aluminum (TEAl) or a mixture of tantalum chloride ($TaCl_5$) and trimethylaluminium (TMA) as precursors at a temperature ranging from about 350° C. to about 450° C. In some embodiments, the Al-based metallic layer can be deposited in an ALD process of about 4 cycles to about 12 cycles, where one cycle can include sequential periods of: (i) first precursor gas (e.g., $TiCl_4$ or $TaCl_5$) flow, (ii) a first gas purging process, (iii) a second precursor gas (e.g., TEAl or TMA) gas flow, and (iv) a second gas purging process.

In some embodiments, the deposition of p-type WFM layer 132 can include the deposition of Al-free metallic layer can include depositing about 1 nm to about 3 nm thick Al-free metallic layer with an ALD or a CVD process using $TiCl_4$ or a mixture of $WCl_5$ and $NH_3$ as precursors at a temperature ranging from about 400° C. to about 450° C. In some embodiments, Al-free metallic layer can be deposited in an ALD process of about 40 cycles to about 100 cycles, where one cycle can include sequential periods of: (i) first precursor gas (e.g., $TiCl_4$ or $WCl_5$) flow, (ii) a first gas purging process, (iii) a second precursor gas (e.g., $NH_3$) gas flow, and (iv) a second gas purging process.

In some embodiments, the deposition of gate metal fill layer 134 can include depositing a fluorine-free metal layer with an ALD process using $WCl_5$ or a mixture of $WCl_6$ and $H_2$ as precursors at a temperature ranging from about 400° C. to about 500° C. In some embodiments, the fluorine-free metal layer can be deposited in an ALD process of about 160 cycles to about 320 cycles, where one cycle can include sequential periods of: (i) first precursor gas (e.g., $WCl_5$ or $WCl_6$) flow, (ii) a first gas purging process, (iii) a second precursor gas (e.g., $H_2$) gas flow, and (iv) a second gas purging process. Other methods of depositing HK gate dielectric layer 128, NC gate dielectric layer 130, WFM layer 132, and gate metal fill layer 134 are within the scope of the present disclosure.

Figure 18A:
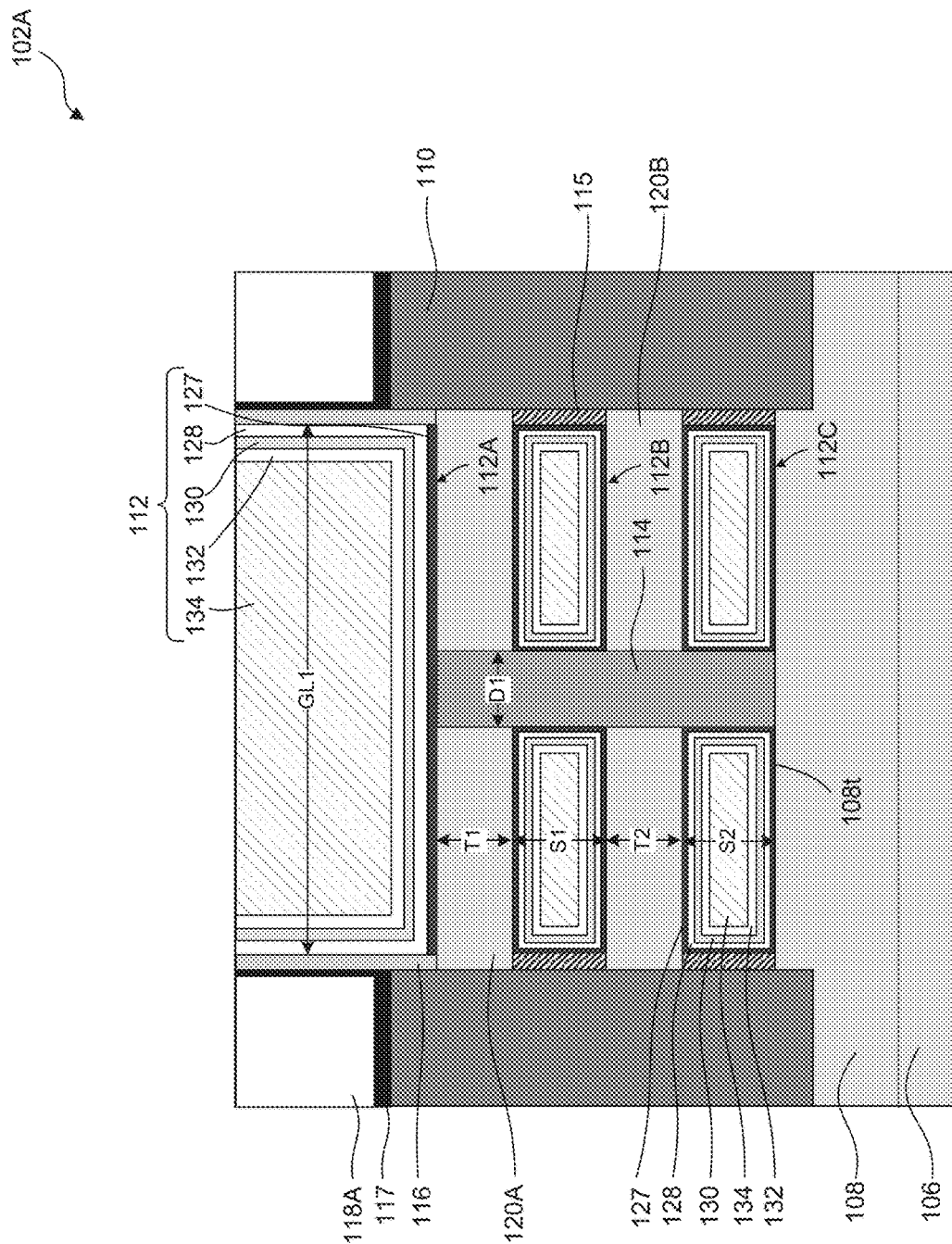
Figure 18B:
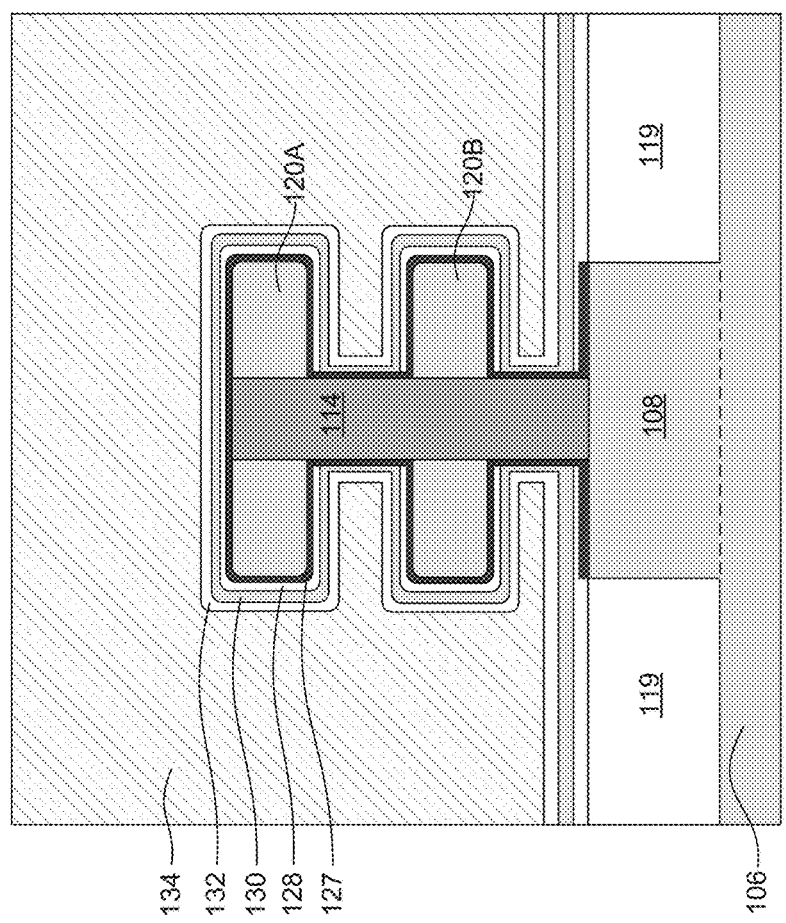

The CMP process after the formation of gate metal fill layer 134 can substantially coplanarize top surfaces of HK gate dielectric layer 128, NC gate dielectric layer 130, WFM layer 132, and gate metal fill layer 134 with top surface of ILD layer 118A, as shown in FIGS. 18A-18B.

Figure 19A:
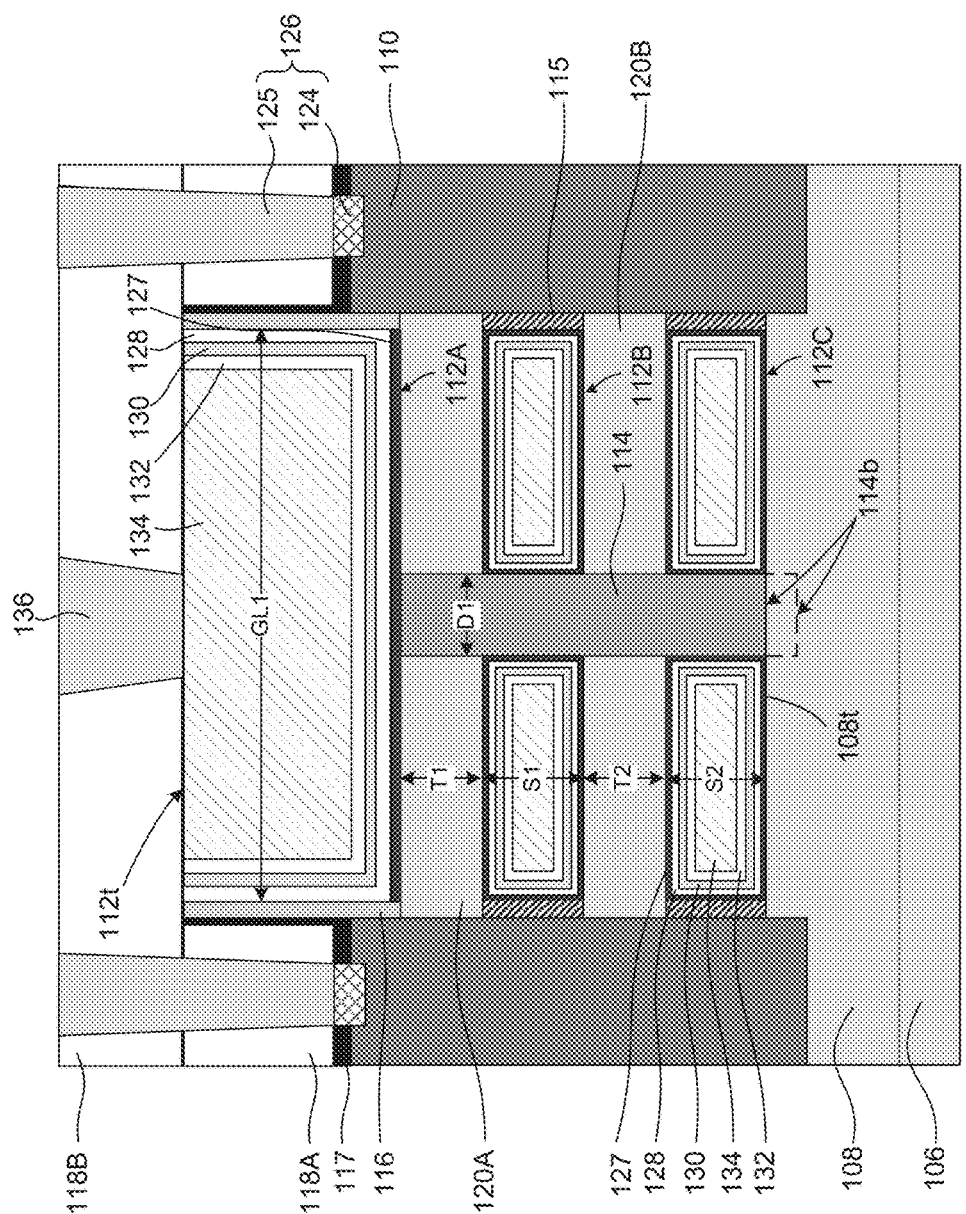
Figure 19B:
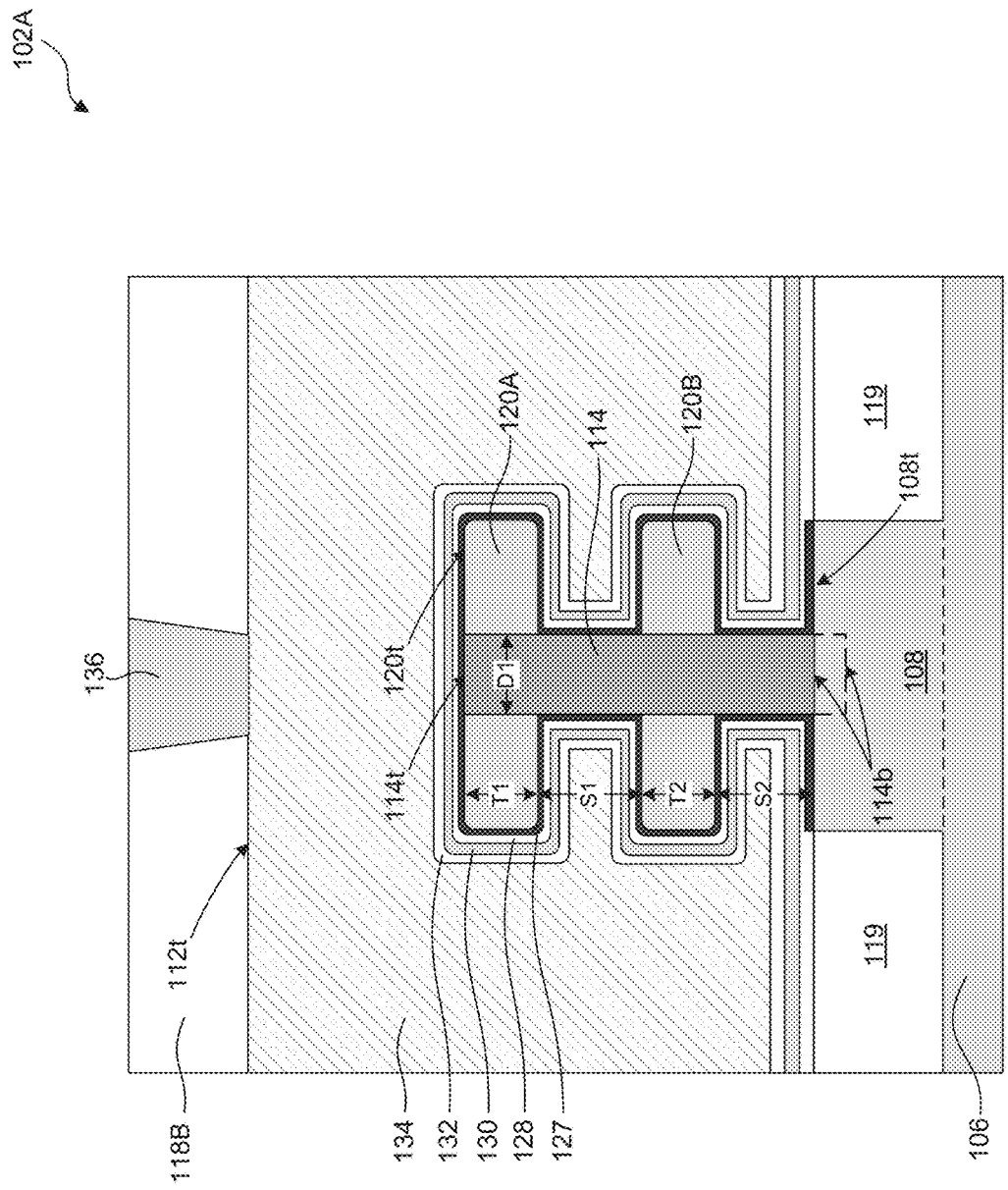

Referring to FIG. 2, in operation 235, contact structures are formed on the S/D regions and GAA structure. For example, as shown in FIGS. 19A-19B, S/D contact structures 126 are formed on S/D regions 110 and GAA contact structure 136 is formed on GAA structure 112. The formation of S/D contact structures 126 can include sequential operations of (i) depositing ILD layer 118B on the structures of FIGS. 18A-18B, (ii) forming S/D contact openings (not shown) within ILD layers 118A-118B and ESL 117, (iii) forming silicide layers 124 within the S/D contact openings, as shown in FIG. 19A, (iv) depositing contact plugs 125 on silicide layers 124 to fill the S/D contact openings, as shown in FIG. 19A, (v) performing a CMP process on the deposited contact plugs 125 to substantially coplanarize top surfaces of contact plugs 125 with top surface of ILD layer 118B, as shown in FIG. 17A, (vi) forming a GAA contact opening (not shown) within ILD layer 118B, (vii) depositing a conductive material to fill the GAA contact opening, and (viii) performing a CMP process on the deposited conductive material to substantially coplanarize top surface of GAA contact structure 136 with top surface of contact plugs 125 and top surface of ILD layer 118B, as shown in FIGS. 19A-19B.

Figure 20:
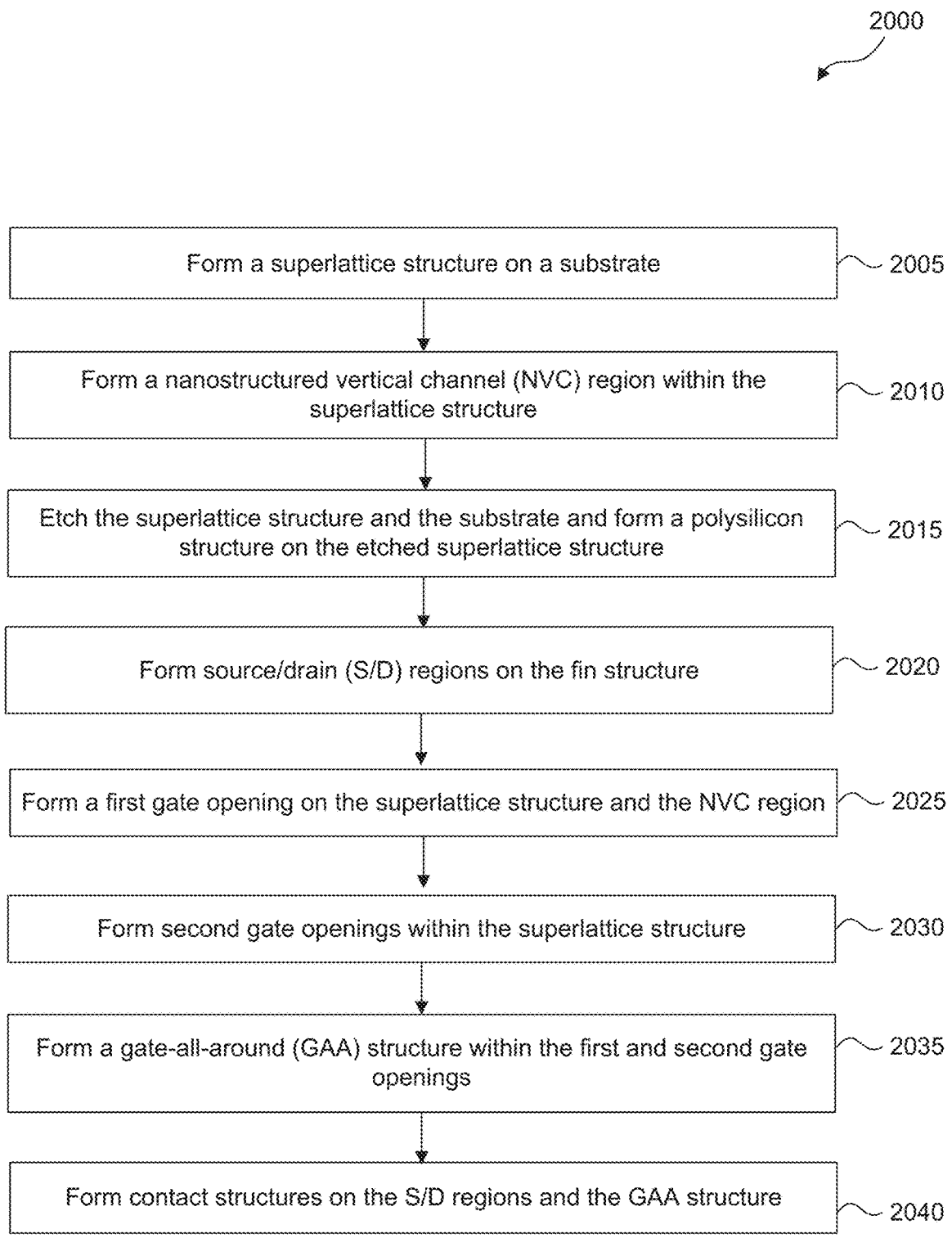
FIG. 20 is a flow diagram of a method for fabricating a semiconductor device with nanostructured vertical and horizontal channel regions, in accordance with some embodiments.

FIG. 20 is a flow diagram of an example method 2000 for fabricating FET 102A of semiconductor device 100, according to some embodiments. For illustrative purposes, the operations illustrated in FIG. 20 will be described with reference to the example fabrication process for fabricating FET 102A as illustrated in FIGS. 21A-30B and 15A-19B. FIGS. 21A-30B and 15A-19B are cross-sectional views of FET 102A along lines A-A and B-B of semiconductor device 100 at various stages of fabrication, according to some embodiments. Operations can be performed in a different order or not performed depending on specific applications.

It should be noted that method 200 may not produce a complete FET 102A. Accordingly, it is understood that additional processes can be provided before, during, and after method 200, and that some other processes may only be briefly described herein. Elements in FIGS. 21A-30B and 15A-19B with the same annotations as elements in FIGS. 1A-1L are described above.

Figure 21A:
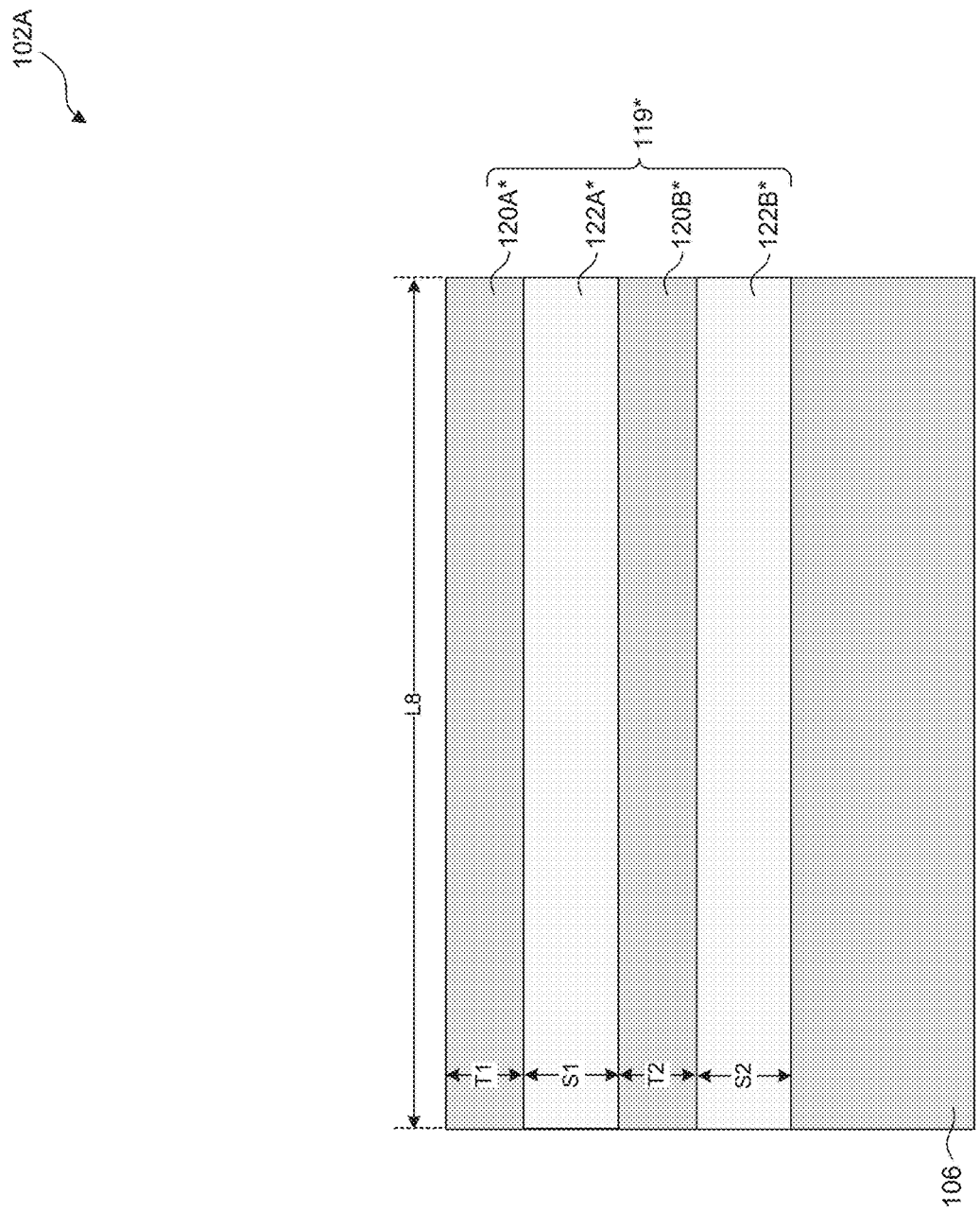
FIGS. 21A-30B illustrate cross-sectional views of a semiconductor device with nanostructured vertical and horizontal channel regions at various stages of its fabrication process, in accordance with some embodiments.
Figure 21B:
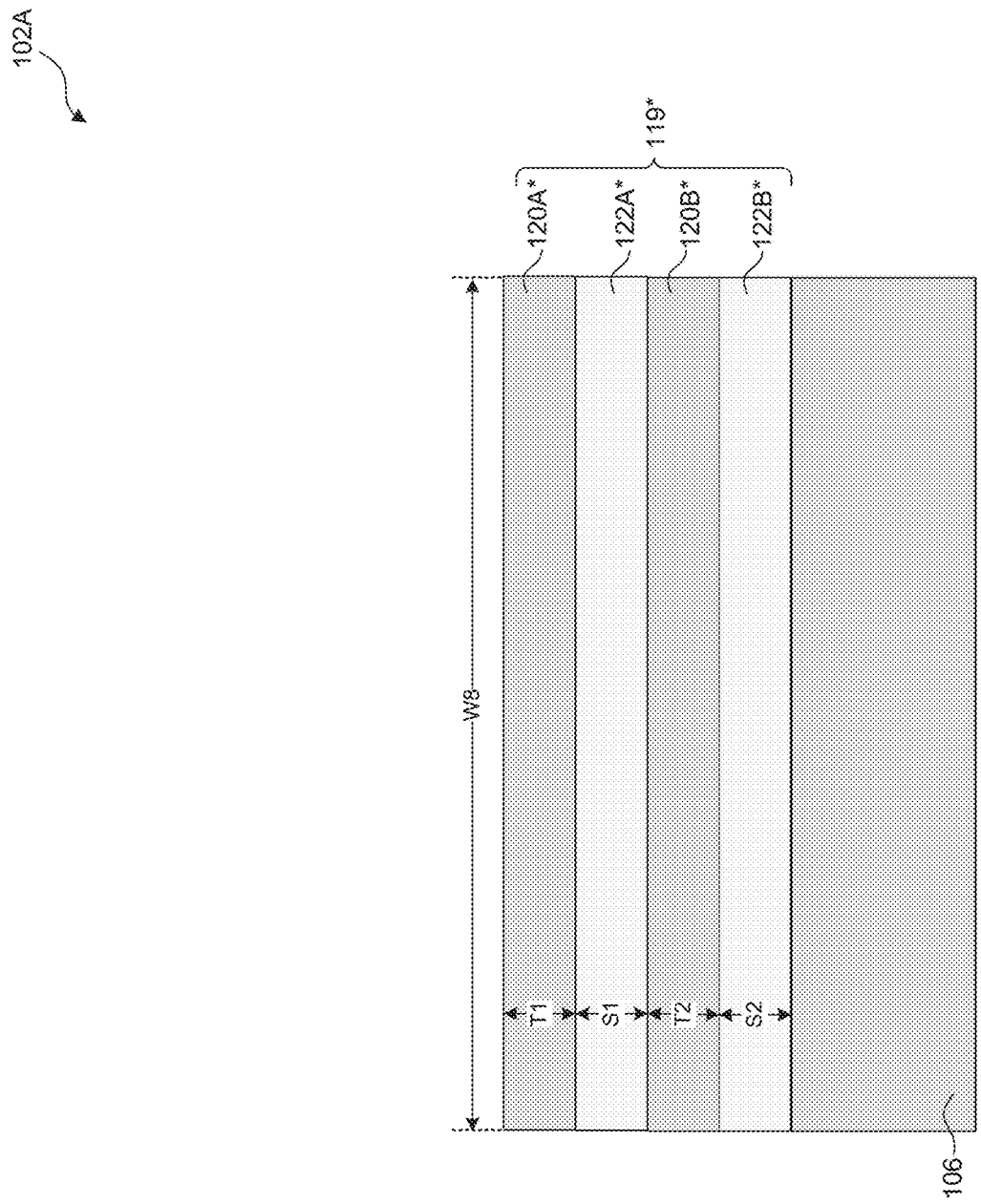

In operation 2005, a superlattice structure is formed on a substrate. For example, as shown in FIGS. 21A-21B, a superlattice structure 119* is epitaxially formed on substrate 106. Superlattice structure 119* can include nanostructured layers 120A*-120B* and 122A*-122B* with lengths L8 and widths W8 arranged in an alternating configuration. In some embodiments, nanostructured layers 120A*-120B* can include Si without any substantial amount of Ge (e.g., with no Ge) and nanostructured layers 122A*-122B* can include SiGe. In some embodiments, a ratio of L8:W8 can range from about 1:2 to about 1:4.

Figure 22A:
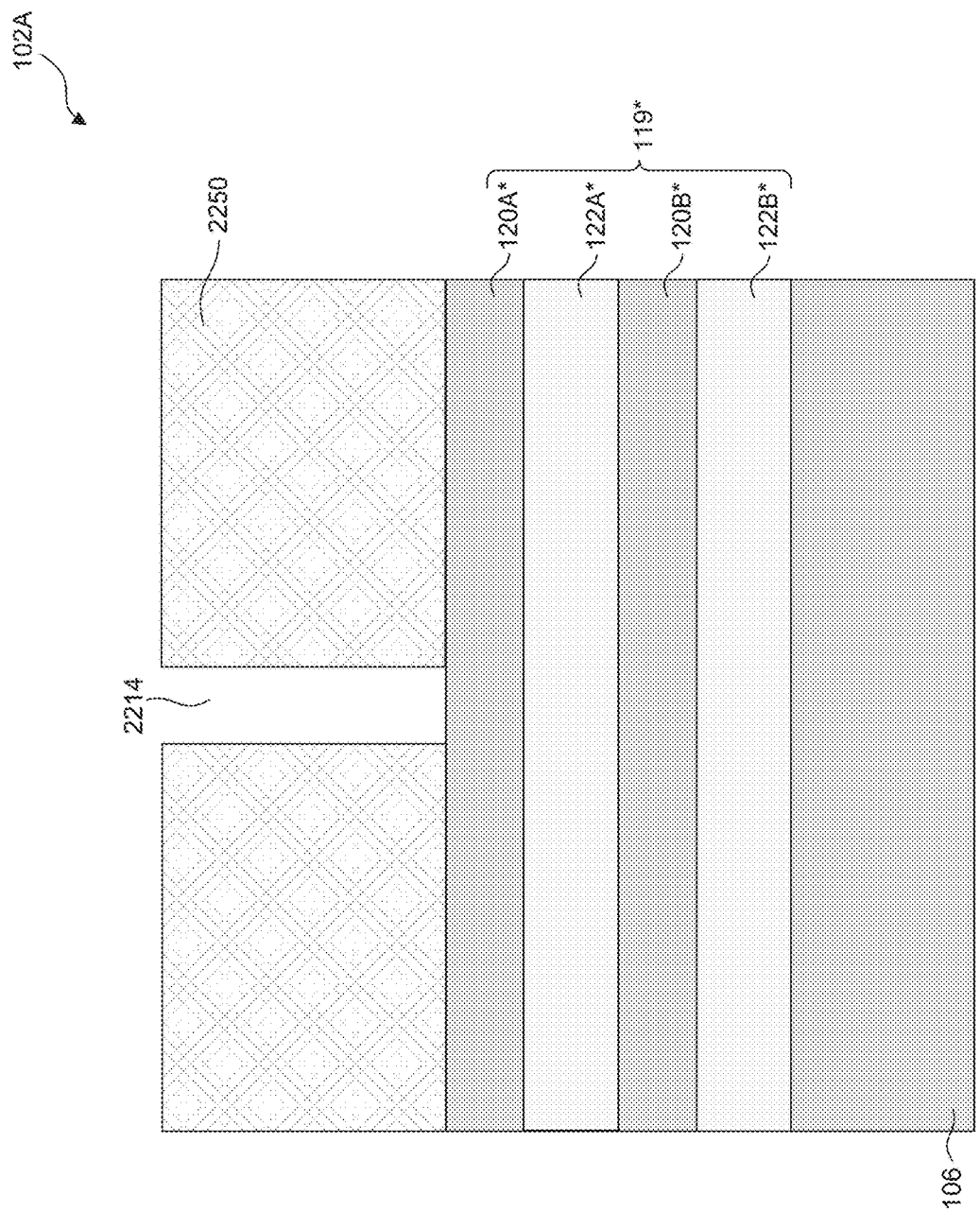
Figure 22B:
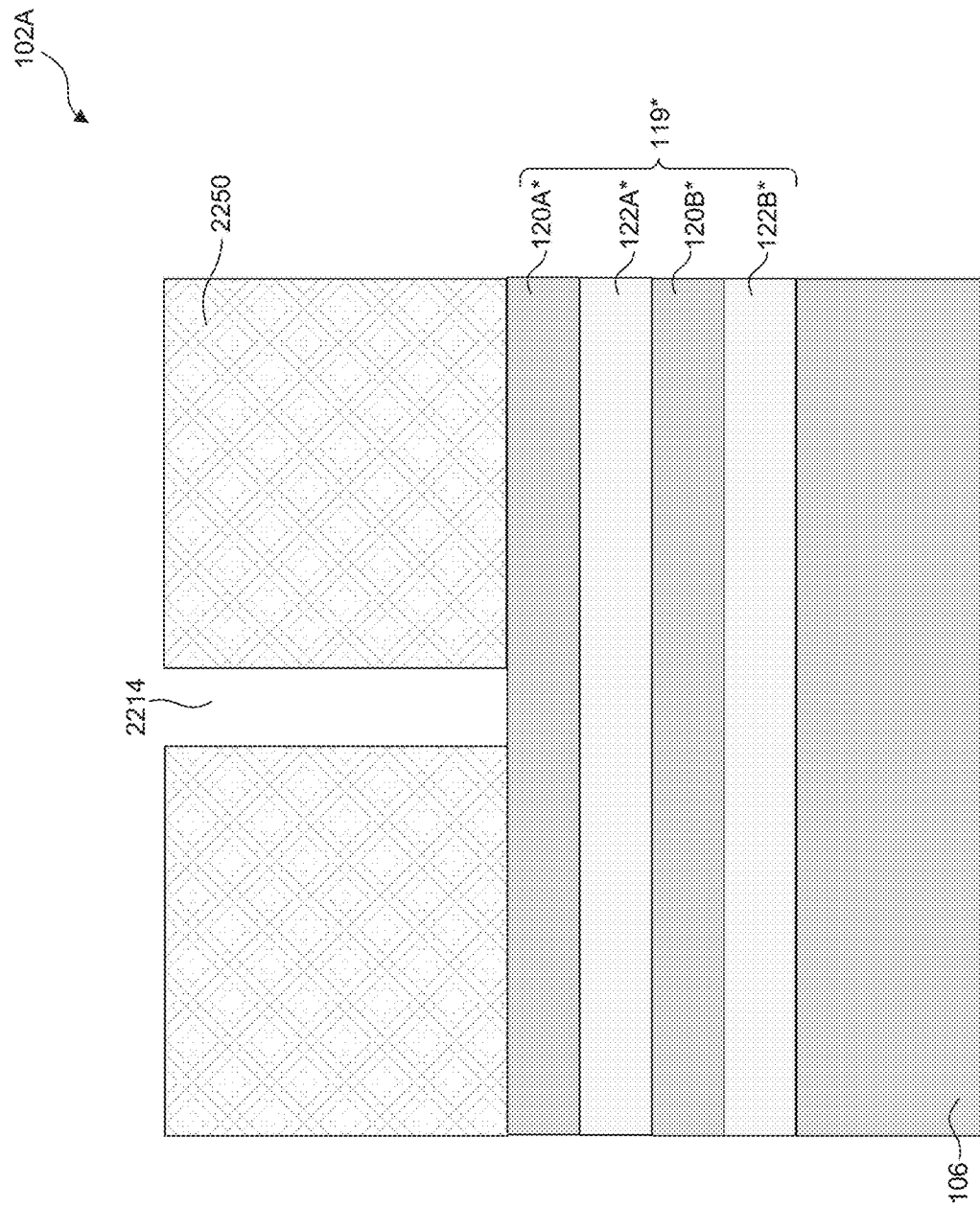
Figure 23A:
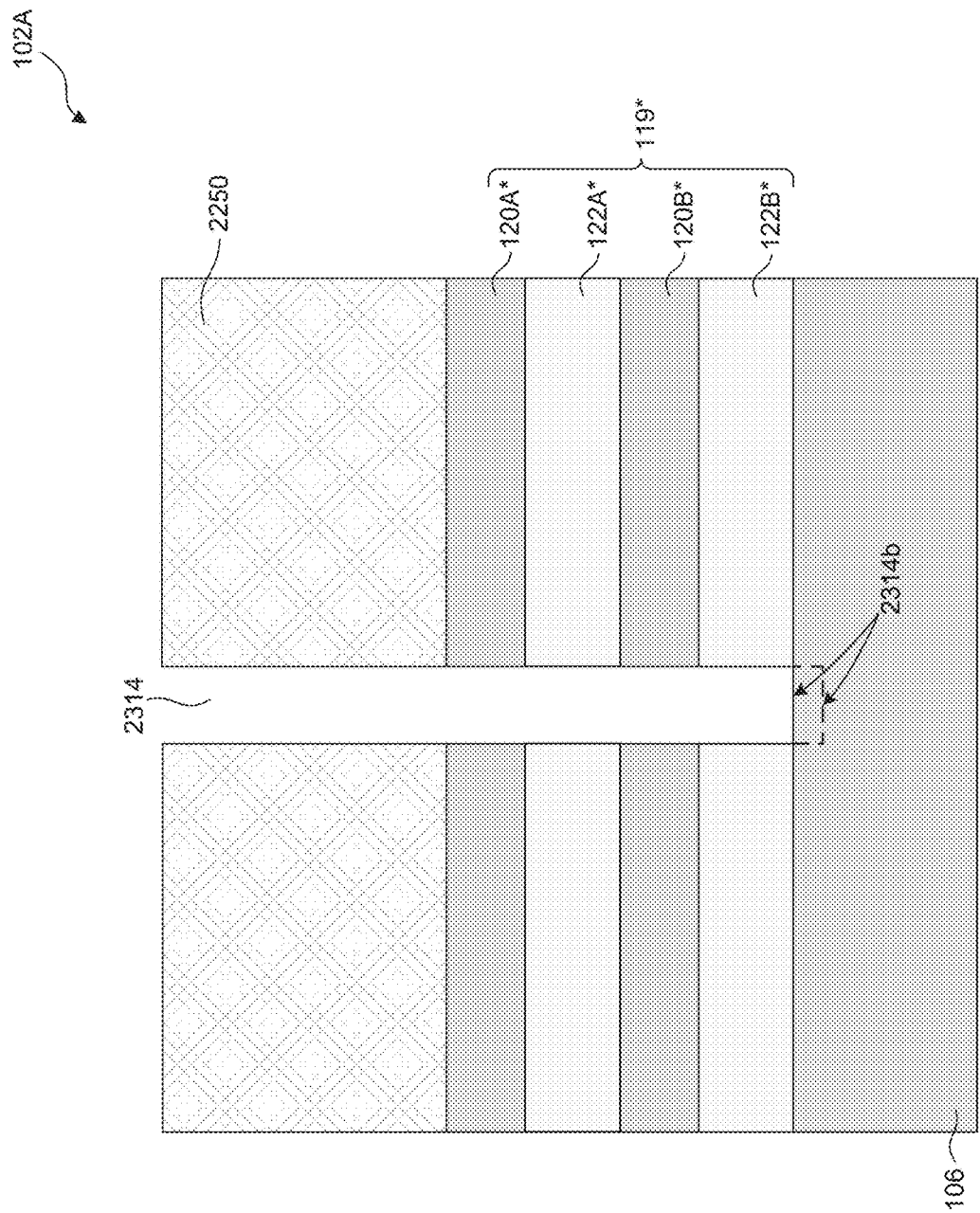
Figure 23B:
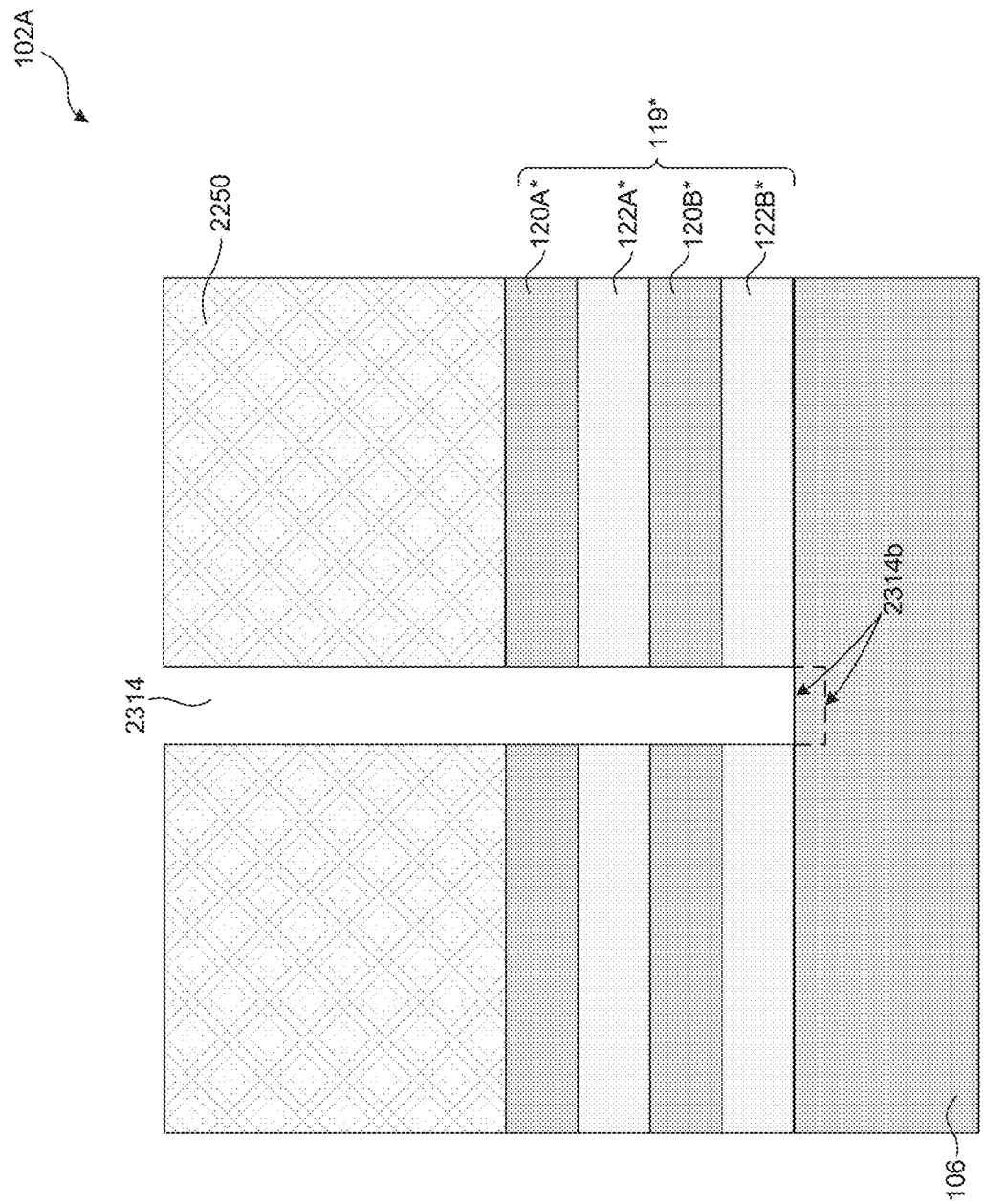
Figure 24A:
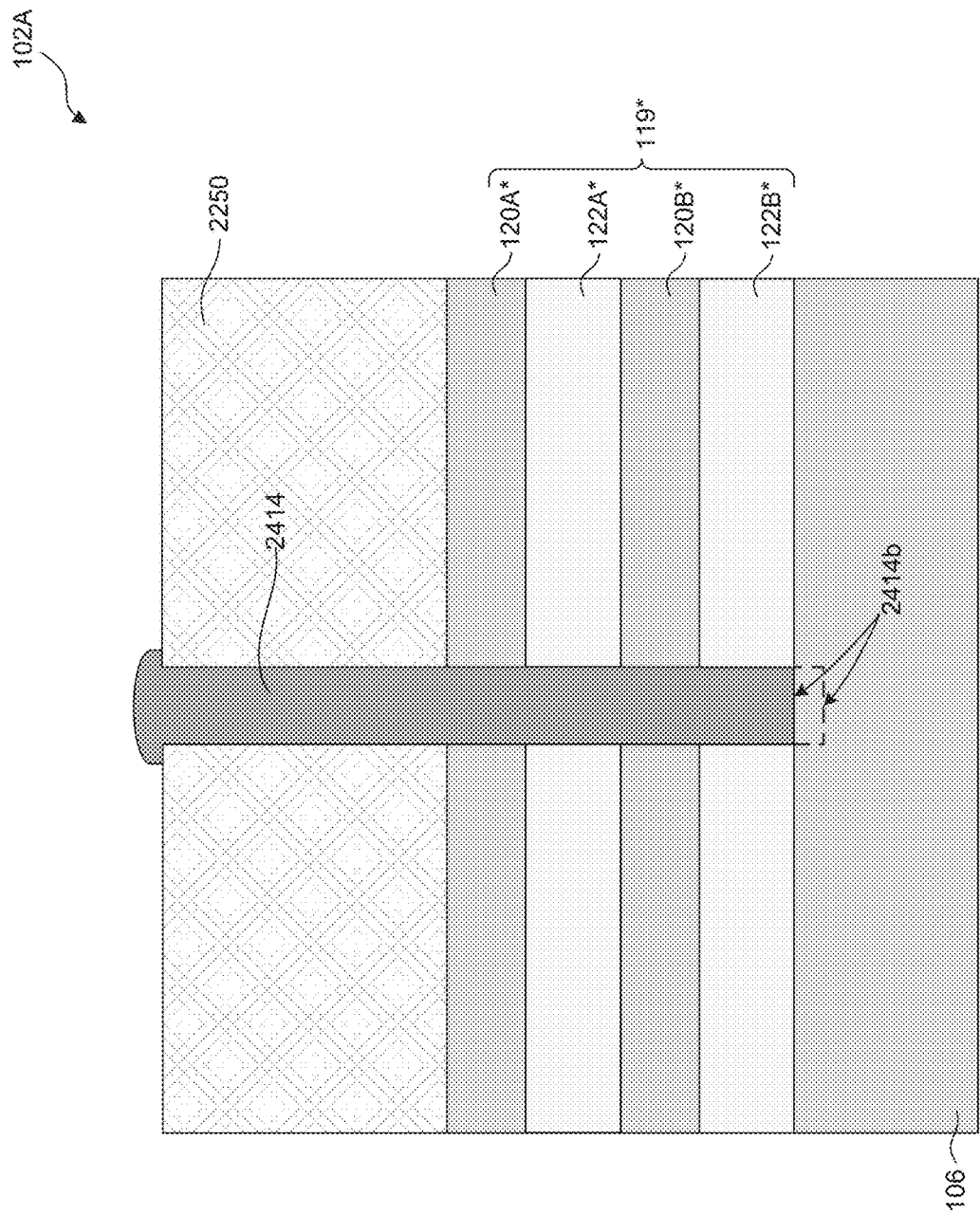
Figure 24B:
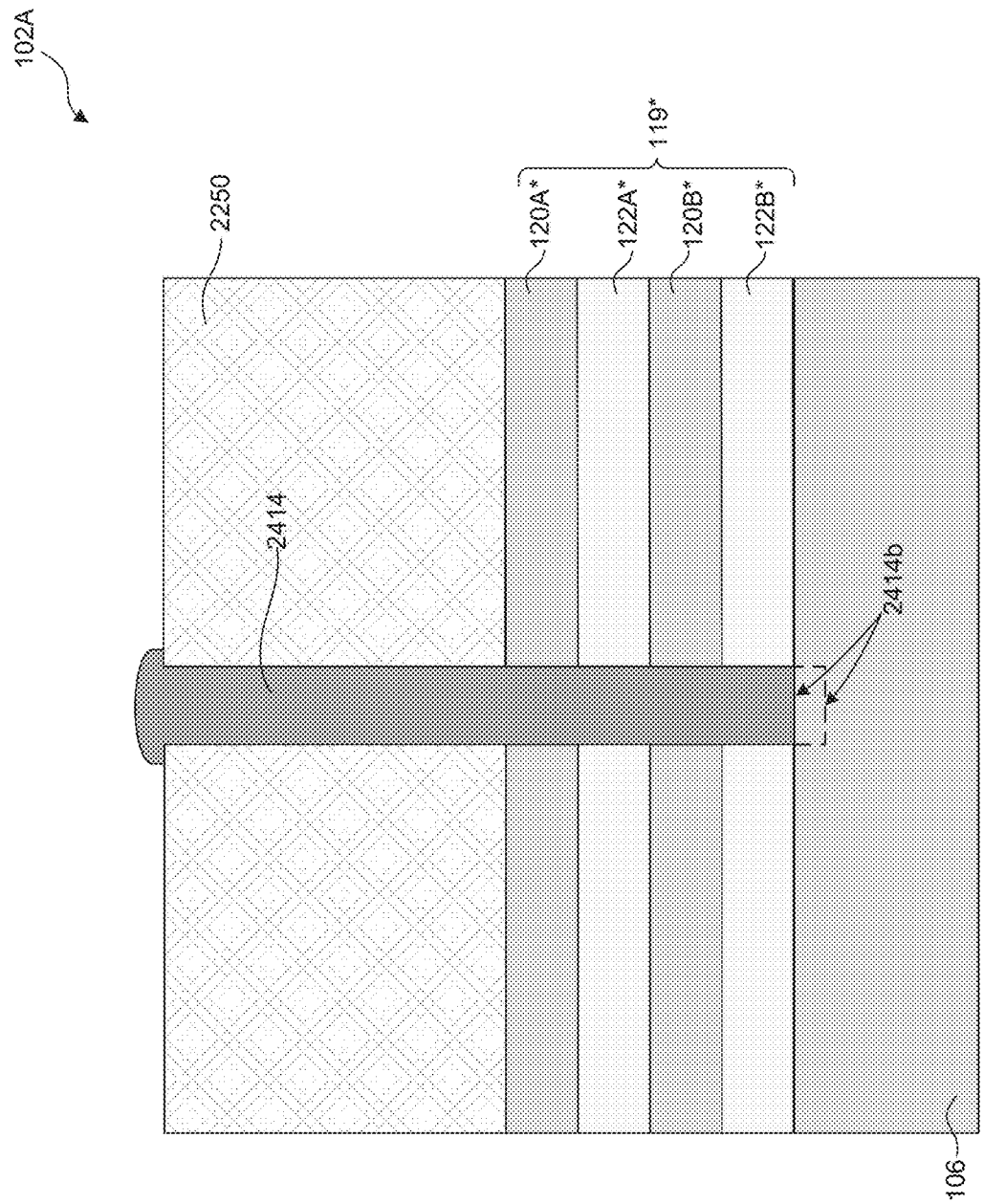
Figure 25A:
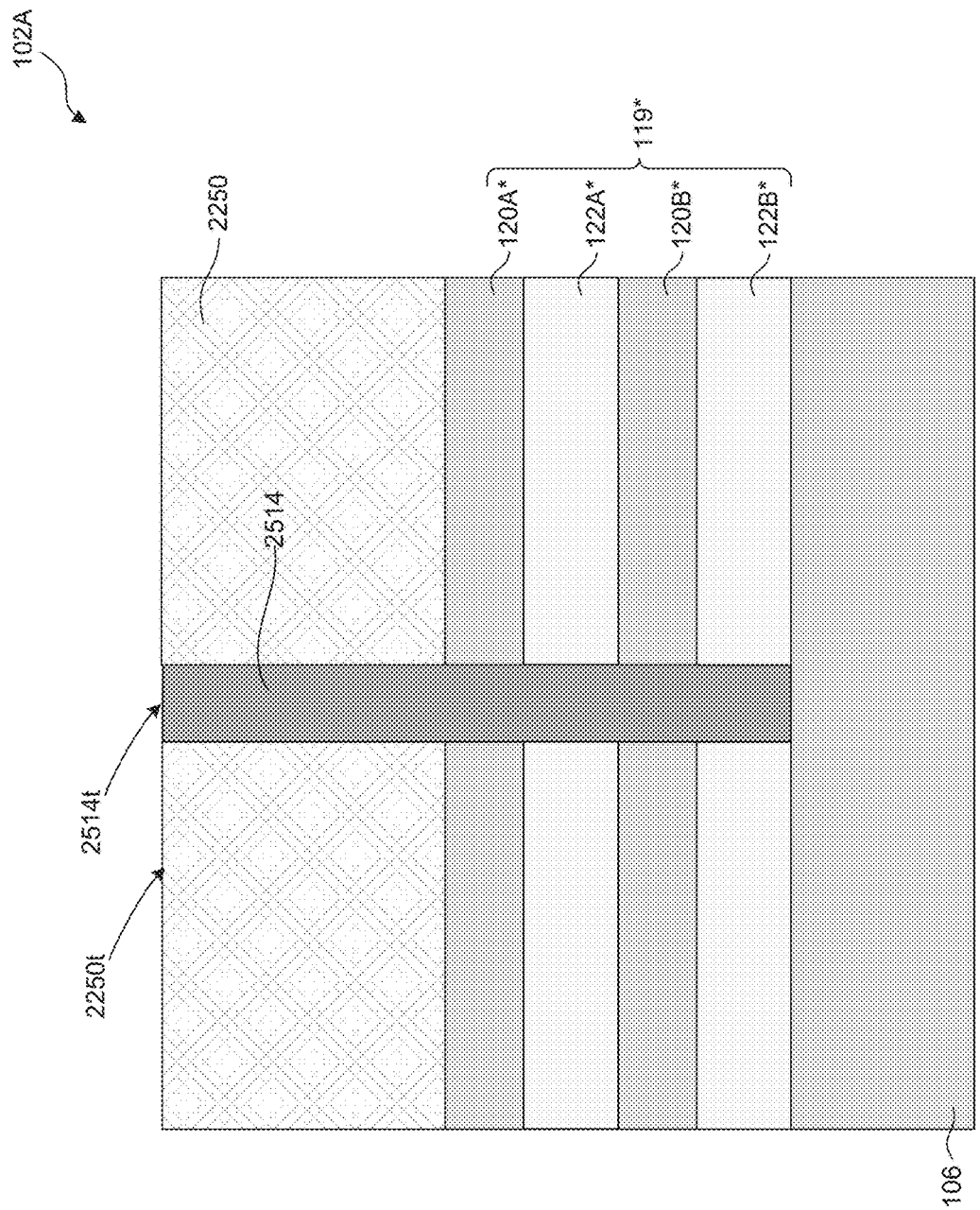
Figure 25B:
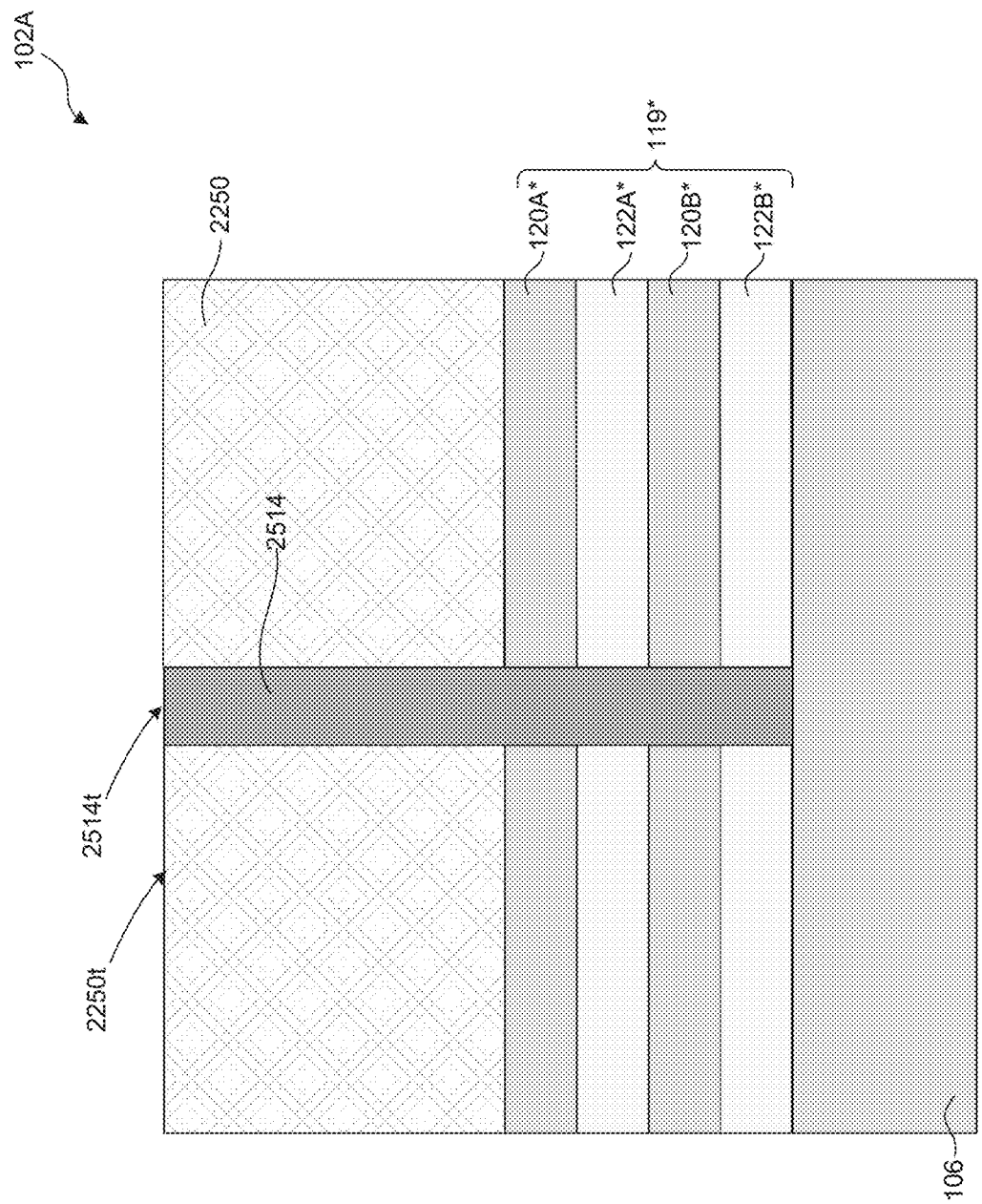

Referring to FIG. 20, in operation 2010, a nanostructured vertical channel (NVC) region is formed with the superlattice structure. For example, as described with reference to FIGS. 22A-26B, NVC region 114 is formed within superlattice structure 119*. The formation of NVC region 114 within superlattice structure 119* can include sequential operations of (i) forming a patterned masking layer 2250 (e.g., a photoresist layer or a nitride layer) with an openings 2214 on the structures of FIGS. 21A-21B, as shown in FIGS. 22A-22B, (ii) etching nanostructured layers 120A*-120B* and 122A*-122B* through opening 2214 to form an opening 2314 through superlattice structure 119* and on substrate 106, as shown in FIGS. 23A-23B, (iii) depositing or epitaxially growing a nanostructured layer 2414 within opening 2314, as shown in FIGS. 24A-24B, (iv) performing a chemical mechanical polishing (CMP) process on the structures of FIGS. 24A-24B to form a polished nanostructured layer 2514, as shown in FIGS. 25A-25B, (v) etching polished nanostructured layer 2514 to form the structures of FIGS. 26A-26B, and (vi) removing patterned masking layer 2250 from the structures of FIGS. 26A-26B to form the structures of FIGS. 27A-27B.

Figure 26A:
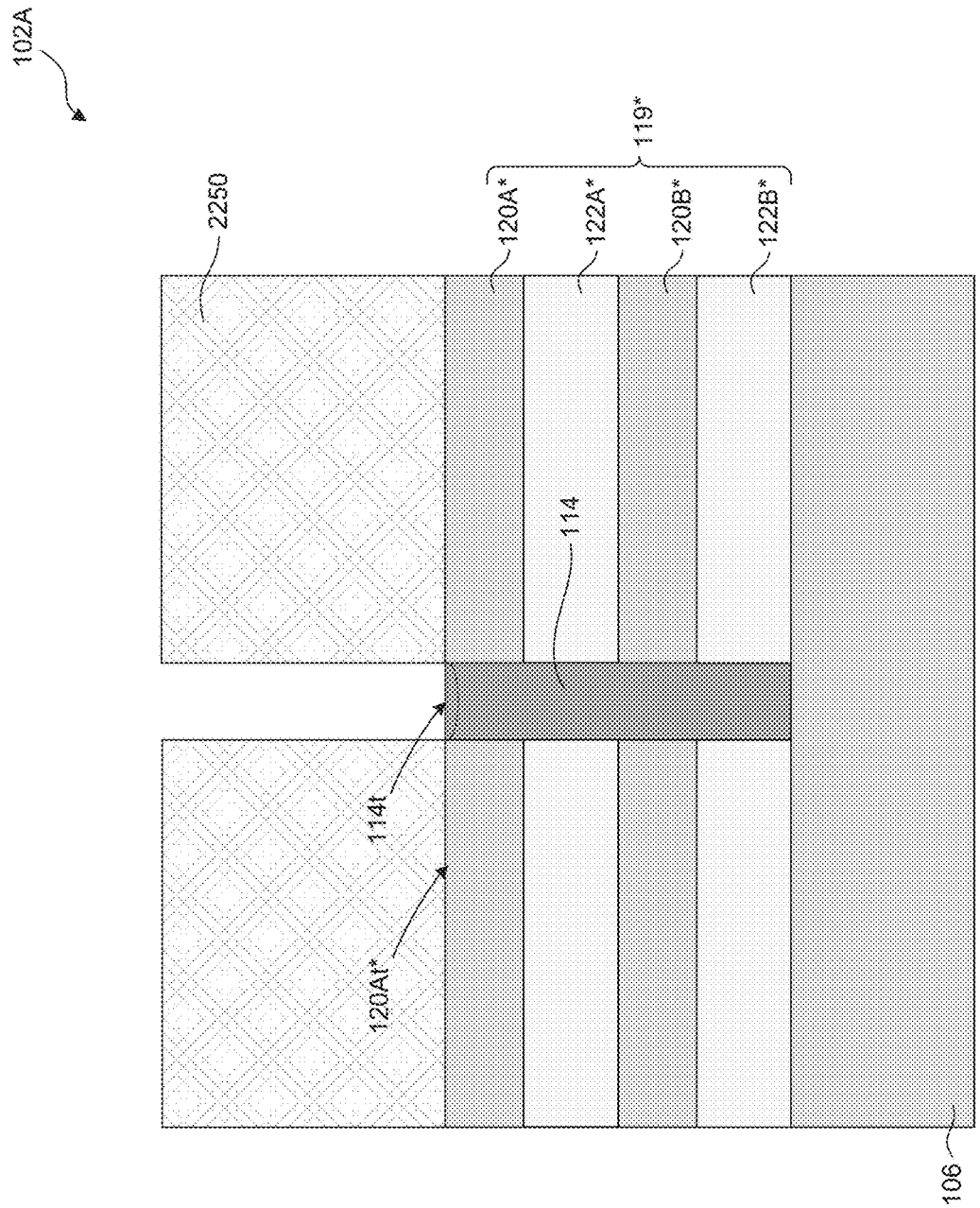
Figure 26B:
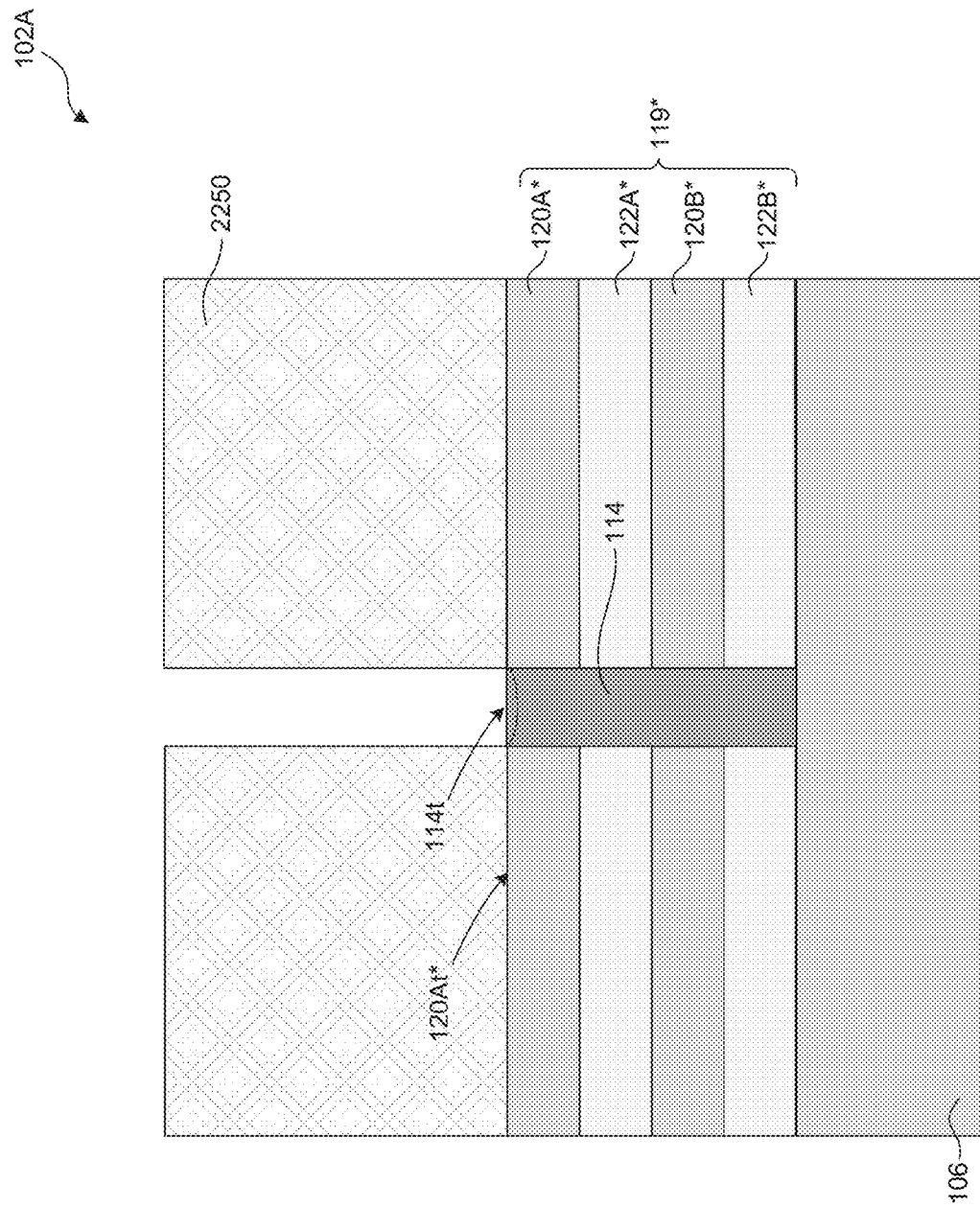
Figure 27A:
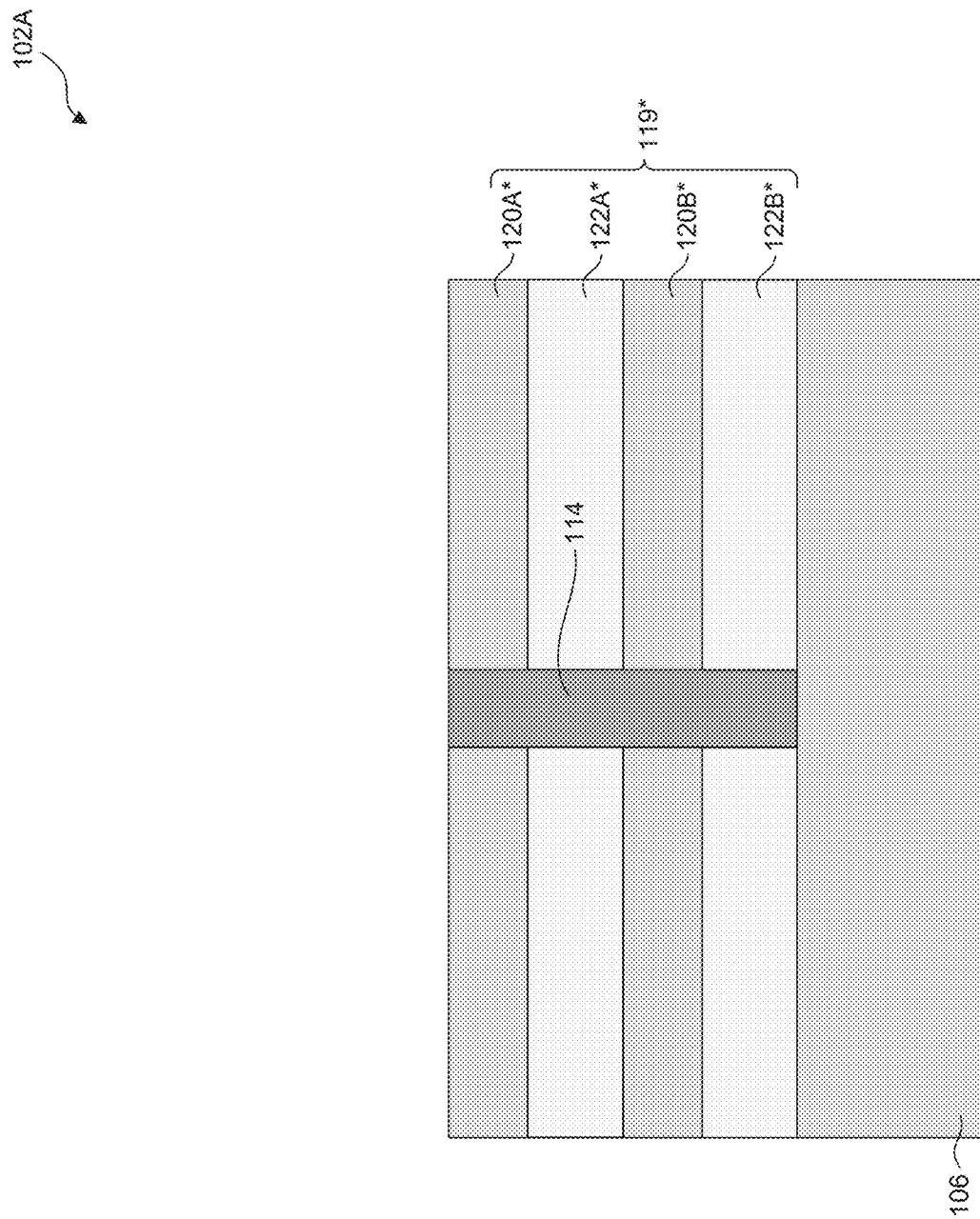
Figure 27B:
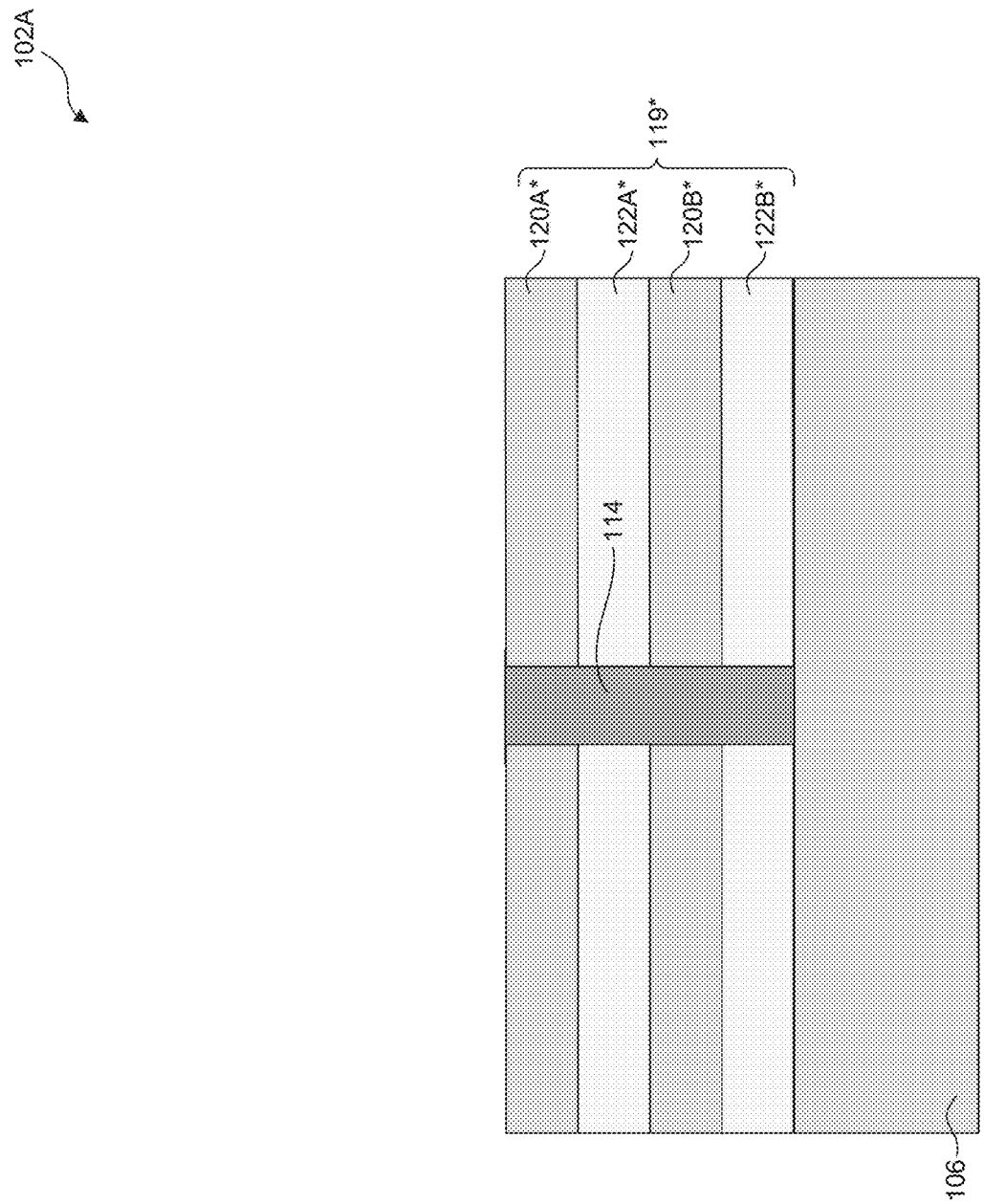

The etching of nanostructured layers 120A*-120B* and 122A*-122B* can be similar to the etching of nanostructured layers 120A-120B and 122A-122B described in operation 220 of method 200. In some embodiments, a portion of substrate 106 can be etched after the etching of nanostructured layers 120A*-120B* and 122A*-122B* to extend opening 2314 into substrate 106 by a distance D2, as shown in FIGS. 23A-23B. The deposition or epitaxial growth of nanostructured layer 2414 can include epitaxially growing a layer of Si, SiAs, SiP, SiC, SiCP, SiGe, SiGeB, GeB, SiGeSnB, a III-V semiconductor compound, or other suitable semiconductor materials. In some embodiments, a doping process (not shown) with n- or p-type dopants can be performed on the structures of FIGS. 24A-24B to dope nanostructured layer 2414. The CMP process can substantially coplanarize a top surface 2514t of polished nanostructured layer 2514 with a top surface 2250t of masking layer, as shown in FIGS. 25A-25B. The etching of polished nanostructured layer 2514 can substantially coplanarize top surface 114t of NVC region 114 with a top surface 120At* of nanostructured layer 120A*, as shown in FIGS. 26A-26B. In some embodiments, top surface 114t of NVC region 114 can be non-coplanar with top surface 120At* and can have a curved profile, as shown with dotted lines in FIGS. 26A-26B.

Figure 28A:
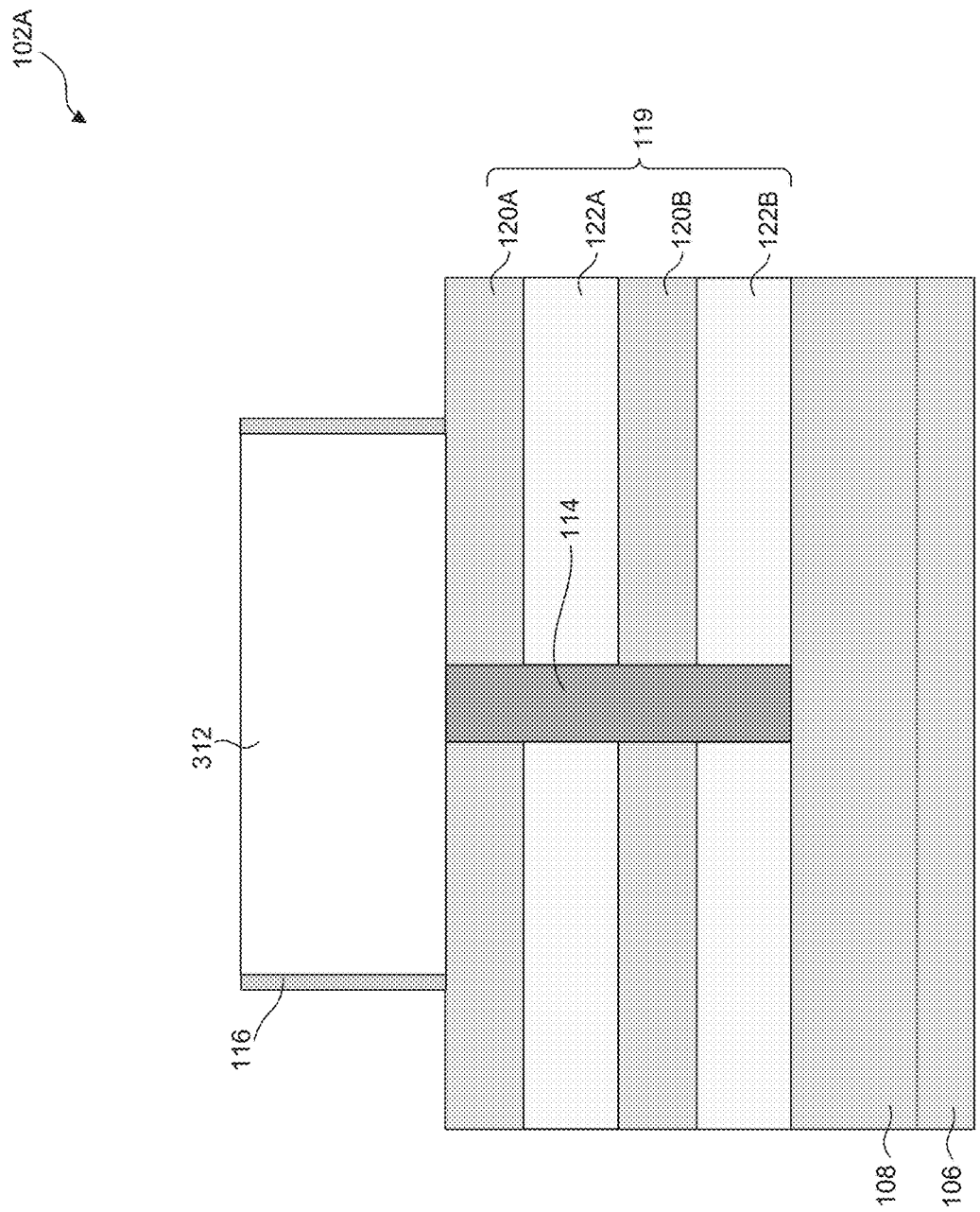
Figure 28B:
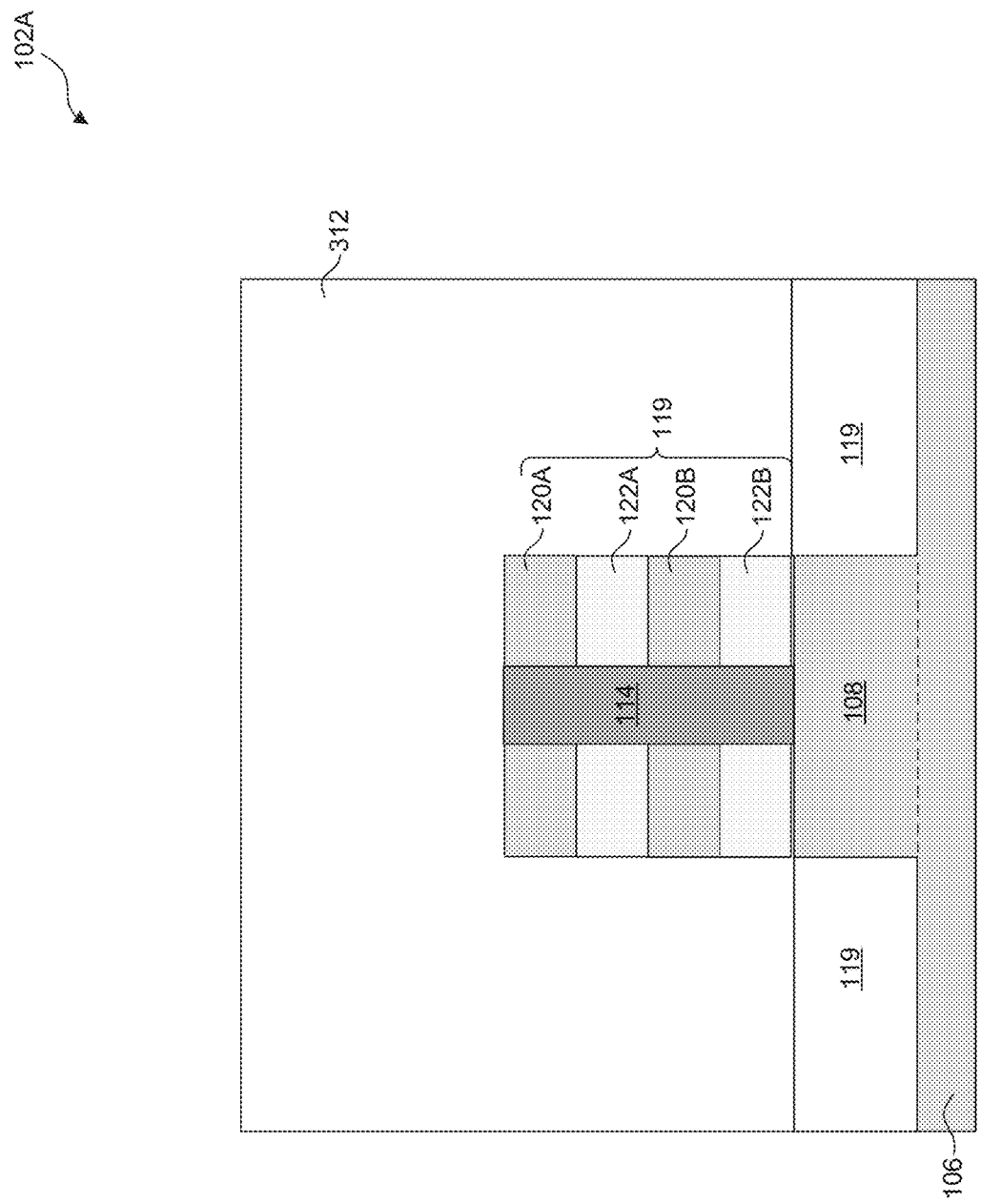

Referring to FIG. 20, in operation 2015, the superlattice structure and the substrate is etched and a polysilicon is formed on the etched superlattice structure. For example, as shown in FIGS. 28A-28B, superlattice structure 119 is formed after etching superlattice structure 119*, fin structure 108 underlying superlattice structure 119 is formed after etching a portion of substrate 106 that is not covered by superlattice structure 119, and a polysilicon structure 312 is formed on superlattice structure 119. During subsequent processing, polysilicon structure 312 and nanostructured layers 122A-122B can be replaced in a gate replacement process to form GAA structure 112.

Figure 29A:
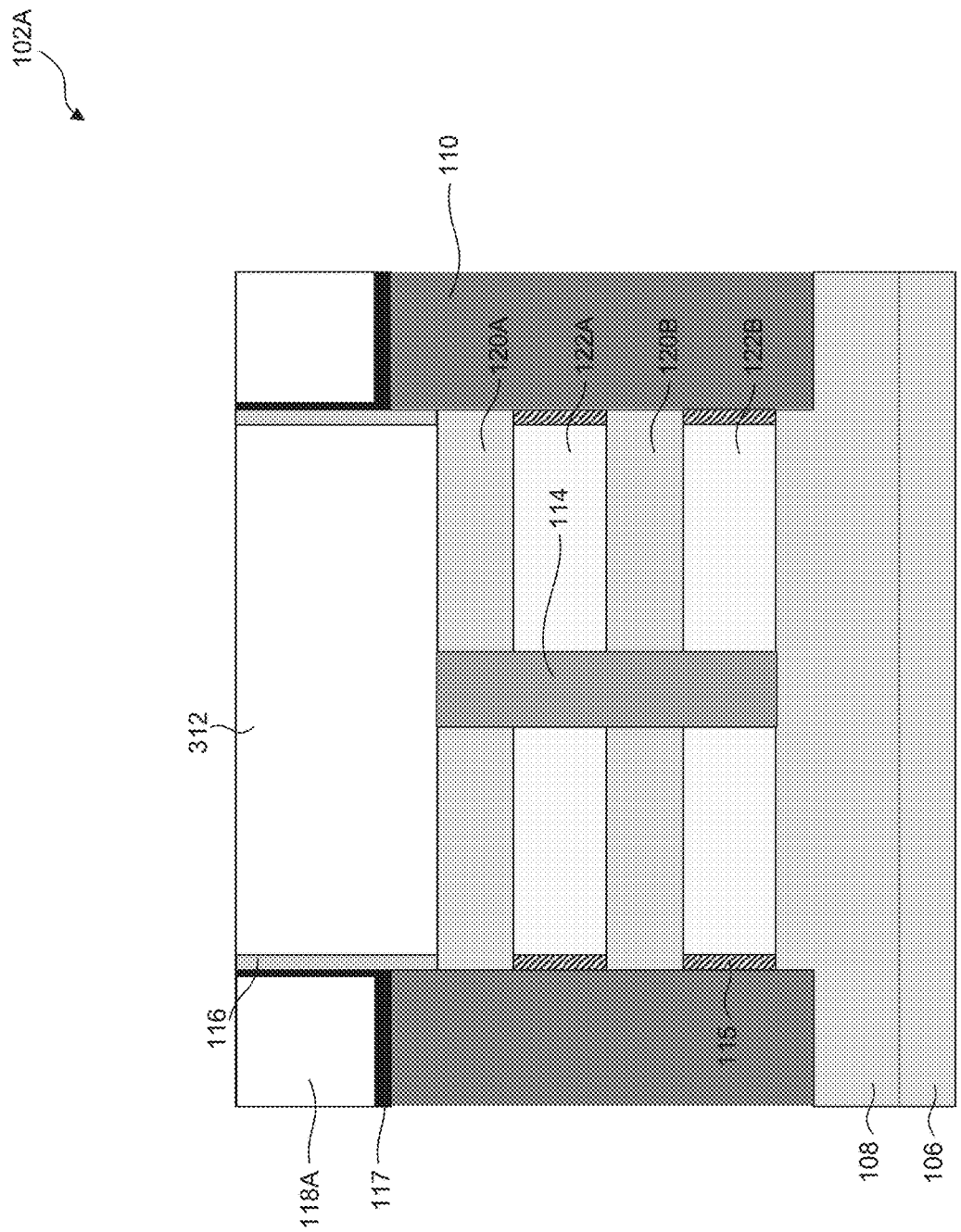
Figure 29B:
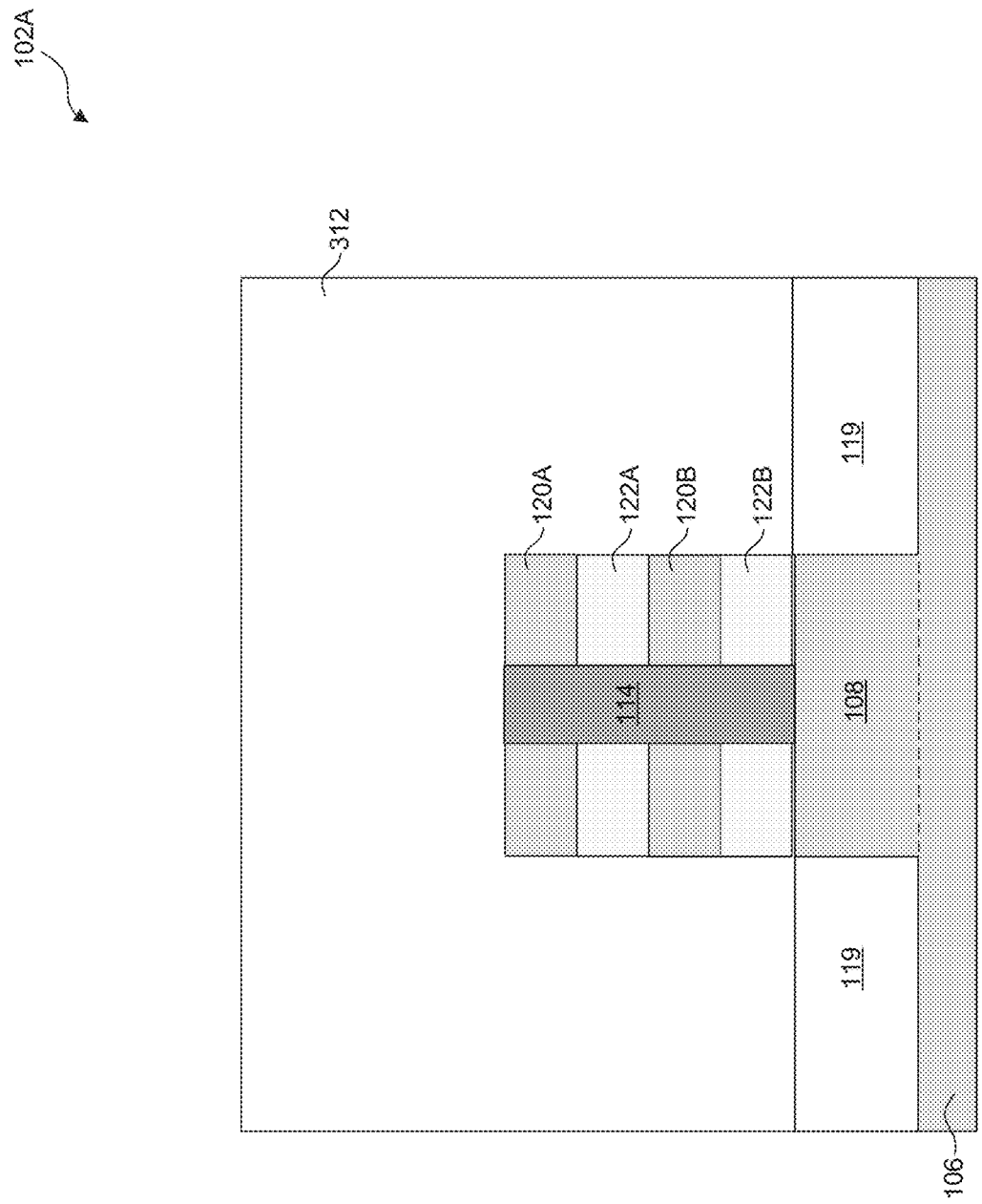

Referring to FIG. 20, in operation 2020, S/D regions are formed on the fin structure. For example, as described with reference to FIGS. 29A-30B, S/D regions 110 are formed on fin structure 108. The formation of S/D regions 110 can include sequential operations of (i) forming S/D openings similar to S/D openings 410 described in operation 210 of method 200, and (ii) epitaxially growing n-type or p-type semiconductor materials within the S/D openings, as shown in FIG. 29A. After the formation of S/D regions 110, ESL 117 and ILD layer 118A can be formed on S/D regions 110 to form the structure of FIG. 29A. In some embodiments, inner spacers 115 can be formed between operations (i) and (ii) of the formation process of epitaxial S/D regions 110, as shown in FIG. 29A.

Figure 30A:
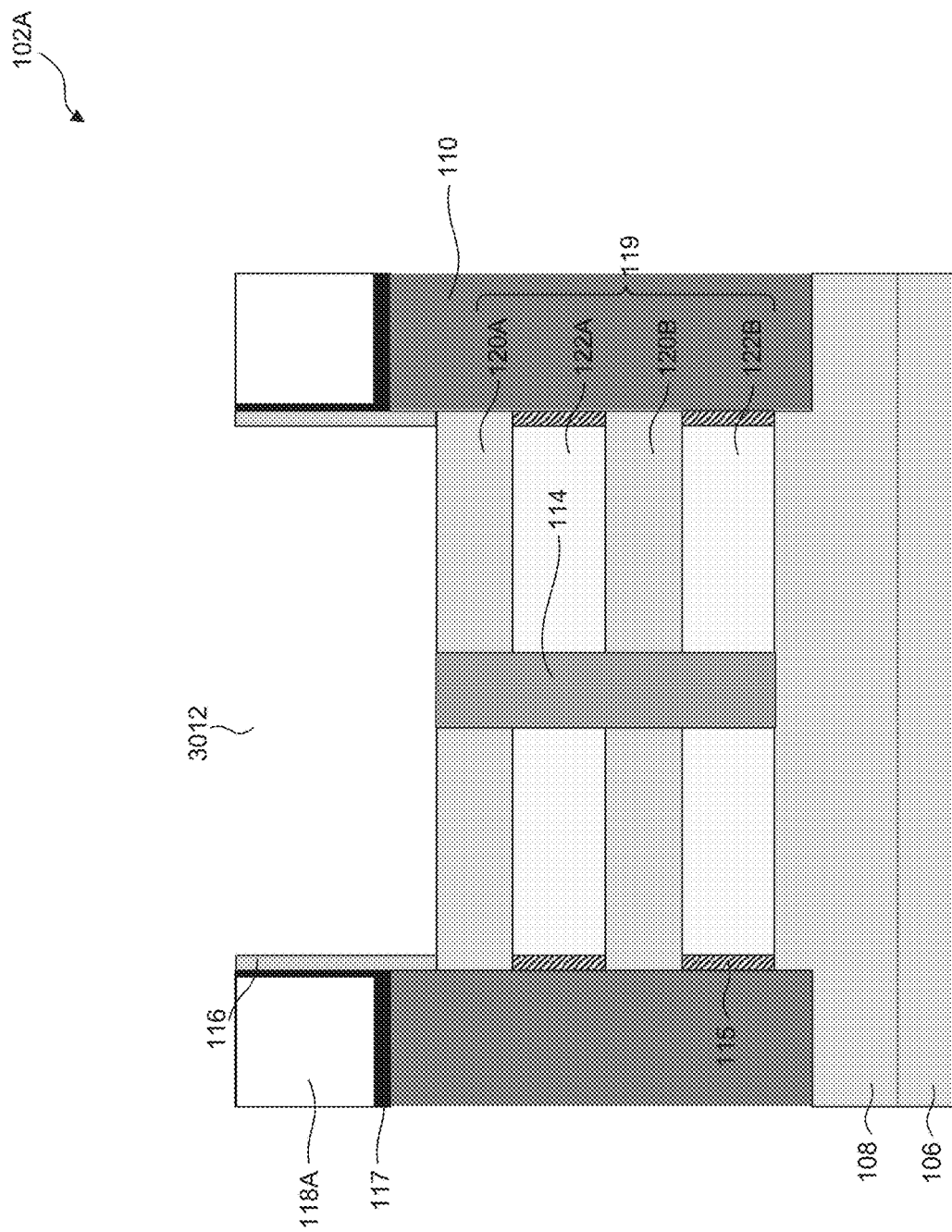
Figure 30B:
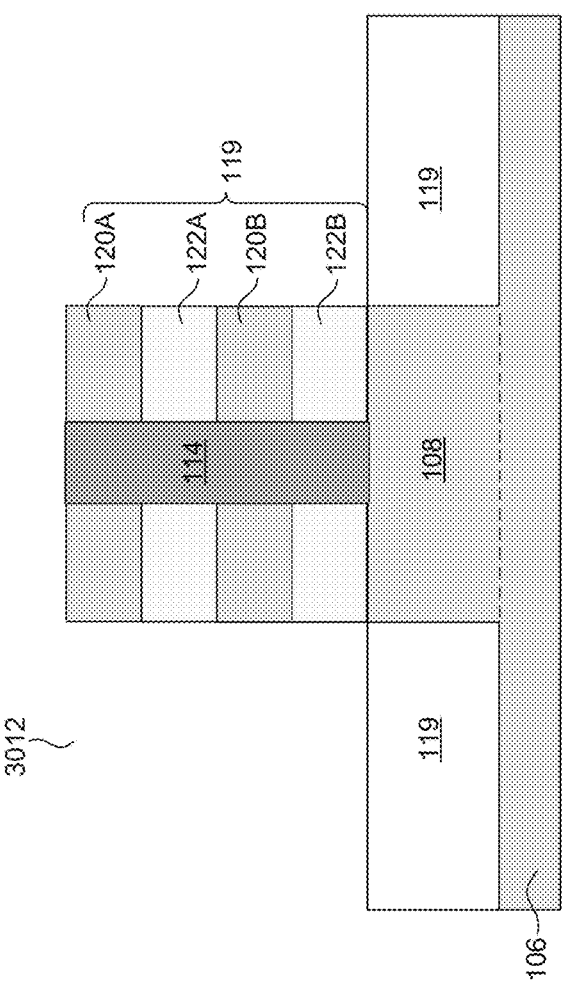

Referring to FIG. 20, in operation 2025, a first gate opening is formed on the superlattice structure and the NVC region. For example, as shown in FIGS. 30A-30B, a first gate opening 3012 is formed on superlattice structure 119 and NVC region 114. The formation of first gate opening 3012 can include etching polysilicon structure 312 from the structures of FIGS. 29A-29B to form the structures of FIGS. 30A-30B.

Referring to FIG. 20, similar to operations 225-235 of method 200, operations 2030-2040 can be performed to form structures similar to that of FIGS. 15A-19B.

The present disclosure provides an example semiconductor device with FETs (e.g., GAA FETs 102A-102B) including nanostructured horizontal and vertical channel regions (e.g., NHC regions 120A-120C and NVC region 114) and example methods (e.g., methods 200 and 2000) of forming the same. In some embodiments, a GAA FET (e.g., FET 102A) can include a nanostructured vertical channel (NVC) region (e.g., NVC region 114) disposed within a stack of nanostructured horizontal channel (NHC) regions (e.g., NHC regions 120A-120C), which is disposed on a fin structure (e.g., fin structure 108). The GAA FET can further include a GAA structure (e.g., GAA structure 112) surrounding the NHC regions about a first axis (e.g., an X-axis) and the NVC region about a second axis (e.g., a Z-axis) that is different from the first axis. The NVC region provides electrical connection between the NHC regions. As a result, electrical potential induced in the NHC regions by gate portions (e.g., gate portions 112A-112F) of the GAA structure surrounding the NHC regions can be substantially equally distributed between the NHC regions to form substantially equipotential NHC regions. Forming equipotential NHC regions can mitigate differences between channel parameters of NHC regions, such as channel current and drain induced barrier lowering (DIBL) parameters, and consequently increase current density of the GAA FET.

Without the NVC region, there may be variations between the electrical potential induced in the NHC regions due to variations in the dimensions (e.g., thicknesses T1-T3 and widths W1-W5) of the NHC regions with respect to each other and/or in the dimensions (e.g., gate lengths GL1-GL6) of the gate portions of GAA structure with respect to each other. The dimension variations can be a result of processing conditions used during the fabrication of the GAA FET. The dimension variations can also exist between the NHC regions and GAA structures of different GAA FETs (e.g., GAA FETs 102A-102B) of the semiconductor device, which can lead to variations between FET parameters, such as threshold voltage, DIBL parameters, subthreshold swing (SS), and on current ($I_{ON}$). Such inter-FET variations can also be mitigated with the use of NVC regions in the different FETs of the semiconductor device. Thus, the NVC regions mitigates the effect of dimension variations on device parameters, and consequently reduces intra-device parameter variability and inter-device parameter variability in the semiconductor device.

In some embodiments, a method includes forming a superlattice structure with first and second nanostructured layers arranged in an alternating configuration on a fin structure disposed on a substrate, forming a source/drain (S/D) region on the fin structure, forming a nanostructured region through the superlattice structure, forming a gate structure surrounding the nanostructured region about a first axis and surrounding the first nanostructured layers about a second axis different from the first axis, and forming contact structures on the S/D regions and the gate structure.

In some embodiments, a method includes forming a superlattice structure with first and second nanostructured layers arranged in an alternating configuration on a substrate, forming a nanostructured region through the superlattice structure, etching portions of the substrate that are not covered by the superlattice structure to form a fin structure, forming a polysilicon structure on the superlattice structure and the nanostructured region, forming a source/drain (S/D) region on the fin structure, and forming a gate structure surrounding the nanostructured region about a first axis and surrounding the first nanostructured layers about a second axis different from the first axis.

In some embodiments, a semiconductor device includes a substrate, a fin structure disposed on the substrate, a stack of nanostructured horizontal channel (NHC) regions disposed on the fin structure, a nanostructured vertical channel (NVC) region disposed within the stack of NHC regions, a source/drain (S/D) region disposed on the fin structure, and a gate structure disposed on the NHC regions and on portions of the NVC region that are not covered by the NHC regions and the fin structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a nanostructured horizontal channel (NHC) region disposed on the substrate;
    a nanostructured vertical channel (NVC) region disposed in the NHC region, wherein an inner sidewall of the NHC region is in physical contact with an outer sidewall of the NVC region;
    a source/drain (S/D) region disposed on the substrate; and a gate structure disposed on the NHC region and on portions of the NVC region that are not covered by the NHC region.

2. The semiconductor device of claim 1, wherein the gate structure surrounds the portions of the NVC region about a first axis and surrounds the NHC region about a second axis different from the first axis.

3. The semiconductor device of claim 1, wherein the NVC region comprises a semiconductor material.

4. The semiconductor device of claim 1, wherein the NVC region comprises a doped semiconductor material.

5. The semiconductor device of claim 1, wherein a portion of the NVC region is disposed in the substrate.

6. The semiconductor device of claim 1, wherein a high-k gate dielectric layer of the gate structure is disposed concentrically around the NVC region.

7. The semiconductor device of claim 1, wherein a negative capacitance gate dielectric layer of the gate structure is disposed concentrically around the NVC region.

8. The semiconductor device of claim 1, wherein the NVC region comprises a circular cross-sectional profile.

9. The semiconductor device of claim 1, wherein an oxide layer of the gate structure is disposed on and in contact with a top surface of the NVC region.

10. The semiconductor device of claim 1, wherein an oxide layer of the gate structure is disposed on and in contact with sidewalls of the NVC region.

11. A semiconductor device, comprising:
a substrate;
first and second source/drain (S/D) regions disposed on the substrate;
a gate structure comprising a first gate portion and a second gate portion;
a vertical channel region disposed between the first and second S/D regions; and
a horizontal channel region surrounding and in physical contact with first sidewall portions of the vertical channel region, wherein:
the first gate portion is disposed on and in contact with top surfaces of the vertical and horizontal channel regions; and
the second gate portion surrounds second sidewall portions of the vertical channel region.

12. The semiconductor device of claim 11, wherein an elongated side of the vertical channel region extends along a first direction; and
wherein an elongated side of the horizontal channel region extends along a second direction perpendicular to the first direction.

13. The semiconductor device of claim 11, wherein the vertical channel region extends below a bottom surface of the horizontal channel region.

14. The semiconductor device of claim 11, wherein a high-k gate dielectric layer of the gate structure is disposed concentrically around the vertical channel region.

15. The semiconductor device of claim 11, wherein a negative capacitance gate dielectric layer of the gate structure is disposed concentrically around the vertical channel region.

16. A semiconductor device, comprising:
a substrate;
a base structure disposed on the substrate;
a horizontal nanostructured layer disposed on the base structure;
a vertical nanostructured layer disposed in the horizontal nanostructured layer;
an oxide layer disposed on top and bottom surfaces of the horizontal nanostructured layer and along sidewalls of the vertical nanostructured layer;
a high-k dielectric layer disposed on the oxide layer; and
a metal layer disposed on the high-k dielectric layer.

17. The semiconductor device of claim 16, wherein the vertical nanostructured layer extends into the base structure.

18. The semiconductor device of claim 16, wherein the vertical nanostructured layer comprises a circular cross-sectional profile along a first direction and a rectangular cross-sectional profile along a second direction perpendicular to the first direction.

19. The semiconductor device of claim 16, wherein the vertical nanostructured layer comprises a semiconductor layer.

20. The semiconductor device of claim 16, further comprising a negative capacitance dielectric layer disposed between the high-k dielectric layer and the metal layer.

* * * * *